(12) United States Patent
Ohashi et al.

(10) Patent No.: US 9,146,464 B2
(45) Date of Patent: Sep. 29, 2015

(54) SULFONIUM SALT, POLYMER, POLYMER MAKING METHOD, RESIST COMPOSITION, AND PATTERNING PROCESS

(71) Applicant: Shin-Etsu Chemical Co., Ltd., Tokyo (JP)

(72) Inventors: Masaki Ohashi, Joetsu, PA (US); Jun Hatakeyama, Joetsu (JP); Teppei Adachi, Joetsu (JP); Masahiro Fukushima, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/099,344

(22) Filed: Dec. 6, 2013

(65) Prior Publication Data

US 2014/0162189 A1   Jun. 12, 2014

(30) Foreign Application Priority Data

Dec. 10, 2012   (JP) ................ 2012-269446

(51) Int. Cl.
| | |
|---|---|
| C08F 220/22 | (2006.01) |
| C08F 220/38 | (2006.01) |
| G03F 7/028 | (2006.01) |
| G03F 7/027 | (2006.01) |
| G03F 7/20 | (2006.01) |

(52) U.S. Cl.
CPC .............. *G03F 7/027* (2013.01); *C08F 220/22* (2013.01); *G03F 7/2041* (2013.01); *C08F 2220/382* (2013.01)

(58) Field of Classification Search
CPC .... C08F 220/18; C08F 220/22; C08F 220/38; C08F 2220/382; G03F 7/004; G03F 7/039; G03F 7/0392; G03F 7/0395; C07C 381/12
USPC ................ 568/27, 28, 35; 526/242, 245, 318, 526/318.41, 319; 430/270.1, 326, 921, 922, 430/924, 925
See application file for complete search history.

(56) References Cited

U.S. PATENT DOCUMENTS

| | | | |
|---|---|---|---|
| 5,650,483 A | 7/1997 | Malik et al. | |
| 5,945,250 A | 8/1999 | Aoai et al. | |
| 6,312,867 B1 | 11/2001 | Kinsho et al. | |
| 6,830,866 B2 | 12/2004 | Kobayashi et al. | |
| 6,908,722 B2 | 6/2005 | Ebata et al. | |
| 7,288,359 B2 | 10/2007 | Iwasawa et al. | |
| 7,511,169 B2 | 3/2009 | Ohsawa et al. | |
| 7,527,912 B2 | 5/2009 | Ohsawa et al. | |
| 7,556,909 B2 | 7/2009 | Kobayashi et al. | |
| 7,569,326 B2 | 8/2009 | Ohsawa et al. | |
| 7,622,242 B2 | 11/2009 | Hatakeyama et al. | |
| 7,919,226 B2 | 4/2011 | Ohsawa et al. | |
| 7,932,334 B2 | 4/2011 | Ando et al. | |
| 8,057,981 B2 | 11/2011 | Harada et al. | |
| 8,057,985 B2 | 11/2011 | Ohashi et al. | |
| 8,101,335 B2 | 1/2012 | Harada et al. | |
| 8,114,570 B2 | 2/2012 | Ohsawa et al. | |
| 8,114,571 B2 | 2/2012 | Ohashi et al. | |
| 8,173,354 B2 | 5/2012 | Ohsawa et al. | |
| 8,252,504 B2 | 8/2012 | Harada et al. | |
| 8,268,528 B2 | 9/2012 | Harada et al. | |
| 8,283,104 B2 | 10/2012 | Ohashi et al. | |
| 8,431,323 B2 | 4/2013 | Watanabe et al. | |
| 8,435,717 B2 | 5/2013 | Hagiwara et al. | |
| 2005/0208424 A1 | 9/2005 | Hasegawa et al. | |
| 2006/0127809 A1* | 6/2006 | Shimada et al. | ........... 430/270.1 |
| 2008/0070167 A1* | 3/2008 | Takahashi et al. | ............ 430/330 |
| 2008/0090172 A1 | 4/2008 | Hatakeyama et al. | |
| 2008/0102407 A1* | 5/2008 | Ohsawa et al. | ............ 430/286.1 |

(Continued)

FOREIGN PATENT DOCUMENTS

| | | |
|---|---|---|
| EP | 0 473 547 A1 | 3/1992 |
| JP | 04-230645 A | 8/1992 |

(Continued)

OTHER PUBLICATIONS

Kim, Hyun-Woo, et al., "CD uniformity improvement for EUV resists process: EUV resolution enhancement layer", Proc. of SPIE, Korea, 2011, vol. 7969, pp. 796916-1-796916-10.

*Primary Examiner* — Anca Eoff
(74) *Attorney, Agent, or Firm* — Westerman, Hattori, Daniels & Adrian, LLP

(57) ABSTRACT

A sulfonium salt having formula (1a) is provided wherein $R^1$ is H, F, $CH_3$ or $CF_3$, $R^{1a}$ to $R^{1m}$ are each independently H or a monovalent hydrocarbon group, L is a single bond or divalent hydrocarbon group, X is a divalent alkylene group optionally substituted with fluorine, and n is 0 or 1. The sulfonium salt having a polymerizable anion provides for efficient scission of acid labile groups in a chemically amplified resist composition, and it is a very useful monomer from which a base resin for resist use is prepared.

(1a)

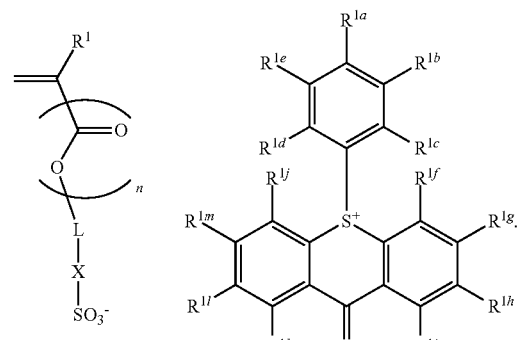

18 Claims, 4 Drawing Sheets

(56) References Cited

U.S. PATENT DOCUMENTS

| | | | |
|---|---|---|---|
| 2010/0183975 A1* | 7/2010 | Takahashi et al. | 430/270.1 |
| 2010/0248149 A1* | 9/2010 | Tsuchimura et al. | 430/296 |
| 2013/0108964 A1* | 5/2013 | Ohsawa et al. | 430/285.1 |
| 2014/0080056 A1* | 3/2014 | LaBeaume | 430/270.1 |

FOREIGN PATENT DOCUMENTS

| | | |
|---|---|---|
| JP | 2000-336121 A | 12/2000 |
| JP | 2003-066612 A | 3/2003 |
| JP | 2004-002252 A | 1/2004 |
| JP | 3613491 B2 | 1/2005 |
| JP | 2005-084365 A | 3/2005 |
| JP | 2005-264103 A | 9/2005 |
| JP | 2007-145797 A | 6/2007 |
| JP | 2007-145804 A | 6/2007 |
| JP | 2007-197718 A | 8/2007 |
| JP | 2007-298569 A | 11/2007 |
| JP | 2008-106045 A | 5/2008 |
| JP | 2008-122932 A | 5/2008 |
| JP | 2008-133448 A | 6/2008 |
| JP | 2008-203452 A | 9/2008 |
| JP | 2009-007327 A | 1/2009 |
| JP | 2009-98638 A | 5/2009 |
| JP | 2009-191151 A | 8/2009 |
| JP | 2009-192784 A | 8/2009 |
| JP | 2009-258695 A | 11/2009 |
| JP | 2009-269953 A | 11/2009 |
| JP | 2009-276363 A | 11/2009 |
| JP | 2010-020204 A | 1/2010 |
| JP | 2010-077404 A | 4/2010 |
| JP | 2010-107695 A | 5/2010 |
| JP | 2010-134012 A | 6/2010 |
| JP | 2010-215608 A | 9/2010 |
| JP | 2011-016746 A | 1/2011 |
| JP | 2011-042789 A | 3/2011 |
| JP | 2011-138107 A | 7/2011 |
| JP | 2011-250105 A | 12/2011 |
| JP | 4900603 B2 | 3/2012 |
| WO | 2008/056795 A1 | 5/2008 |
| WO | 2011/149015 A1 | 12/2011 |

* cited by examiner

SULFONIUM SALT, POLYMER, POLYMER MAKING METHOD, RESIST COMPOSITION, AND PATTERNING PROCESS

CROSS-REFERENCE TO RELATED APPLICATION

This non-provisional application claims priority under 35 U.S.C. §119(a) on Patent Application No. 2012-269446 filed in Japan on Dec. 10, 2012, the entire contents of which are hereby incorporated by reference.

TECHNICAL FIELD

This invention relates to (1) a sulfonium salt having a polymerizable anion useful as a source for photoacid generator and sulfonic acid polymer, (2) a polymer comprising recurring units derived from the sulfonium salt, capable of generating a sulfonic acid in response to high-energy radiation or heat, (3) a method of preparing the polymer, (4) a resist composition comprising the polymer, and (5) a patterning process using the resist composition.

BACKGROUND ART

While a number of recent efforts are being made to achieve a finer pattern rule in the drive for higher integration and operating speeds in LSI devices, DUV and EUV lithography processes are thought to hold particular promise as the next generation in microfabrication technology. In particular, photolithography using an ArF excimer laser as the light source is requisite to the micropatterning technique capable of achieving a feature size of 0.13 μm or less.

The ArF lithography started partial use from the fabrication of 130-nm node devices and became the main lithography since 90-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the $F_2$ lithography was postponed and instead, the early introduction of ArF immersion lithography was advocated. This enables mass-scale production of 45-nm node devices. For the mass-scale production of 32-nm node devices, the double patterning process utilizing sidewall spacer technology is used although the process suffers from complexity and length.

For the fabrication of 32-nm node and subsequent devices, the EUV lithography using an exposure wavelength of 13.5 nm which is shorter than the conventional lasers by one order of magnitude and thus featuring improved resolution is expected rather than the double patterning process with noticeable costs. Efforts are focused on the EUV lithography.

In the EUV lithography, a low laser power and light attenuation by reflecting mirror lead to a reduced quantity of light. Then light with a low intensity reaches the wafer surface. It is urgently demanded to develop a high-sensitivity resist material in order to gain a throughput despite a low light quantity. However, a trade-off relationship of sensitivity is pointed out that the sensitivity of resist material can be increased at the sacrifice of resolution and edge roughness (LER, LWR).

As the circuit line width is reduced by the recent rapid advance of technology, the degradation of contrast by acid diffusion becomes more serious for the resist material. This is because the pattern feature size is approaching the diffusion length of acid. Acid diffusion leads to degradations of mask fidelity and pattern rectangularity and non-uniformity of a fine line pattern, i.e., line width roughness (LWR). Accordingly, to gain more benefits from a reduction of exposure light wavelength and an increase of lens NA, an increase in dissolution contrast and suppression of acid diffusion are required more than in the prior art resist materials.

One approach to overcome these problems is to bind a PAG in a polymer. For instance, aiming to improve sensitivity, Patent Document 1 proposes a polymer using an acryloyloxyphenyldiphenylsulfonium salt as a monomer. Patent Document 2 proposes to incorporate the monomer into a polyhydroxystyrene resin for improving the LWR of this base resin. However, since the sulfonium salt is bound at its cation side to the polymer, the sulfonic acid generated therefrom upon exposure to high-energy radiation is equivalent to the sulfonic acids generated by conventional PAGs. These proposals are thus unsatisfactory to overcome the outstanding problems. Also, aiming to improve sensitivity and resist pattern profile, Patent Document 3 discloses sulfonium salts having an anion side incorporated into the polymer backbone such as polystyrenesulfonic acid. The acids generated therefrom are arenesulfonic and alkylsulfonic acid derivatives which have too low an acid strength to sever acid labile groups, especially acid labile groups in acrylate-derived base resins. The acrylate resins are commonly used not only in the ArF chemically amplified lithography offering a fine feature size, but also in the EB and EUV lithography processes. Also a variety of anion-bound resins capable of generating an acid having high acid strength have been developed. Patent Document 4 discloses a polymer having a difluoroethanesulfonic acid anion in the backbone. Patent Documents 5 and 6 disclose a polymerizable sulfonium salt having a partially fluorinated sulfonic acid anion and a resin obtained therefrom. Acid diffusion is suppressed by incorporating a strong acid-generating anion in the backbone of a base resin. Although some improvements are made in resist properties including mask fidelity, pattern rectangularity and LWR, they are still unsatisfactory.

In the EUV laser source of the laser-produced plasma (LPP) method wherein $CO_2$ laser light is irradiated to tin particles to emit EUV of wavelength 13.5 nm, weak light of longer wavelength 140 to 300 nm is emitted besides the desired EUV. This longer wavelength light is known as out-of-band (OOB) light. Since OOB floods over the entire surface, the resist exposed to OOB is reduced in contrast and experiences a film thickness loss in the otherwise unexposed region. The EUV microstepper is loaded with a Zr filter as a means for cutting off OOB light, but the quantity of light is reduced thereby. The EUV scanner may not be loaded with the filter because a reduction of light quantity is not permissible for the goal of enhancing the throughput. In the EUV lithography, there is a need for a resist material which is highly sensitive to EUV, but less sensitive to OOB.

For the development of such resist materials, the cation structure of sulfonium salt PAG is important. Patent Document 7 (JP-A 2011-138107, paragraph [0052]) describes a polymer-bound acid generator having a high sensitivity to EUV light, but a low sensitivity to OOB light. Since its lithographic characteristics are still unsatisfactory, it is desired to have a resist material having a lower OOB sensitivity. Non-Patent Document 1 describes the superiority of a protective film which is formed on top of the resist layer for cutting off OOB light.

CITATION LIST

Patent Document 1: JP-A H04-230645
Patent Document 2: JP-A 2005-084365

Patent Document 3: JP 3613491 (U.S. Pat. No. 5,945,250)
Patent Document 4: JP-A 2007-197718 (U.S. Pat. No. 7,932,334)
Patent Document 5: WO 08/056795
Patent Document 6: JP-A 2008-133448 (U.S. Pat. No. 7,569,326)
Patent Document 7: JP-A 2011-138107
Non-Patent Document 1: Proc. SPIE Vol. 7969, p 796916-1 (2011)

DISCLOSURE OF INVENTION

An object of the invention is to provide (1) an onium salt, (2) a polymer comprising recurring units derived from the onium salt, (3) a resist composition comprising the polymer, and (4) a patterning process using the resist composition, wherein the resist composition exhibits a high resolution and forms a pattern of good profile and reduced LWR when processed by photolithography using high-energy radiation such as ArF excimer laser, EUV or EB. A further object is to provide a PAG and a resist composition comprising the PAG, for use in the EUV lithography, which have a high sensitivity to EUV, but no or low sensitivity to OOB.

The inventors have found that a resist composition using a polymer comprising recurring units of a sulfonium salt having the general formula (1) shown below exhibits improved characteristics including resolution and LWR when processed by photolithography, especially EUV lithography. The sulfonium salt exhibits low OOB sensitivity when processed by EUV lithography, and is effective for improving the profile of a resist pattern.

In a first aspect, the invention provides a sulfonium salt having the general formula (1a):

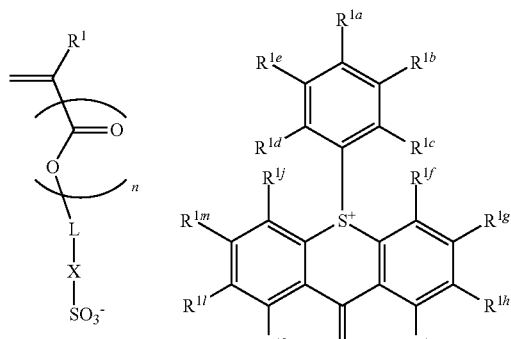

(1a)

wherein $R^1$ is hydrogen, fluorine, methyl or trifluoromethyl, $R^{1a}$ to $R^{1m}$ are each independently hydrogen or a $C_1$-$C_{20}$ straight, branched or cyclic, monovalent hydrocarbon group which may be substituted with or separated by a heteroatom, L is a single bond or a $C_1$-$C_{20}$ straight, branched or cyclic, divalent hydrocarbon group which may be substituted with or separated by a heteroatom, X is a $C_1$-$C_5$ divalent alkylene group in which some or all hydrogen atoms may be substituted by fluorine atoms, and n is 0 or 1.

One preferred embodiment is a sulfonium salt having the general formula (1b):

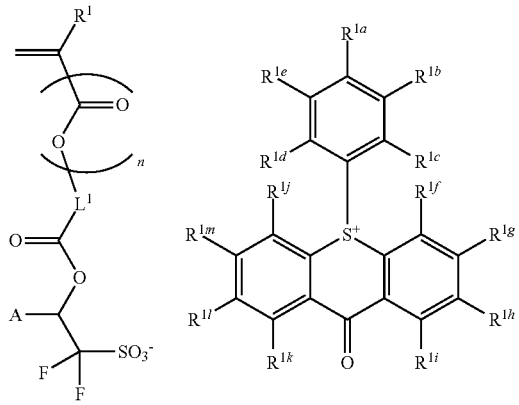

(1b)

wherein $R^1$, $R^{1a}$ to $R^{1m}$ are as defined above, $L^1$ is a single bond or a $C_1$-$C_{20}$ straight, branched or cyclic, divalent hydrocarbon group which may be substituted with or separated by a heteroatom, A is hydrogen or trifluoromethyl, and n is 0 or 1, with the proviso that n is 0 when $L^1$ is a single bond.

In a second aspect, the invention provides a polymer comprising recurring units having the general formula (2a):

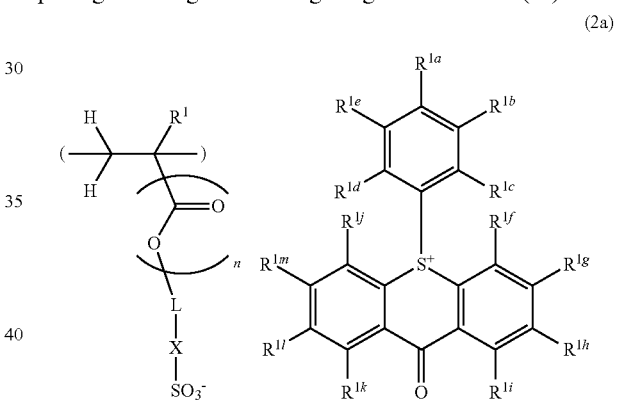

(2a)

wherein $R^1$, $R^{1a}$ to $R^{1m}$, L, X and n are as defined above.

One preferred embodiment is a polymer comprising recurring units having the general formula (2b):

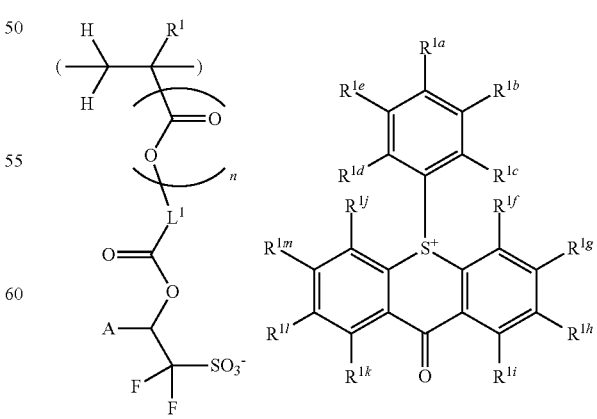

(2b)

wherein $R^1$, $R^{1a}$ to $R^{1m}$, $L^1$, A, and n are as defined above.

In a preferred embodiment, the polymer may further comprise recurring units having the general formula (3) and/or (4):

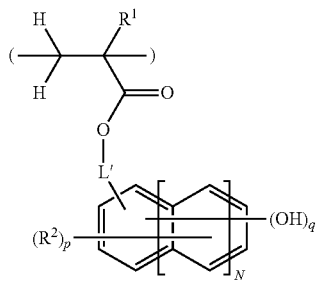
(3)

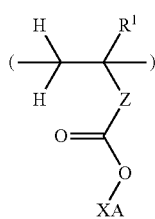
(4)

wherein $R^1$ is hydrogen, fluorine, methyl or trifluoromethyl, $R^2$ is halogen or a $C_1$-$C_{10}$ alkyl group, L' is a single bond or a $C_1$-$C_{10}$ divalent organic group which may be substituted with oxygen, p is an integer of 0 to 3, q is 1 or 2, N is an integer of 0 to 2, Z is a single bond, phenylene, naphthylene or (backbone)-C(=O)—O—Z'—, Z' is a $C_1$-$C_{10}$ straight, branched or cyclic alkylene group which may have a hydroxyl radical, ether bond, ester bond or lactone ring, or phenylene or naphthylene group, and XA is an acid labile group.

In a further preferred embodiment, the polymer may further comprise recurring units having the general formula (5):

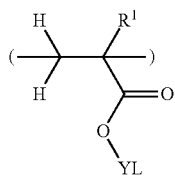
(5)

wherein $R^1$ is as defined above, and YL is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

In a third aspect, the invention provides a resist composition comprising the polymer defined above as a base resin.

Another embodiment is a resist composition comprising the polymer defined above and a polymer free of recurring units having formulae (2a) and (2b) as a base resin.

Typically the resist composition is a chemically amplified resist composition. In this regard, the resist composition may further comprise a basic compound and an organic solvent, and optionally, a non-polymeric acid generator and a surfactant which is insoluble in water and soluble in alkaline developer.

In a fourth aspect, the invention provides a pattern forming process comprising the steps of applying the resist composition defined above onto a substrate to form a coating, baking, exposing the coating to high-energy radiation, and developing the exposed coating in a developer.

Preferably, the exposure step is carried out by immersion lithography using a liquid having a refractive index of at least 1.0 between the resist coating and a projection lens.

In a preferred embodiment, a protective film is coated on the resist coating prior to the exposure step. In this case, immersion lithography is carried out while the liquid is held between the protective film and the projection lens.

Typically, the high-energy radiation is electron beam or soft X-ray having a wavelength of 3 to 15 nm.

In a fifth aspect, the invention provides a method for preparing the polymer of the second aspect, comprising the step of reacting a polymer comprising recurring units having the general formula (6a) with a sulfonium salt having the general formula (7).

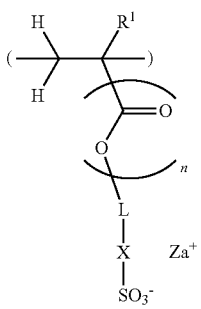
(6a)

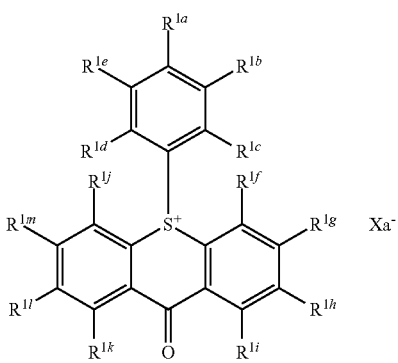
(7)

Herein $R^1$ is hydrogen, fluorine, methyl or trifluoromethyl, $R^{1a}$ to $R^{1m}$ are each independently hydrogen or a $C_1$-$C_{20}$ straight, branched or cyclic, monovalent hydrocarbon group which may be substituted with or separated by a heteroatom, L is a single bond or a $C_1$-$C_{20}$ straight, branched or cyclic, divalent hydrocarbon group which may be substituted with or separated by a heteroatom, X is a $C_1$-$C_5$ divalent alkylene group in which some or all hydrogen atoms may be substituted by fluorine atoms, n is 0 or 1, $Za^+$ is a lithium ion, sodium ion, potassium ion, or ammonium cation of the general formula (8):

$$(R^3)_4N^+ \tag{8}$$

wherein $R^3$ is each independently hydrogen, a substituted or unsubstituted, $C_1$-$C_{10}$ straight, branched or cyclic alkyl, alkenyl or oxoalkyl group, or substituted or unsubstituted $C_6$-$C_{18}$ aryl, aralkyl or aryloxoalkyl group, or any two or more of $R^3$ may bond together to form a ring with N, and $Xa^-$ is an anion.

A method for preparing the polymer of the preferred embodiment of the second aspect is also provided, the method comprising the step of reacting a polymer comprising recurring units having the general formula (6b) with a sulfonium salt having the general formula (7).

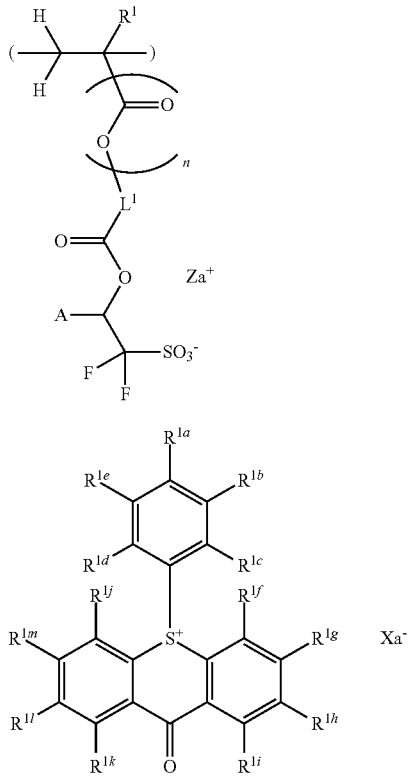

Herein $R^1$, $R^{1a}$ to $R^{1m}$, $L^1$, A, n, $Za^+$, and $Xa^-$ are as defined above.

Advantageous Effects of Invention

Since the sulfonium salt having a polymerizable anion provides for efficient scission of acid labile groups in a chemically amplified resist composition, it is very useful as a monomer from which a base resin in a photosensitive resist composition is prepared. A photosensitive resist composition using the polymer as base resin is improved in resolution and LWR and thus best suited for precise micropatterning by photolithography, especially EUV lithography. Since the resist composition exhibits low OOB sensitivity and high EUV sensitivity when processed by EUV lithography, a resist pattern is formed at a high contrast due to a reduced film thickness loss in the unexposed region.

DESCRIPTION OF EMBODIMENTS

Figure 1:
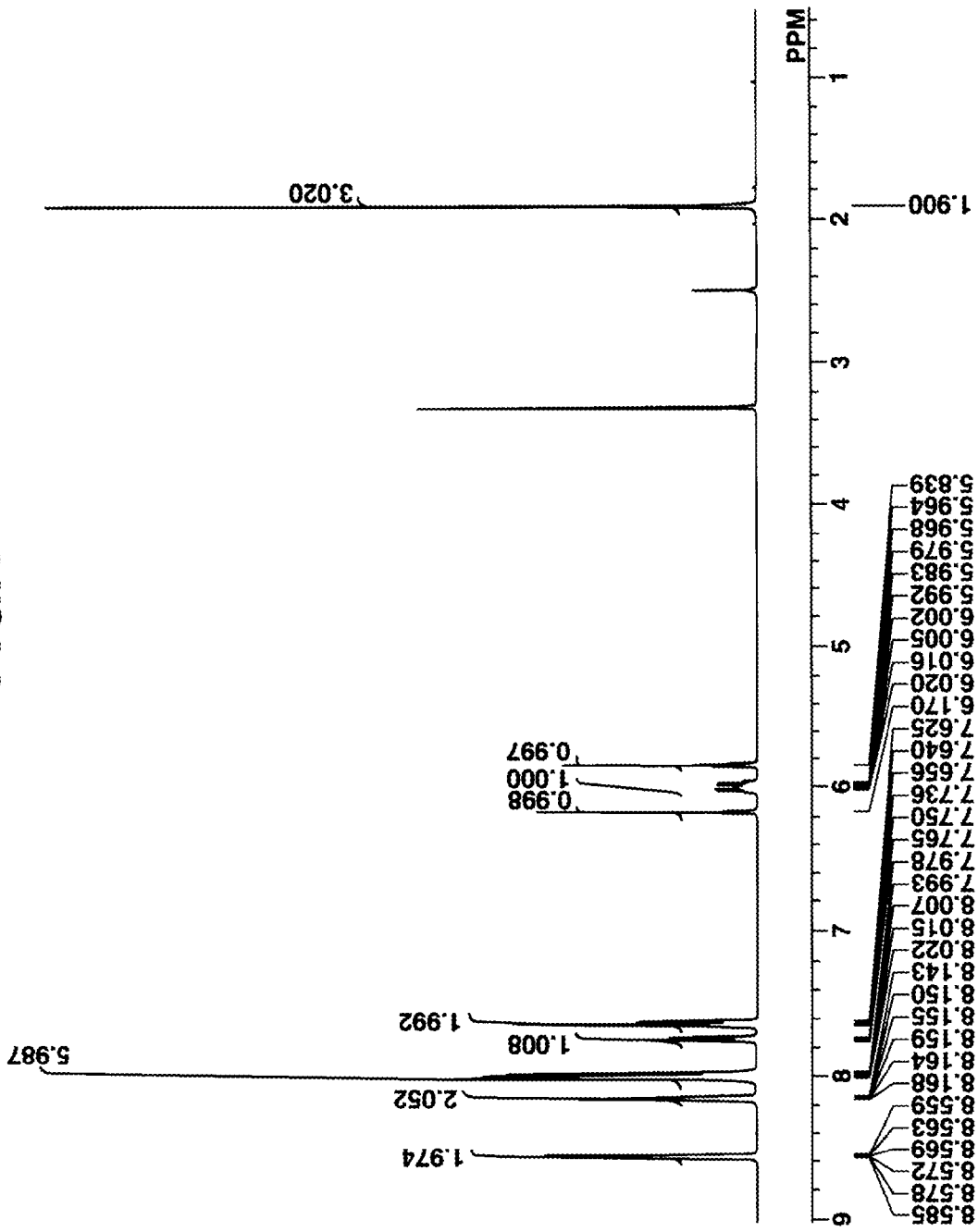
FIG. 1 is a diagram showing $^1$H-NMR spectroscopy of PAG-2 in Synthesis Example 1-7.

The singular forms "a," "an" and "the" include plural references unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The abbreviations have the following meaning.
EB: electron beam
UV: ultraviolet
EUV: extreme ultraviolet
PAG: photoacid generator
PEB: post-exposure bake
LWR: line width roughness The term "high-energy radiation" is intended to encompass UV, deep UV, EUV, EB, x-ray, excimer laser, gamma-ray and synchrotron radiation.

One embodiment of the invention is a sulfonium salt having a polymerizable anion, represented by the general formula (1a).

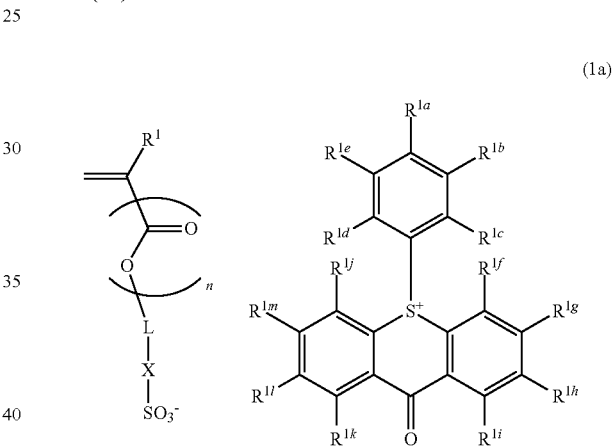

In formula (1a), $R^1$ is hydrogen, fluorine, methyl or trifluoromethyl.

$R^{1a}$ to $R^{1m}$ are each independently hydrogen or a $C_1$-$C_{20}$ straight, branched or cyclic, monovalent hydrocarbon group which may be substituted with or separated by a heteroatom. Suitable groups of $R^{1a}$ to $R^{1m}$ include hydrogen, methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl. Also included are substituted forms of the foregoing groups in which one or more hydrogen atoms are substituted by a heteroatom or atoms such as oxygen, sulfur, nitrogen, and halogen or which may be separated by a heteroatom such as oxygen, sulfur or nitrogen. As a result of substitution or separation, a hydroxyl, cyano, carbonyl, ether bond, ester bond, sulfonic acid ester bond, carbonate bond, lactone ring, sultone ring, carboxylic anhydride or haloalkyl group may form or intervene. Inter alia, hydrogen, methyl, methoxy, tert-butyl and tert-butoxy are preferred. More preferably, $R^{1a}$ is hydrogen, methyl, methoxy, tert-butyl or tert-butoxy, and $R^{1b}$ to $R^{1m}$ are hydrogen.

L is a single bond or a $C_1$-$C_{20}$ straight, branched or cyclic, divalent hydrocarbon group which may be substituted with or separated by a heteroatom. Suitable divalent hydrocarbon groups include straight alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; branched alkanediyl groups obtained by adding a side chain such as methyl, ethyl, propyl, isopropyl, butyl, sec-butyl or tert-butyl to the foregoing straight alkanediyl groups; saturated cyclic hydrocarbon groups such as cyclopentanediyl, cyclohexanediyl, norbornanediyl, and adamantanediyl; and unsaturated cyclic hydrocarbon groups such as phenylene and naphthylene. L may also be a combination of two or more of the foregoing groups. Also included are substituted forms of the foregoing groups in which one or more hydrogen atoms are substituted by a heteroatom or atoms such as oxygen, sulfur, nitrogen, and halogen. As a result of substitution, a hydroxyl, cyano, carbonyl, ether bond, ester bond, sulfonic acid ester bond, carbonate bond, lactone ring, sultone ring, carboxylic anhydride or haloalkyl group may form.

X is a $C_1$-$C_5$ divalent alkylene group in which some or all hydrogen atoms may be substituted by fluorine atoms. Suitable alkylene groups include methylene, ethylene, propane-1,3-diyl, butane-1,4-diyl, pentane-1,5-diyl, difluoromethylene, tetrafluoroethylene, 1,1,2-trifluoroethylene, hexafluoropropane-1,3-diyl, and octafluorobutane-1,4-diyl. In particular, those of formula (1a) wherein the hydrogen of methylene group at alpha-position of sulfonic acid is substituted by fluorine are preferred.

The subscript n is equal to 0 or 1.

The preferred sulfonium salt has the general formula (1b).

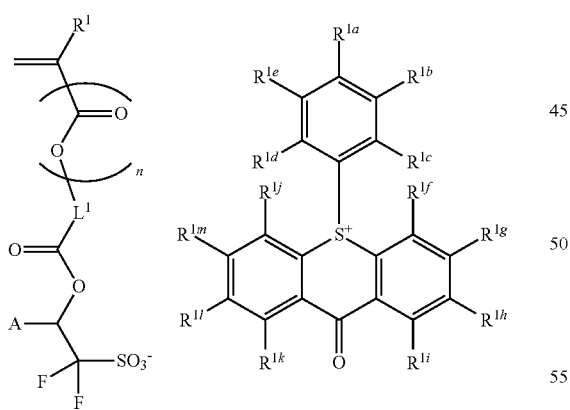

(1b)

In formula (1b), $R^1$, $R^{1a}$ to $R^{1m}$, and n are as defined above. $L^1$ is a single bond or a $C_1$-$C_{20}$ straight, branched or cyclic, divalent hydrocarbon group which may be substituted with or separated by a heteroatom, with the proviso that n is 0 when $L^1$ is a single bond. Exemplary groups of $L^1$ are the same as illustrated for L in formula (1a). A is hydrogen or trifluoromethyl, preferably trifluoromethyl.

Exemplary structures of the sulfonium salt are shown below, but not limited thereto.

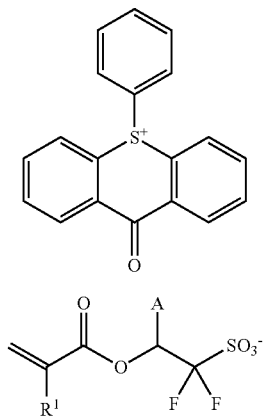

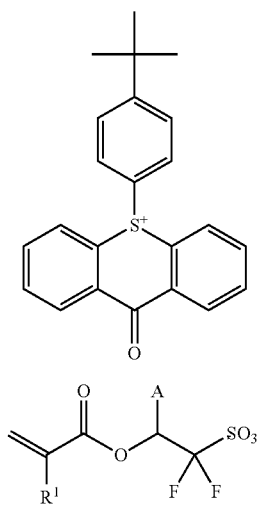

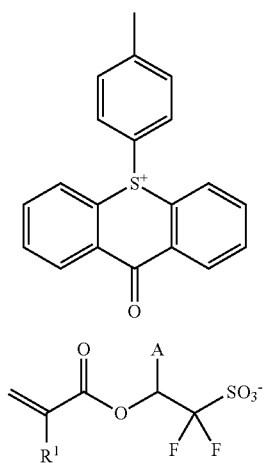

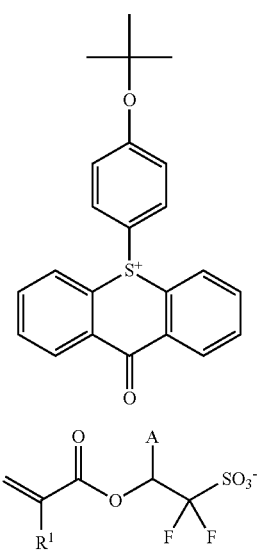
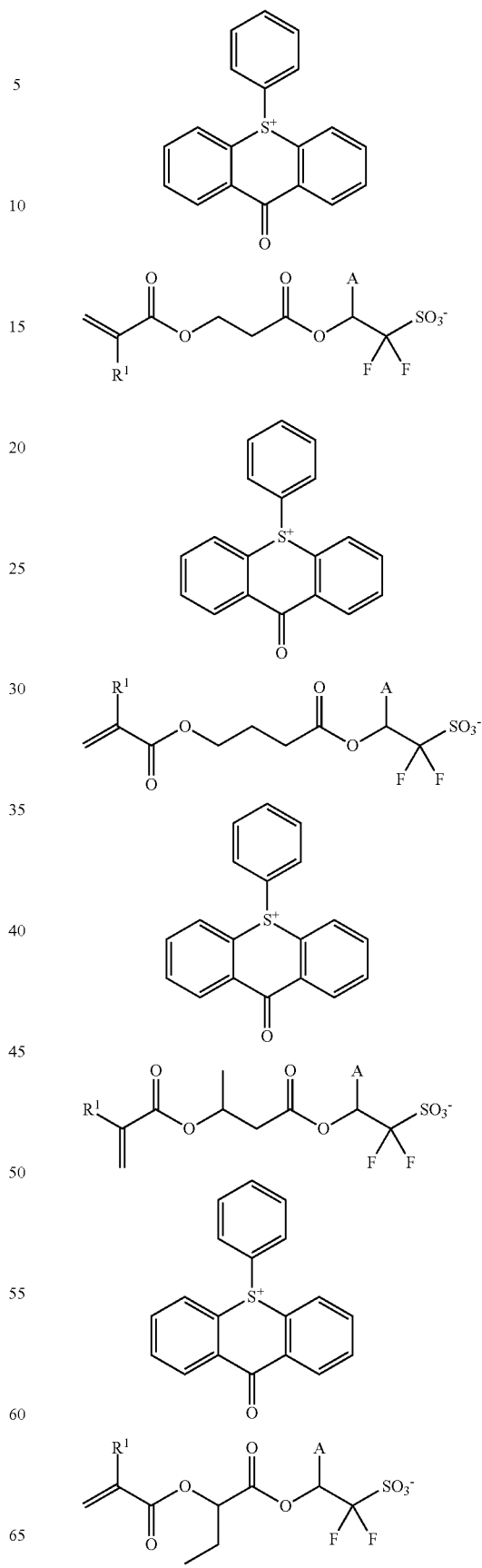

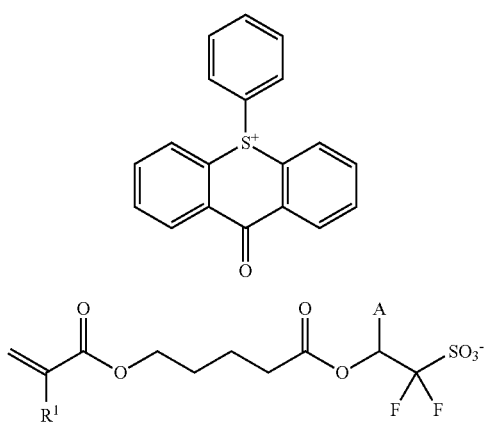
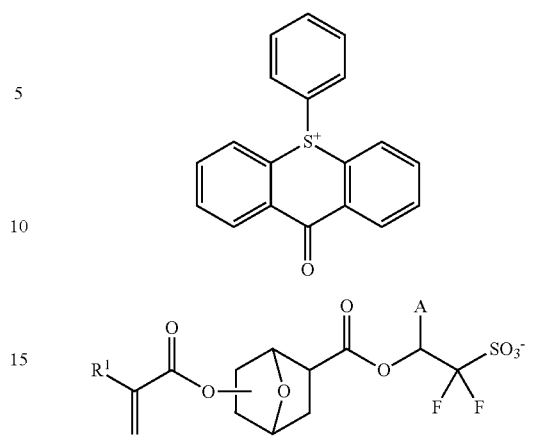
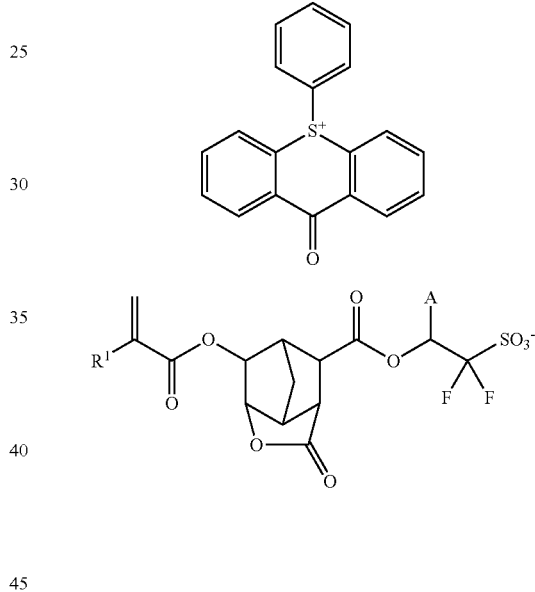
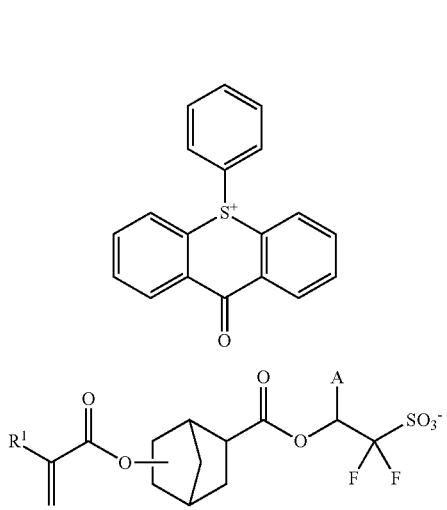
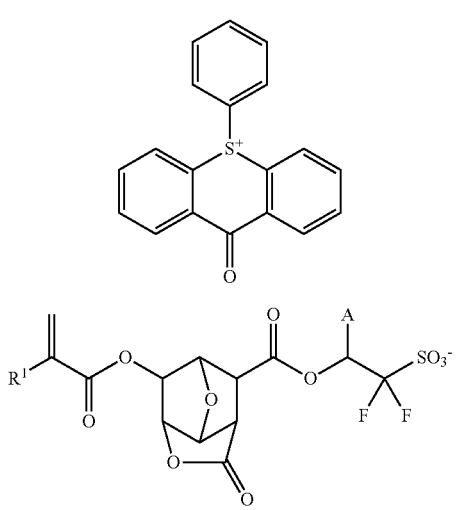

15
-continued
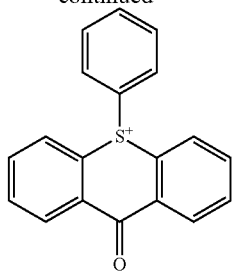
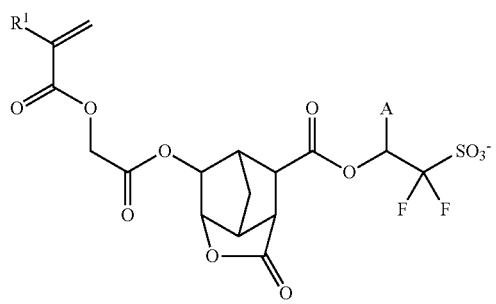
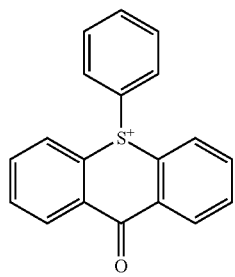
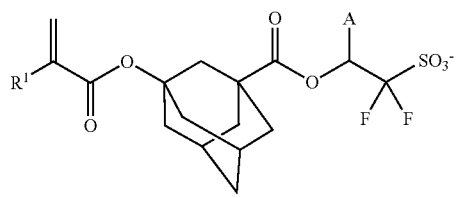
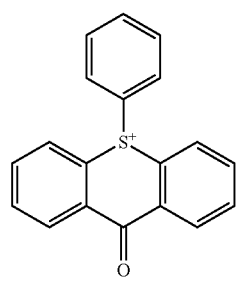
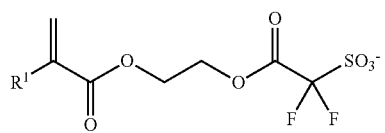
16
-continued
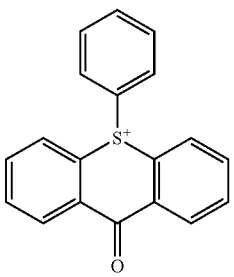
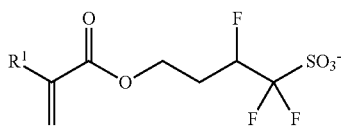
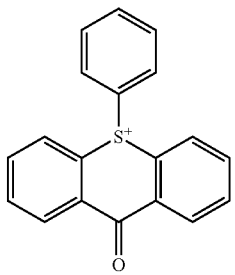
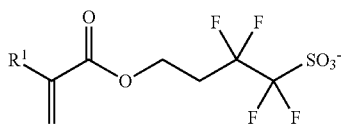
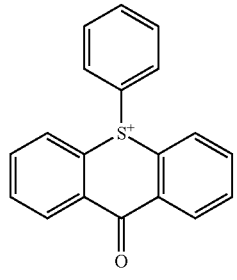
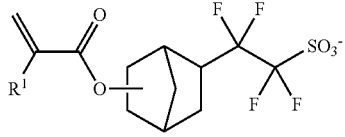
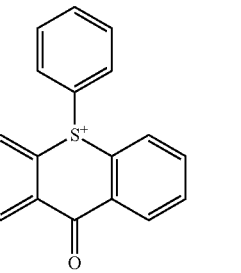
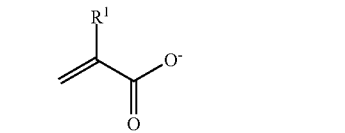

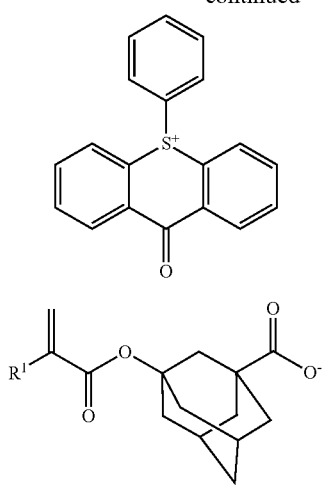
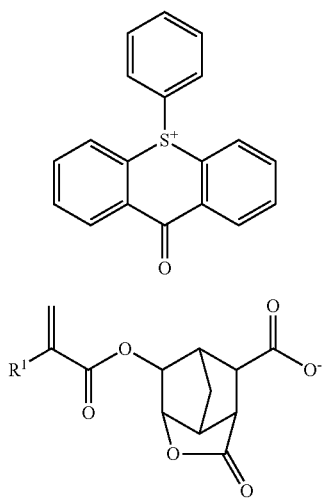
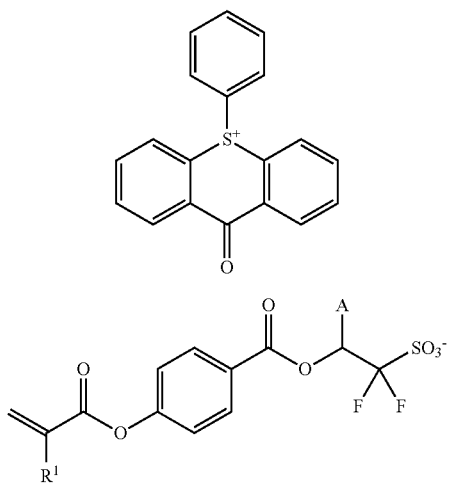
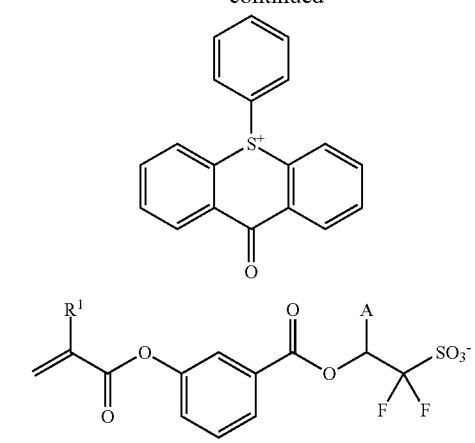
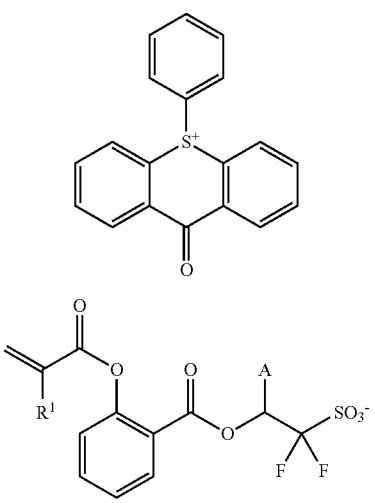
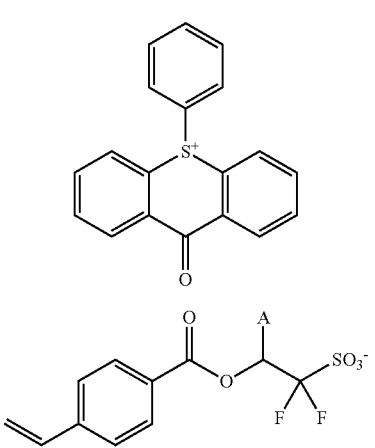

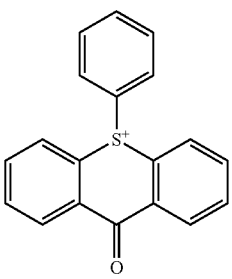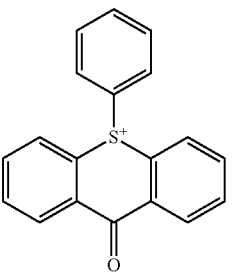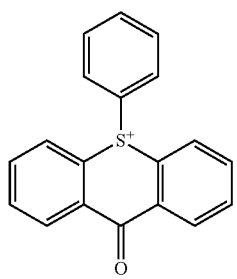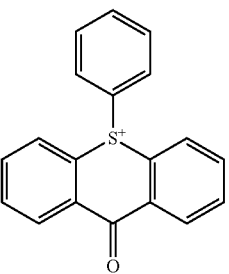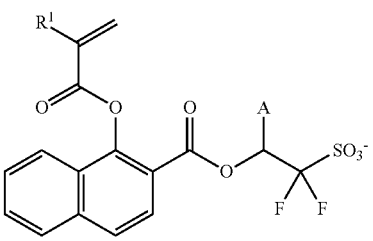

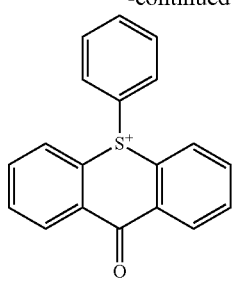
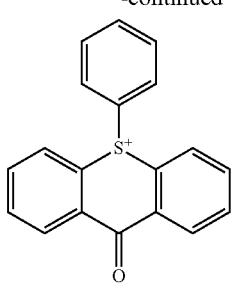
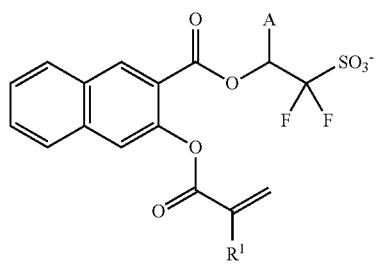
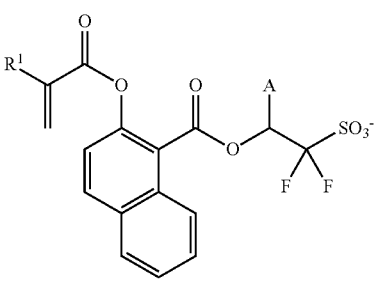
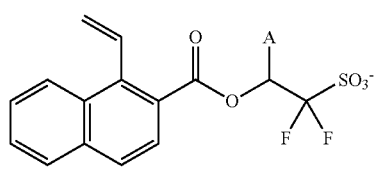
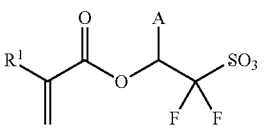

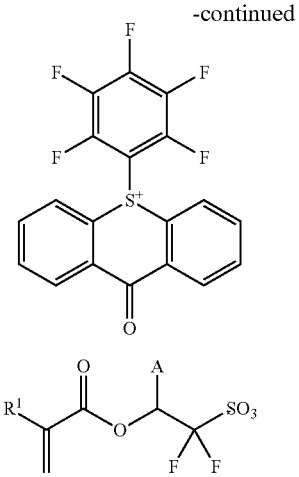

In these formulae, $R^1$ and A are as defined above.

It is now described how to synthesize the polymerizable anion-containing sulfonium salt having formula (1a). The desired sulfonium salt is obtainable from ion exchange reaction between a salt (e.g., lithium, sodium, potassium or ammonium salt) of a sulfonic acid having a polymerizable functional group (e.g., (meth)acryloyl or vinyl) and a sulfonium salt compound having the structure of the cation moiety in formula (1a). For the ion exchange reaction, reference may be made to JP-A 2007-145797, for example.

For the synthesis of a sulfonium salt compound having the structure of the cation moiety in formula (1a), the well-known method for the synthesis of sulfonium salts is applicable. For example, the sulfonium salt compound may be synthesized by reacting thioxanthone or its derivative with a diaryl iodonium salt in the presence of a copper catalyst such as copper benzoate.

It is then described how to synthesize the sulfonium salt having formula (1b) as the preferred embodiment of the invention. First, the synthesis of a sulfonium salt having formula (1b) wherein A is hydrogen is illustrated.

A sulfonium salt having 1,1-difluoro-2-hydroxyethane sulfonate is prepared. To this end, 2-bromo-2,2-diluoroethanol is reacted with carboxylic acid chloride to form 2-bromo-2,2-difluoroethylalkane carboxylate or 2-bromo-2,2-difluoroethylarene carboxylate, which is in turn reacted with a sulfur compound such as sodium dithionite for converting bromo group to sodium sulfinate, which is then converted to sodium sulfonate using an oxidizing agent such as hydrogen peroxide.

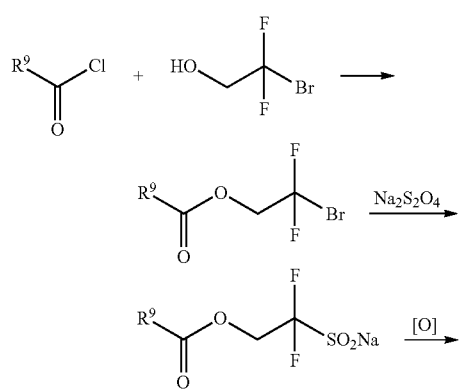

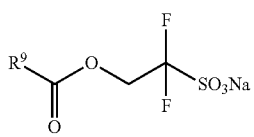

Herein $R^9$ is a $C_1$-$C_{20}$ straight, branched or cyclic alkyl group optionally containing a heteroatom.

The steps of esterification, conversion of alkane halide to sodium sulfinate, and conversion to sulfonic acid are well known, as discussed in detail in JP-A 2004-002252, for example.

The resulting sodium sulfonate is subjected to ion exchange reaction with a sulfonium salt compound, yielding the desired sulfonium salt.

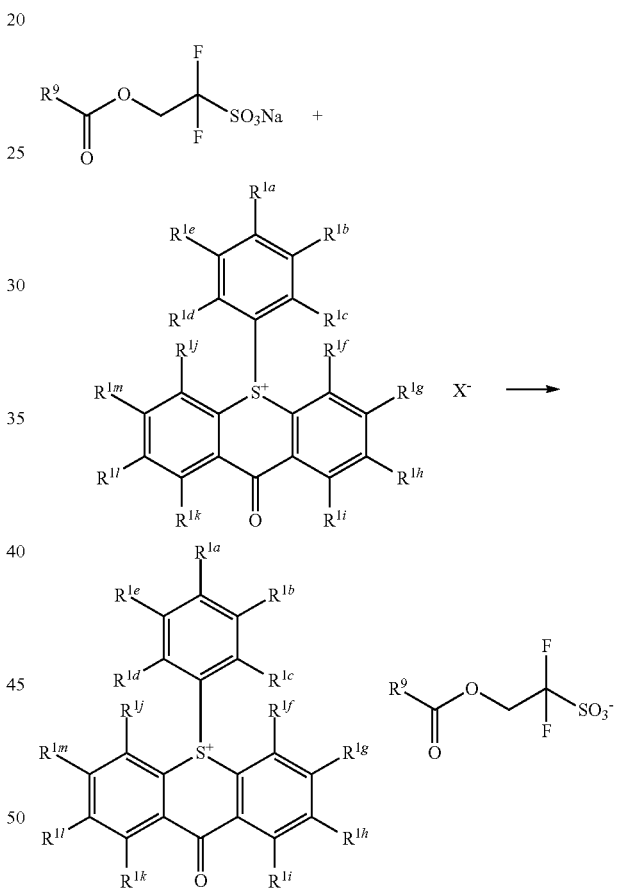

Herein $R^9$ and $R^{1a}$ to $R^{1m}$ are as defined above. $X^-$ is a counter anion, examples of which include, but are not limited to, halide ions such as $I^-$, $Br^-$ and $Cl^-$; sulfonic acid or alkylsulfonic acid anions such as sulfate anion and methylsulfate anion; carboxylic acid anions such as acetate and benzoate; alkanesulfonate ions such as methanesulfonate and propanesulfonate; arenesulfonate ions such as benzenesulfonate and p-toluenesulfonate; and hydroxide.

Further, a sulfonium salt having 1,1-difluoro-2-hydroxyethanesulfonate can be synthesized by subjecting the acyl group: $R^9CO$— introduced as above to ester hydrolysis or solvolysis. This step is outlined below.

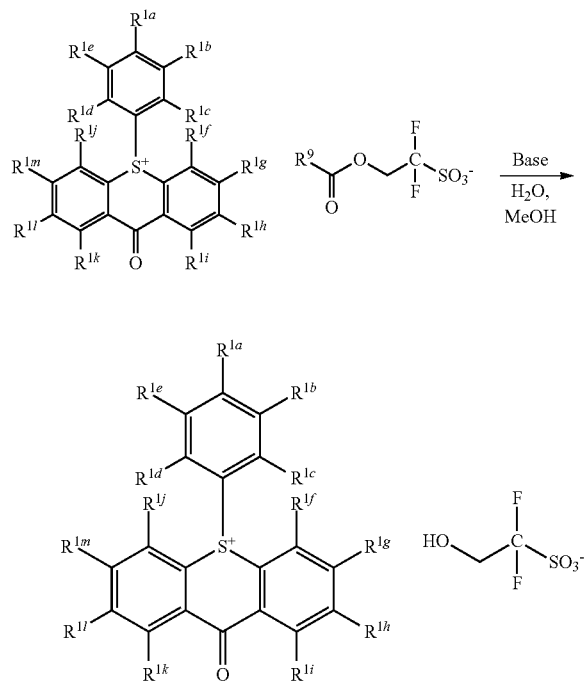

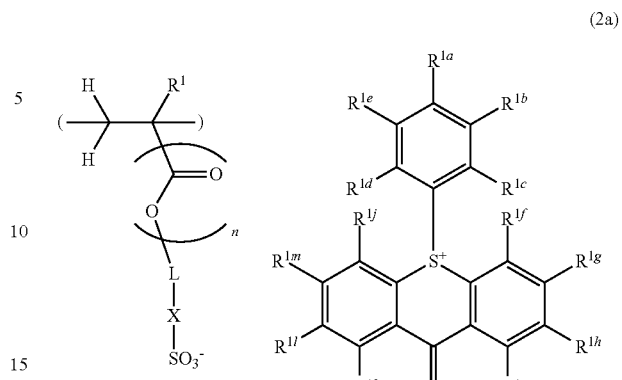

Herein $R^9$ and $R^{1a}$ to $R^{1m}$ are as defined above, and Me stands for methyl.

The sulfonium salt having 1,1-difluoro-2-hydroxyethanesulfonate, synthesized as above, is reacted with a corresponding carboxylic halide under basic conditions, yielding the desired sulfonium salt of formula (1b) wherein A is hydrogen.

By a choice of a suitable carboxylic halide at this point, $L^1$ in formula (1b) may be changed. Namely, even when the composition of a base resin is altered, the sulfonium salt of the invention can be easily redesigned to an optimum salt for a particular base resin. The sulfonium salt finds a wide range of application.

Next, the synthesis of a sulfonium salt having formula (1b) wherein A is trifluoromethyl is illustrated.

A sulfonium salt having 1,1,3,3,3-pentafluoro-2-hydroxypropanesulfonate is synthesized instead of the sulfonium salt having 1,1-difluoro-2-hydroxyethanesulfonate. This is followed by the same procedures as in the above embodiment wherein A is hydrogen, yielding the desired sulfonium salt of formula (1b) wherein A is trifluoromethyl. In the embodiment wherein A is trifluoromethyl, $L^1$ in formula (1b) may be changed likewise.

With respect to the synthesis of the sulfonium salt having 1,1,3,3,3-pentafluoro-2-hydroxypropanesulfonate, reference may be made to JP-A 2007-145804.

While several methods for the synthesis of a sulfonium salt having formula (1b) have been described, they are merely exemplary and not intended to limit the invention thereto.

Another embodiment of the invention is a polymer or high-molecular-weight compound capable of generating a sulfonic acid in response to high-energy radiation or heat. The polymer is characterized by comprising recurring units having the general formula (2a).

(2a)

Herein $R^1$, $R^{1a}$ to $R^{1m}$, L, X, and n are as defined above.

It is noted that Patent Document 7 (JP-A 2011-138107, paragraph [0052]) describes a polymer-bound acid generator having a high sensitivity to EUV light, but a low sensitivity to OOB light. Patent Document 6 (JP-A 2008-133448, paragraph [0022]) describes a sulfonium salt having a ring structure, whose sensitivity to KrF and ArF exposure is low and whose sensitivity to EUV exposure is substantially equal to that of triphenylsulfonium salts. Namely, the sulfonium salt having a ring structure described in JP-A 2008-133448, paragraph [0022] has high resistance to OOB light and satisfactory sensitivity to EUV exposure and thus finds advantageous use especially in the EUV lithography. As compared with the sulfonium salt having a ring structure described in JP-A 2008-133448, paragraph [0022], the sulfonium salt of the invention has low sensitivity to OOB light and ArF exposure and high sensitivity to EUV exposure, leading to satisfactory resist performance. For example, a resist pattern of higher contrast and better profile can be formed. It is believed that the use of a sulfonium salt having lower sensitivity to OOB contributes to improvements in resist performance. Additionally, since the base resin used herein has the specific sulfonium salt incorporated in polymer units, acid diffusion is suppressed and acid is uniformly dispersed. These contribute to improvements in such parameters as LWR and exposure latitude.

More preferably, the polymer comprises recurring units having the general formula (2b).

(2b)

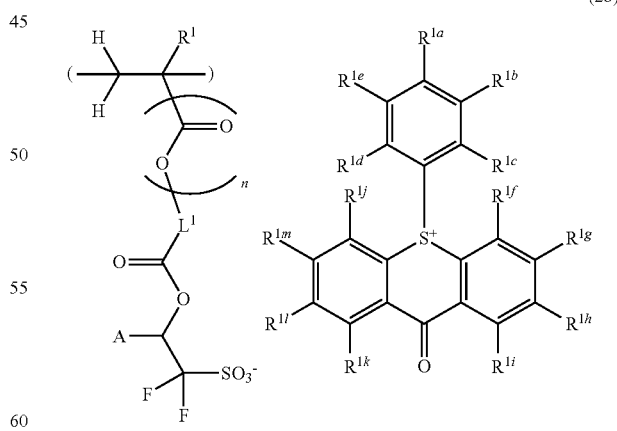

Herein $R^1$, $R^{1a}$ to $R^{1m}$, $L^1$, A, and n are as defined above.

The structure of formula (2b) is very advantageous in that an optimum molecular design for a particular application is possible since $L^1$ can be changed among a variety of groups as previously alluded to. It has a low degree of fluorine substitution and an ester structure, which ensure further advantages including decomposition and a minimized environmental load.

In addition to the recurring units having formula (2a) or (2b), the polymer may further comprise recurring units having the general formula (3) and/or (4).

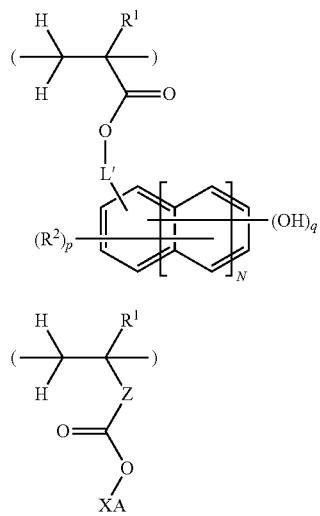

Herein $R^1$ is hydrogen, fluorine, methyl or trifluoromethyl. $R^2$ is halogen or a $C_1$-$C_{10}$ alkyl group. L' is a single bond or a $C_1$-$C_{10}$ divalent organic group which may be substituted with oxygen. The subscript p is an integer of 0 to 3, q is 1 or 2, N is an integer of 0 to 2. Z is a single bond, phenylene, naphthylene or (backbone)-C(=O)—O—Z'—, wherein Z' is a $C_1$-$C_{10}$ straight, branched or cyclic alkylene group which may have a hydroxyl radical, ether bond, ester bond or lactone ring, or a phenylene or naphthylene group. XA is an acid labile group.

Specifically, L' is a single bond or a $C_1$-$C_{10}$ divalent organic group which may be substituted with oxygen. Suitable organic groups include methylene, ethylene, propane-1,3-diyl, butane-1,4-diyl, pentane-1,5-diyl, and hexane-1,6-diyl. Preferably L' is a single bond, methylene or ethylene. Some hydrogen atoms in such group may be substituted by an oxygen atom, or an oxygen atom may intervene in the group. As a result, an ether or ester bond may be formed or interposed in the group. N is an integer of 0 to 2, preferably 0 or 1. $R^2$ is halogen or a $C_1$-$C_{10}$ alkyl group, preferably $R^2$ being fluorine or methyl. The subscript p is an integer of 0 to 3, preferably 0, and q is 1 or 2, preferably 1.

Exemplary structures of the unit having formula (3) are shown below.

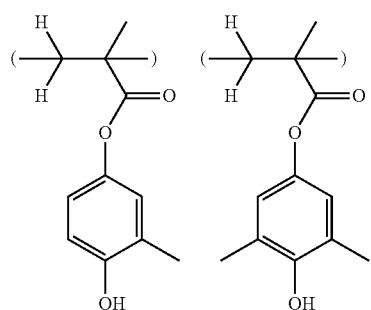

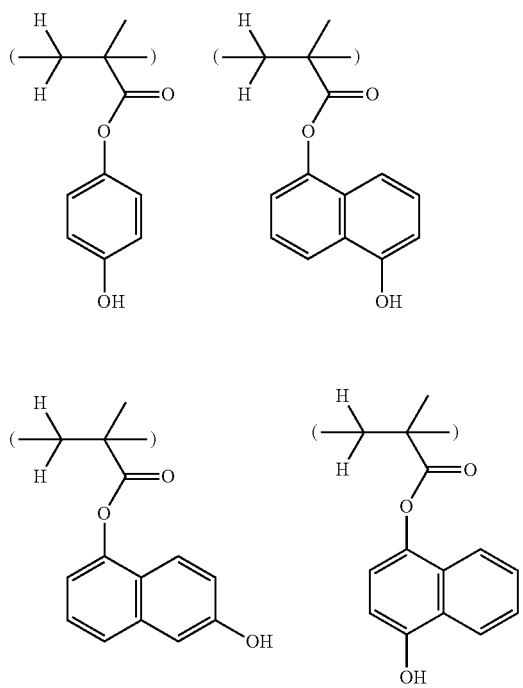

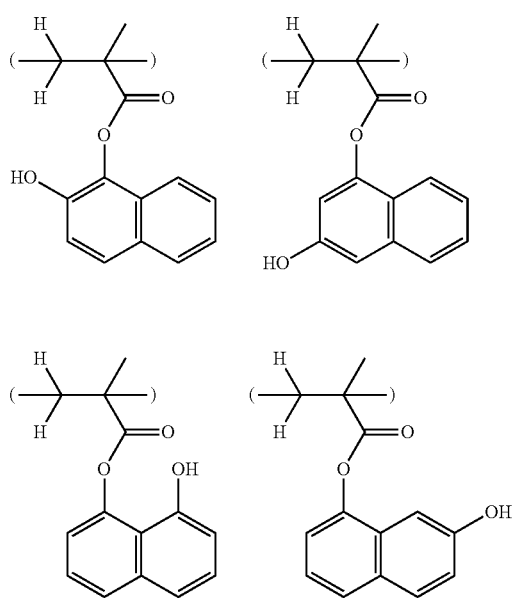

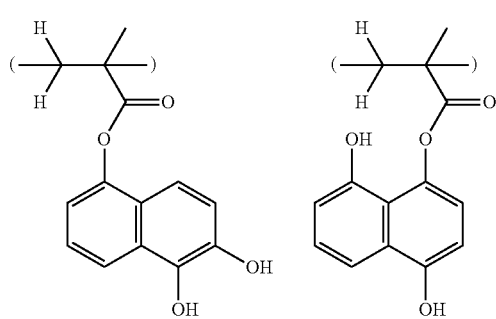

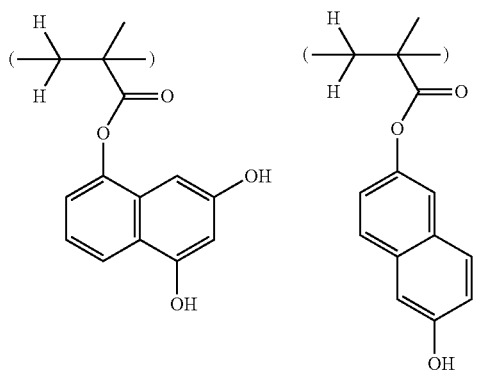
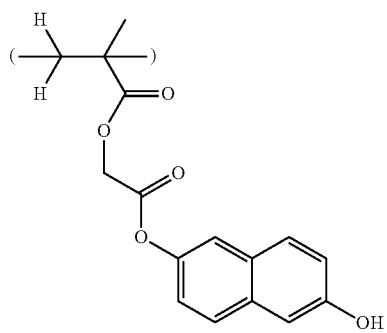

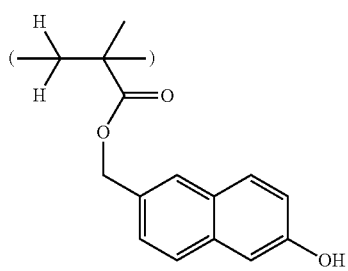
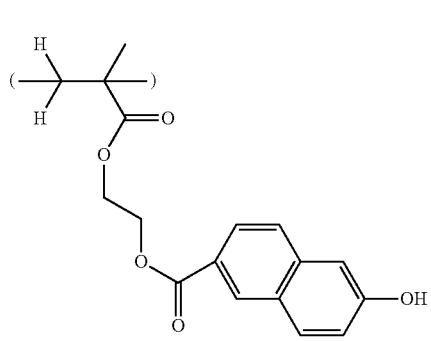

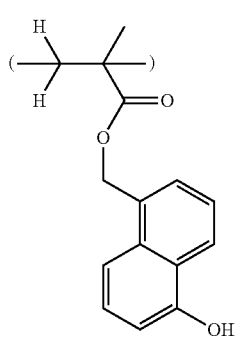
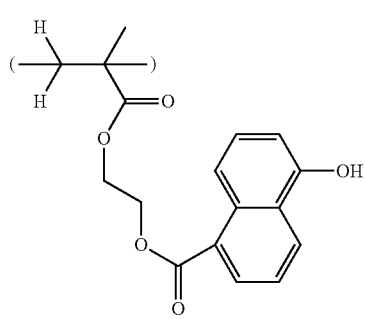

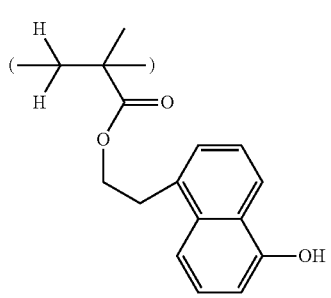

Since the phenolic hydroxyl-containing recurring units of formula (3) are presumed effective for swell suppression and acid generation efficiency in EB and EUV lithography, owing to their hydroxyl group and aromatic ring structure, they are expected to contribute to improvements in LWR and sensitivity. Accordingly, a resist composition comprising the inventive polymer is useful in EB and EUV lithography.

Examples of the structure having formula (4) wherein Z is a variant are shown below.

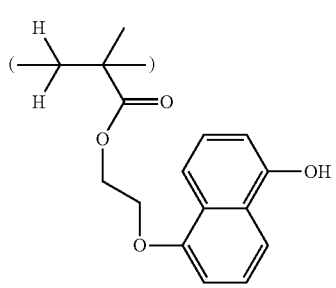
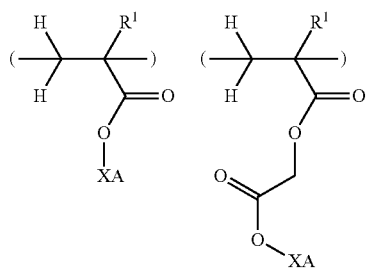

-continued
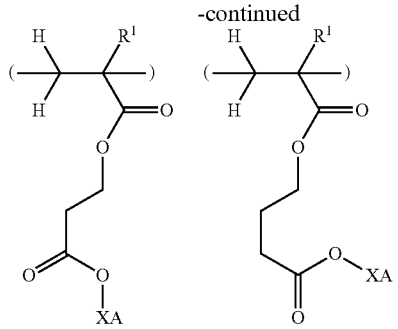
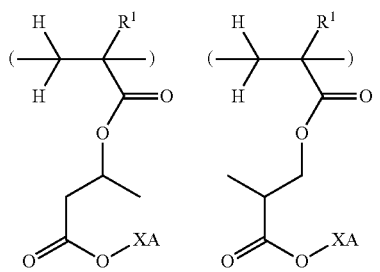
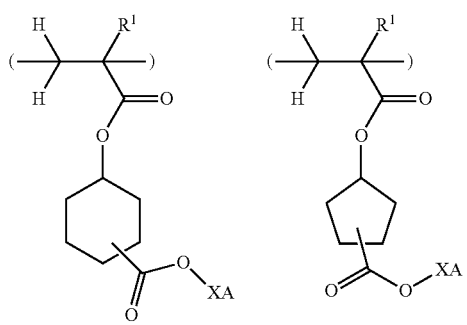
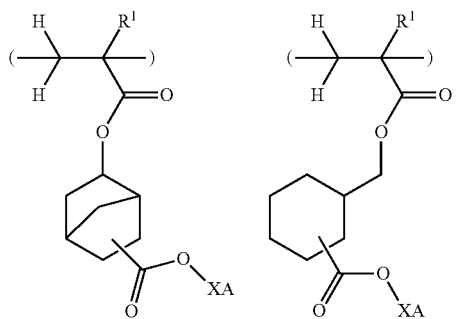
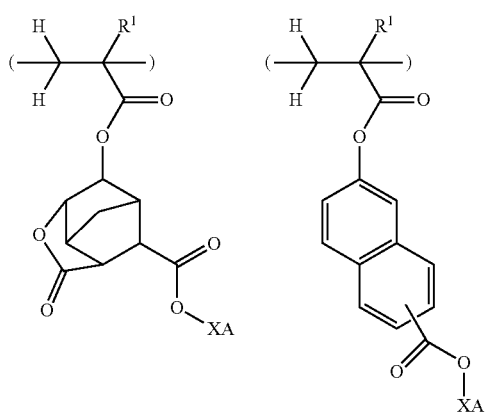
-continued
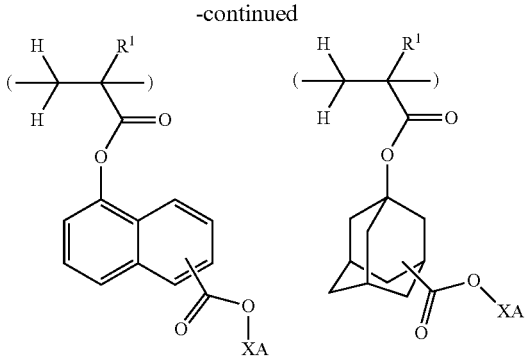
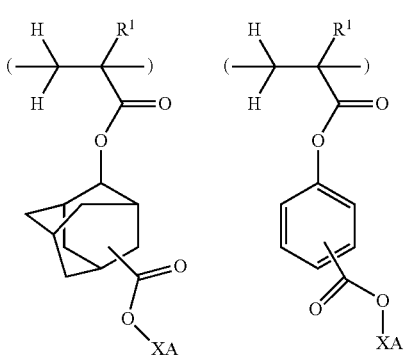
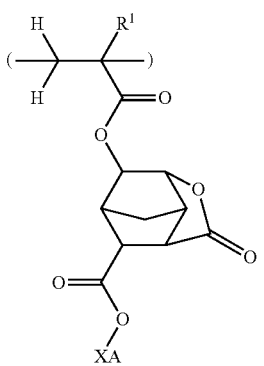
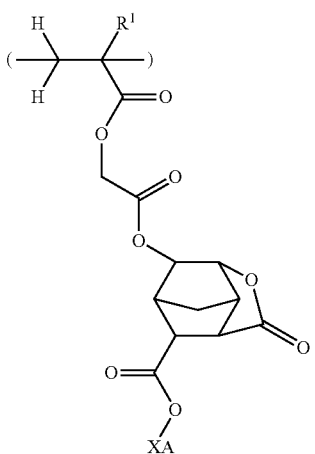

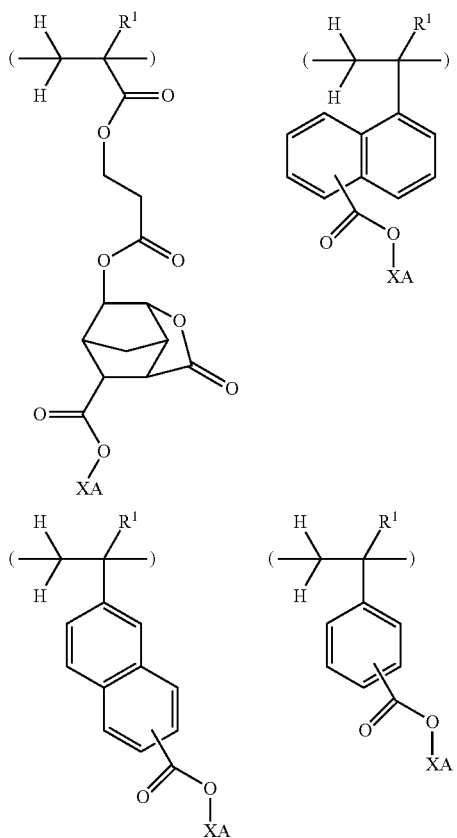

Herein R¹ is as defined above, and XA is an acid labile group.

Under the action of acid, a polymer comprising recurring units of formula (4) is decomposed to generate carboxylic acid, turning to be an alkali soluble polymer. The acid labile group represented by XA may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

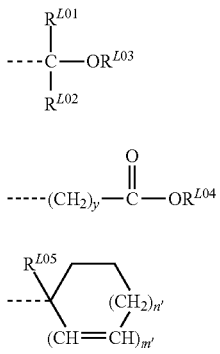

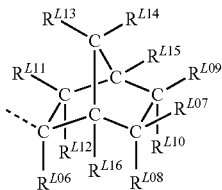

In these formulae, the broken line denotes a valence bond.

In formula (L1), $R^{L01}$ and $R^{L02}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like, or in which an oxygen atom intervenes between carbon atoms. Exemplary straight, branched or cyclic alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. Illustrative examples of the substituted alkyl groups are shown below.

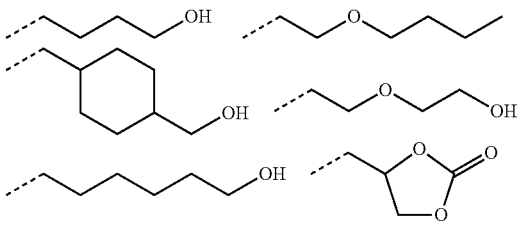

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is a substituted or unsubstituted, straight, branched or cyclic $C_1$-$C_8$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups. Examples of the optionally substituted aryl groups include phenyl, methylphenyl, naphthyl, anthryl, phenanthryl, and pyrenyl. Letter m' is equal to 0 or 1, n' is equal to 0, 1, 2 or 3, and 2m'+n' is equal to 2 or 3.

In formula (L4), $R^{L06}$ is a substituted or unsubstituted, straight, branched or cyclic $C_1$-$C_8$ alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$, taken together, form a ring with the carbon atom to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{14}$ form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$).

Of the acid labile groups of formula (L1), the straight and branched ones are exemplified by the following groups.

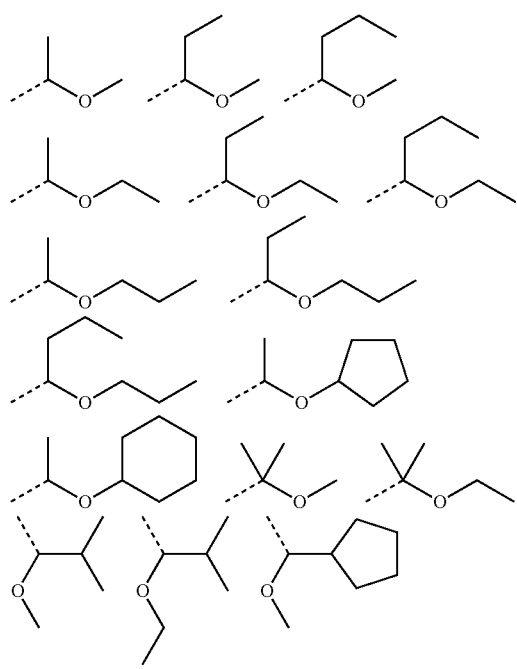

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulas (L4-1) to (L4-4) are preferred.

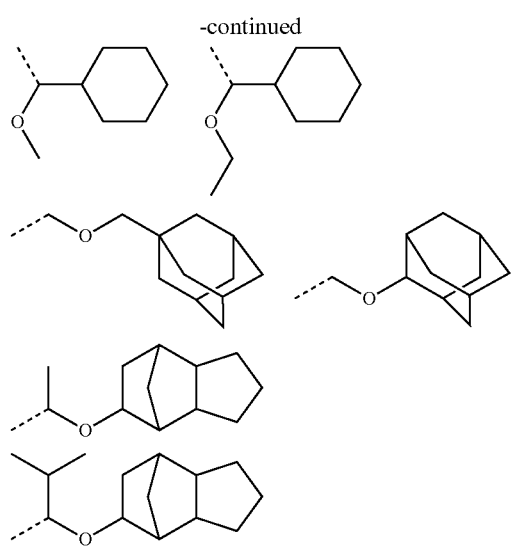

(L4-1)

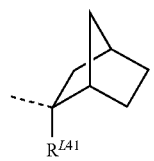

(L4-2)

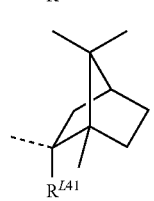

(L4-3)

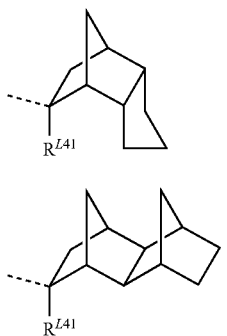

(L4-4)

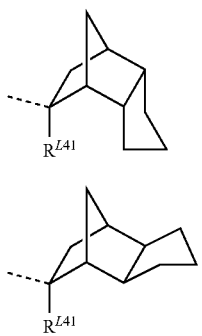
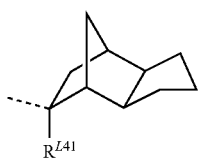

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

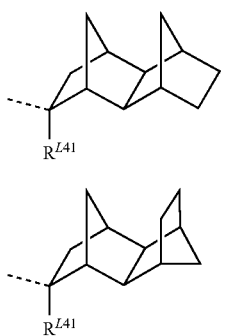

(L4-3-2)

Similarly, the general formula (L4-4) represents one or a mixture of two or more selected from groups having the following general formulas (L4-4-1) to (L4-4-4).

(L4-4-1)

(L4-4-2)

(L4-4-3)

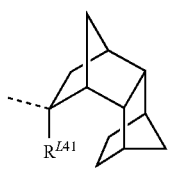

(L4-4-4)

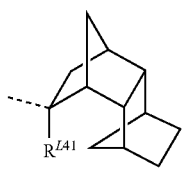

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

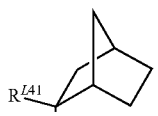

(L4-2-endo)

(L4-3-endo)

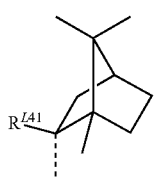

(L4-4-endo)

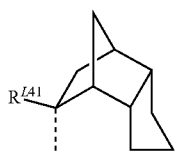
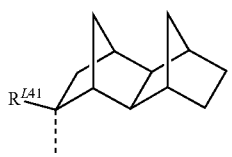

Illustrative examples of the acid labile group of formula (L4) are given below.

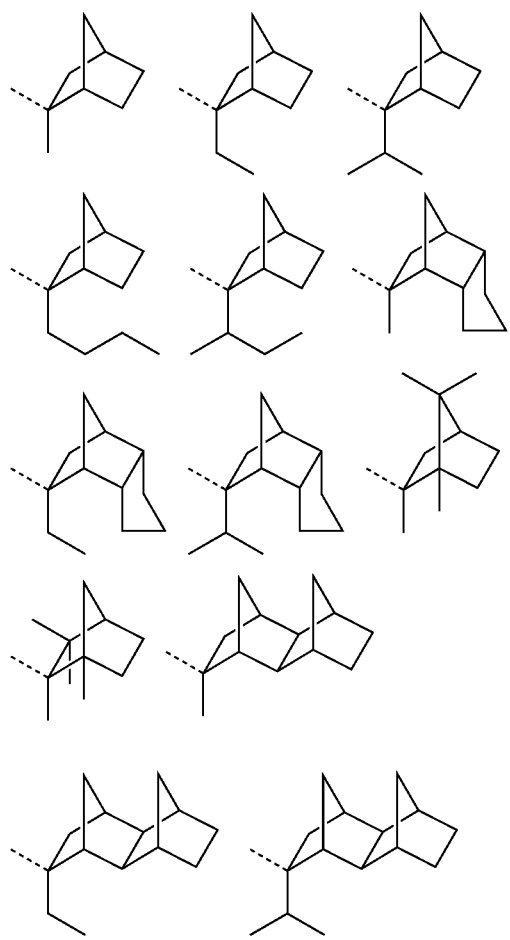
Examples of the tertiary $C_4$-$C_{20}$ alkyl groups, trialkyl-silyl groups in which each alkyl moiety has 1 to 6 carbon atoms, and $C_4$-$C_{20}$ oxoalkyl groups are as exemplified for $R^{L04}$.
Illustrative examples of the recurring units of formula (4) are given below, but not limited thereto.
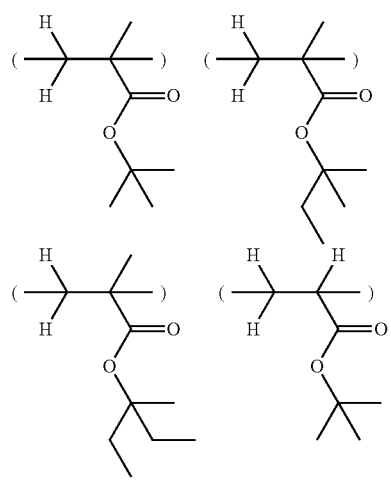
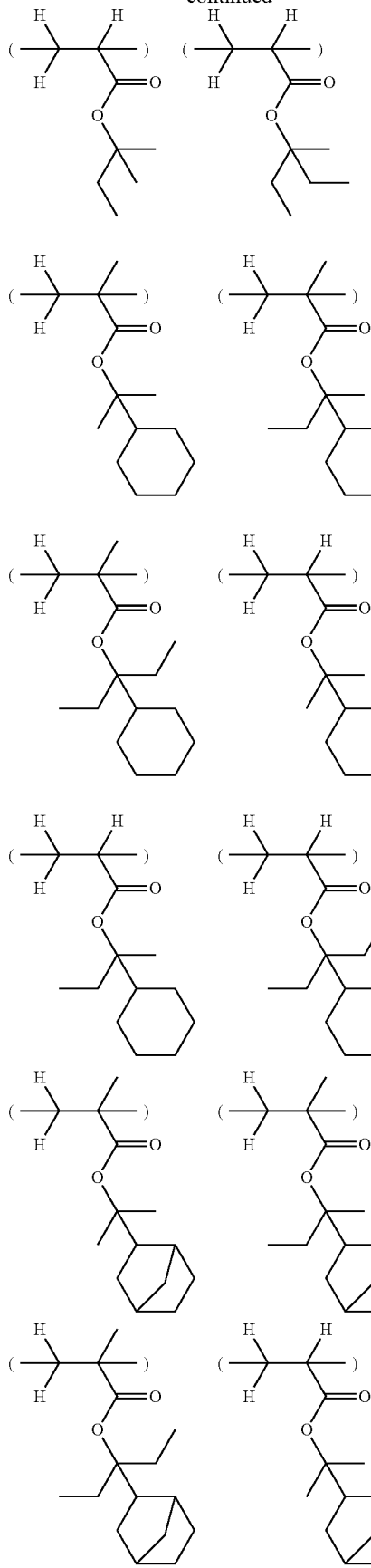

-continued
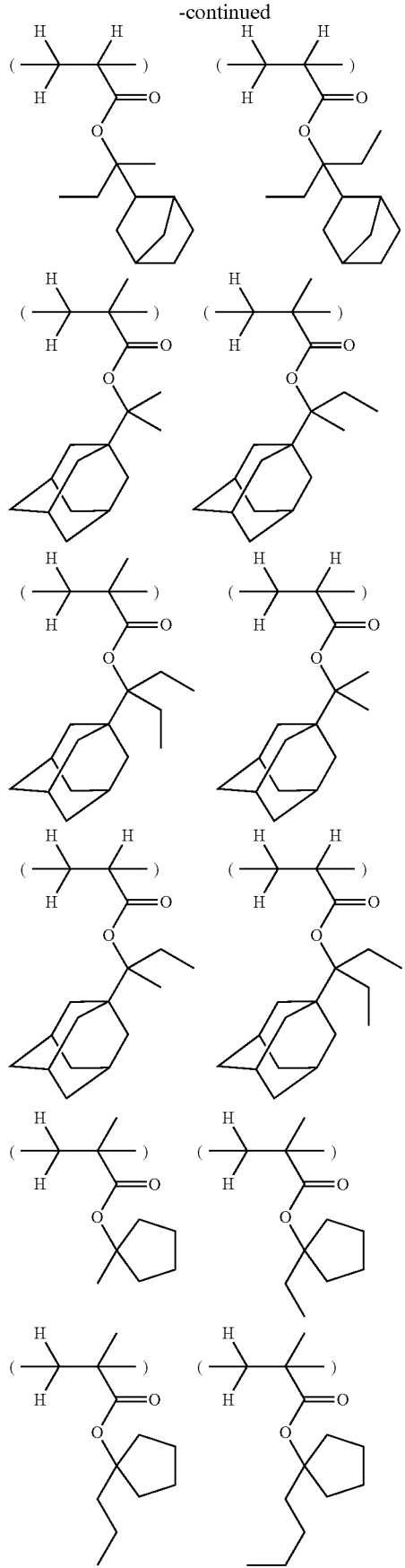
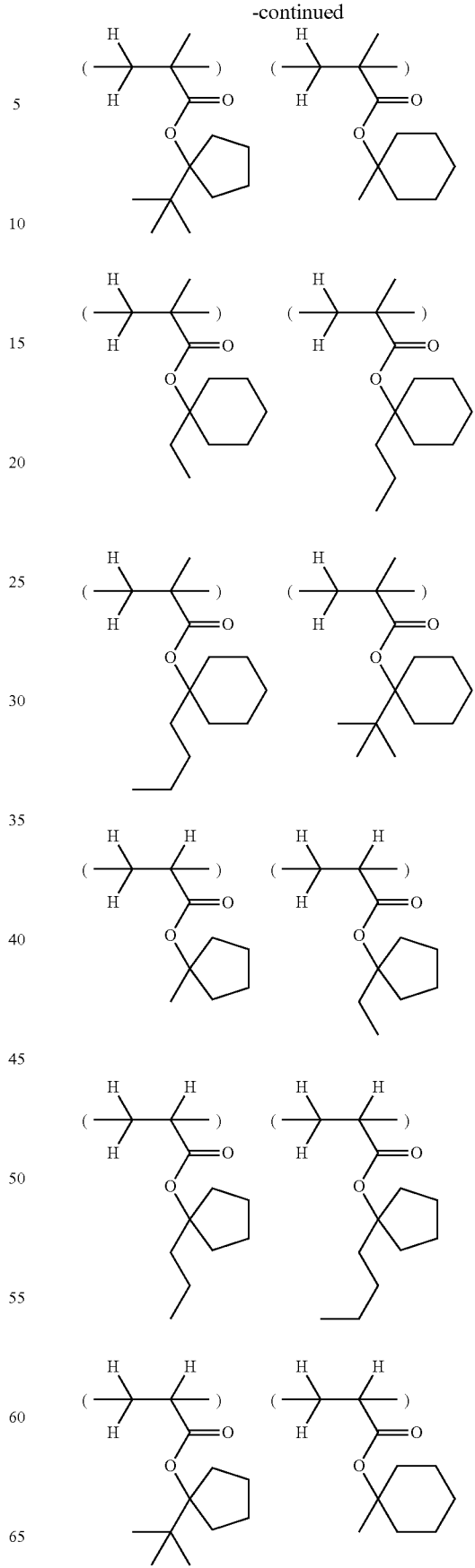

-continued

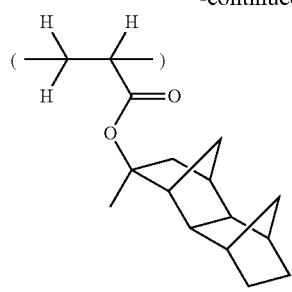
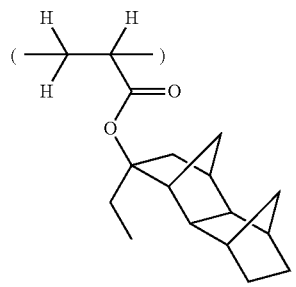
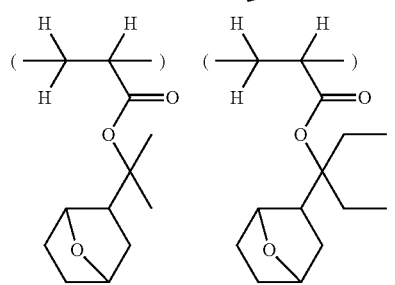
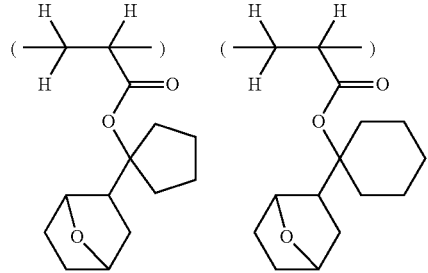
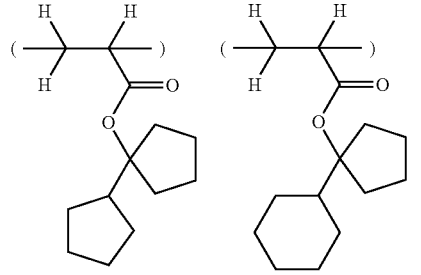
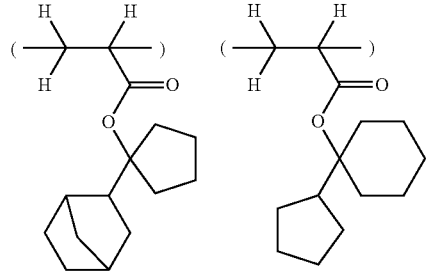
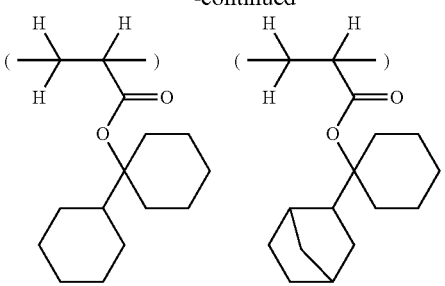
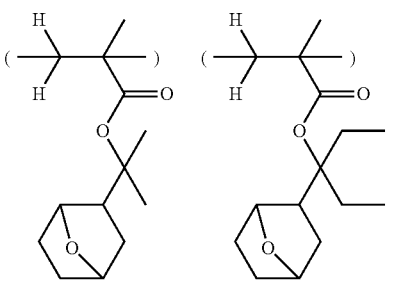
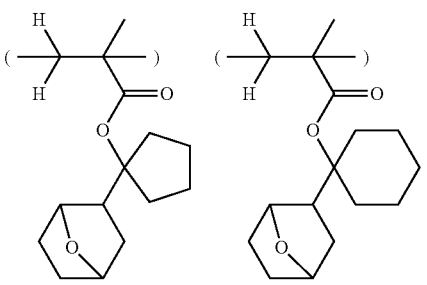
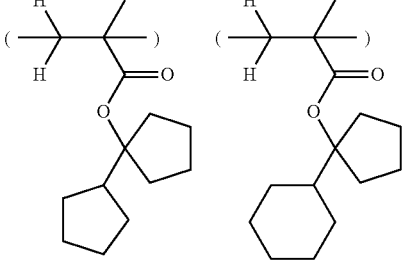
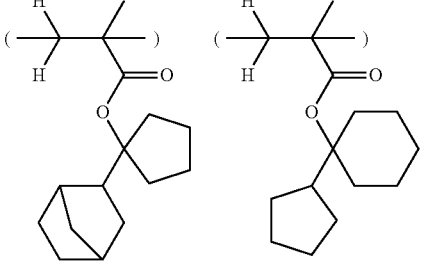
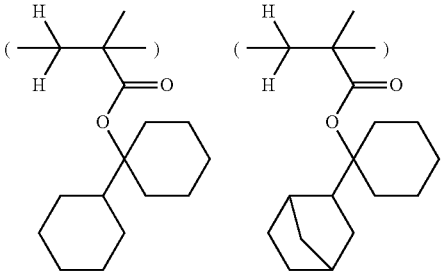

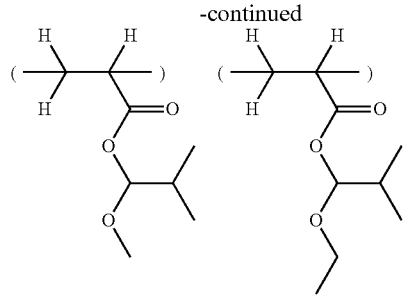
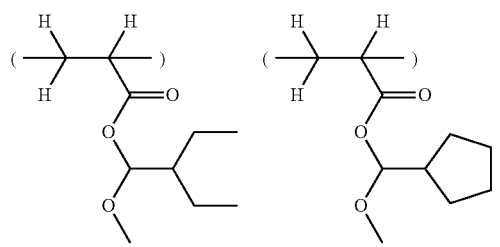
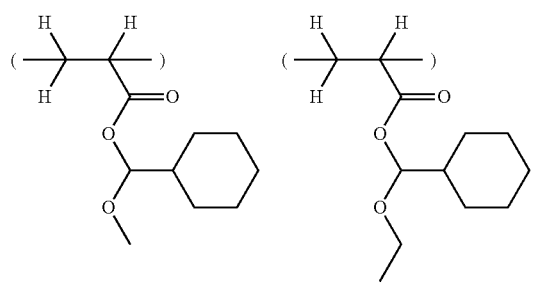
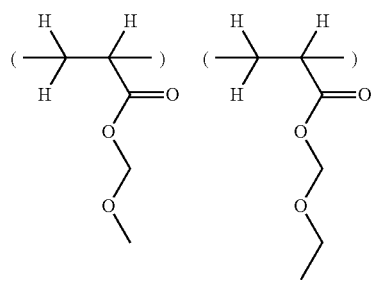
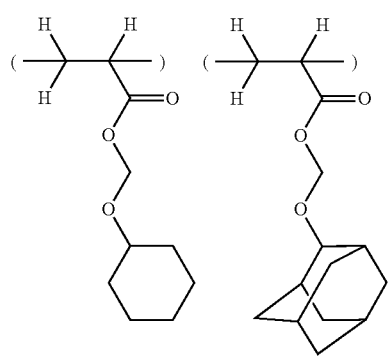
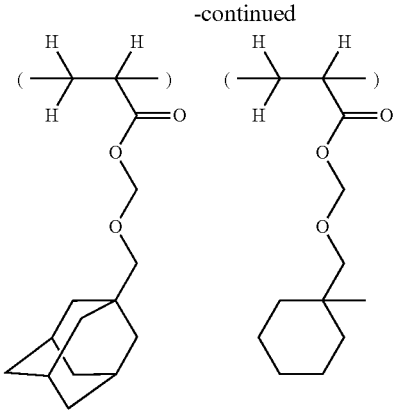
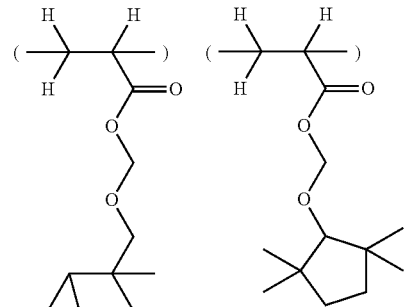
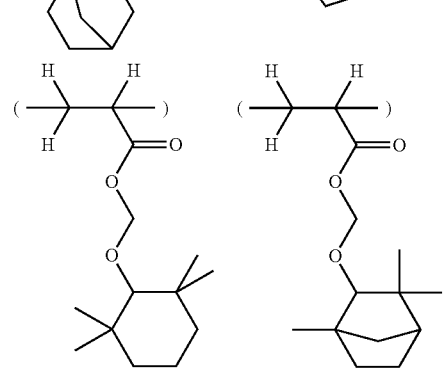
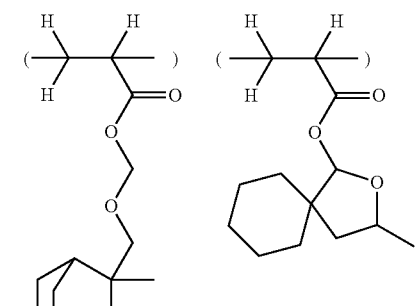
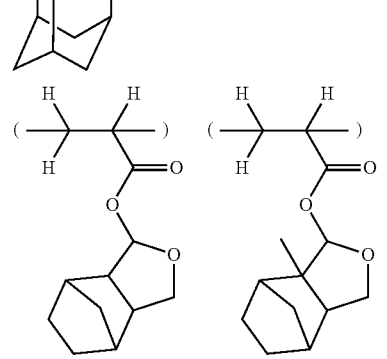

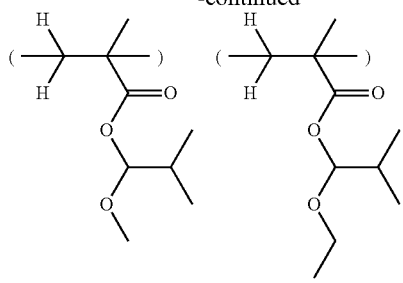
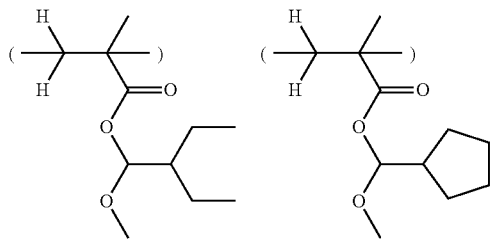
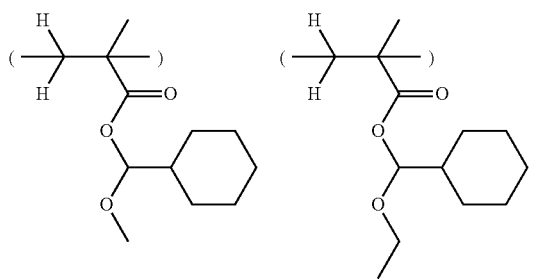
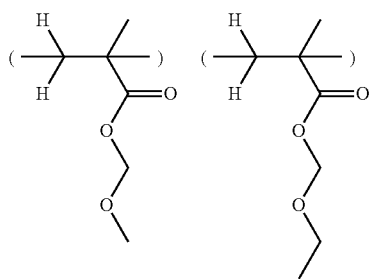
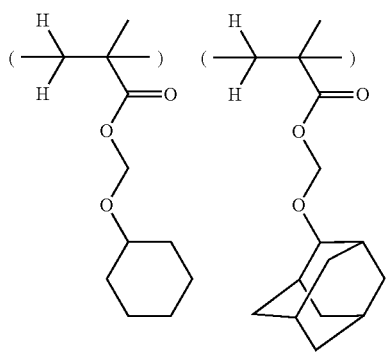
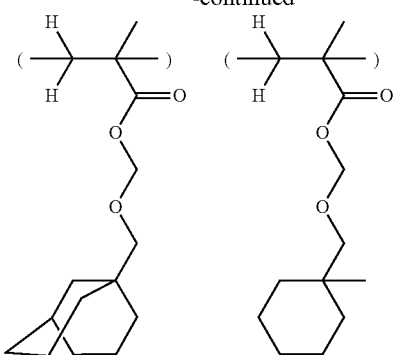
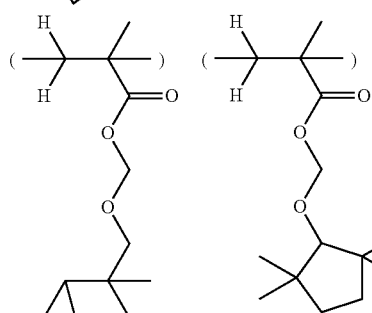
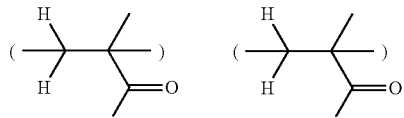
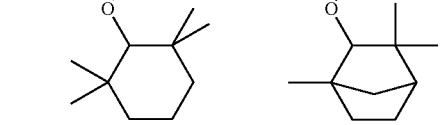
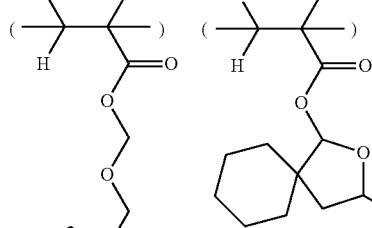
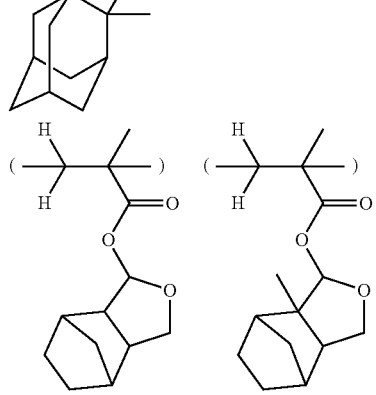

While the foregoing examples correspond to those units wherein Z is a single bond, Z which is other than a single bond may be combined with similar acid labile groups. Examples of units wherein Z is other than a single bond are substantially the same as illustrated above.

The polymer may further comprise additional units, typically recurring units having the general formula (5).

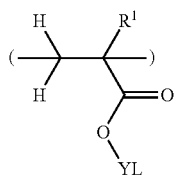
(5)

Herein $R^1$ is hydrogen, fluorine, methyl or trifluoromethyl. YL is hydrogen or a polar group having one or more structures selected from the group consisting of hydroxyl, cyano, carbonyl, carboxyl, ether bond, ester bond, sulfonic acid ester link, carbonate, lactone ring, sultone ring, and carboxylic anhydride.

Illustrative, non-limiting examples of the recurring units having formula (5) are shown below.

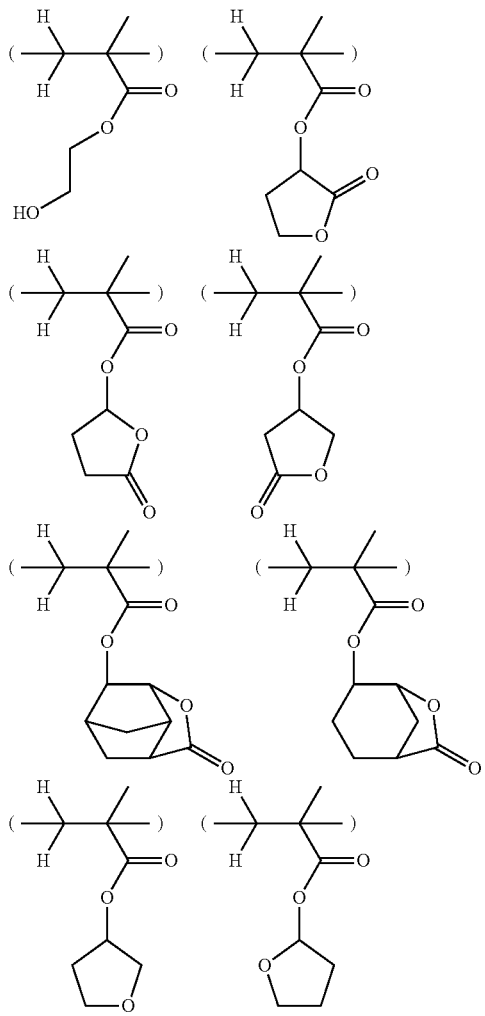

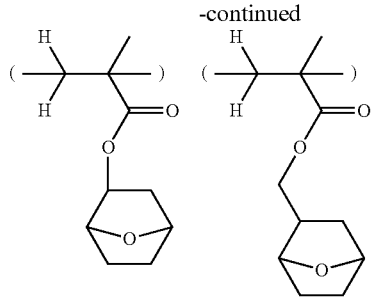

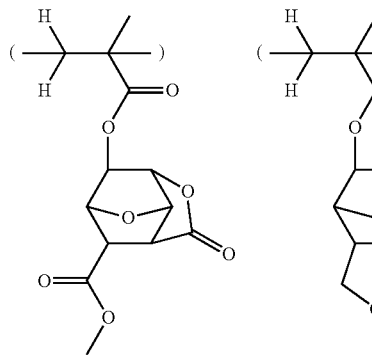

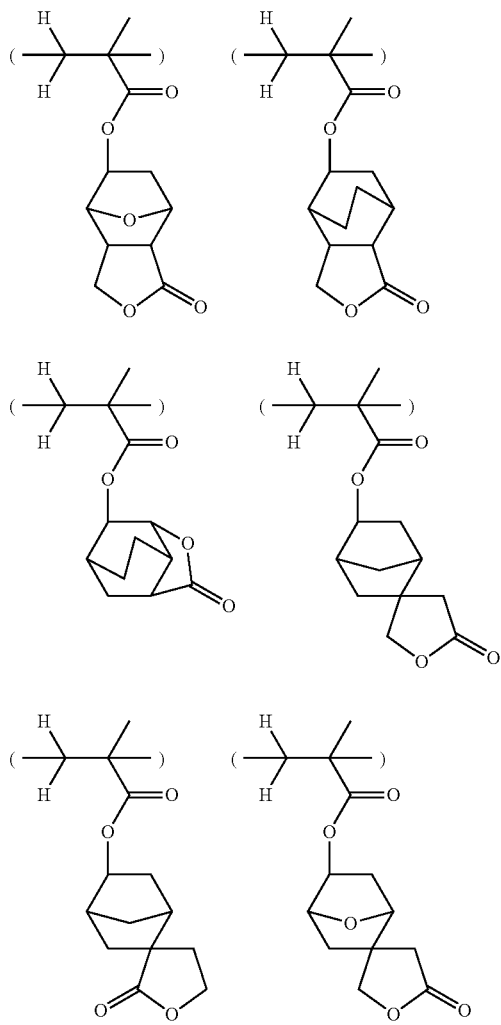

-continued
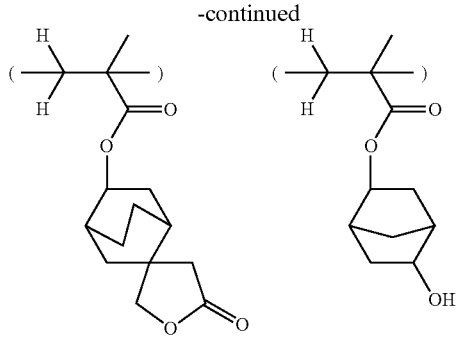
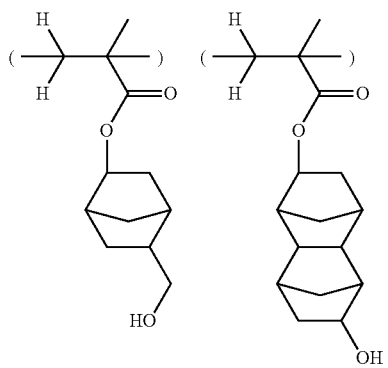
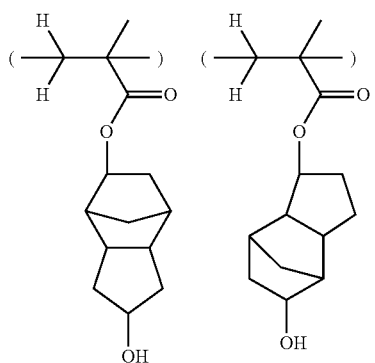
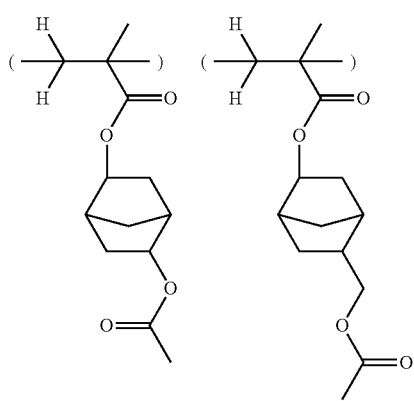
-continued
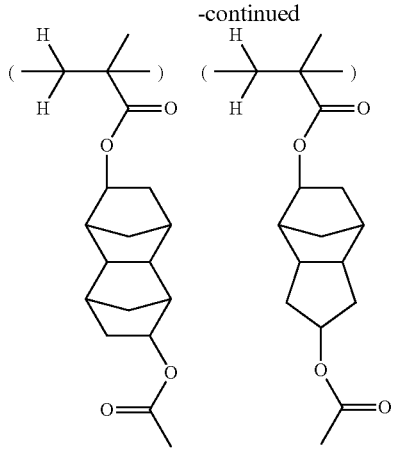
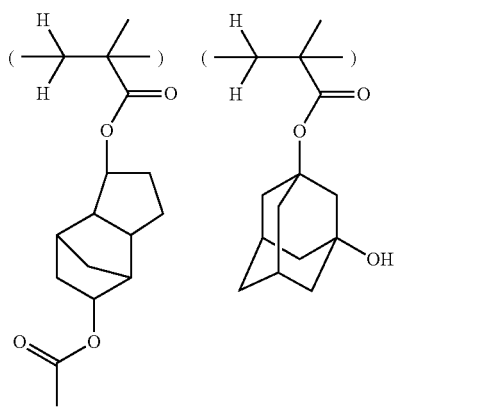
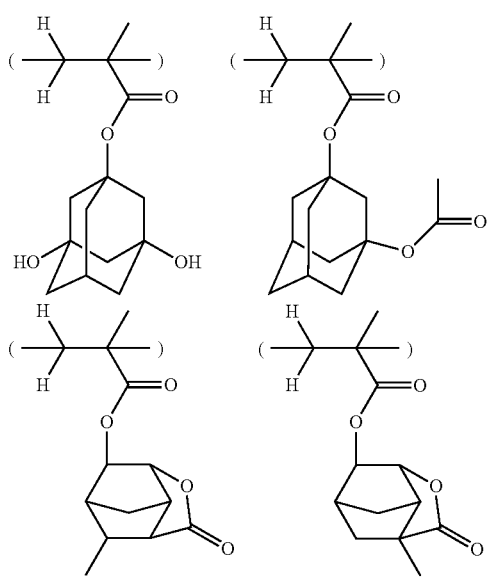
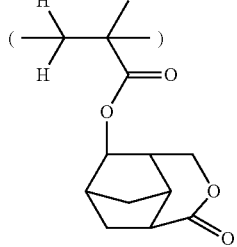

55
-continued
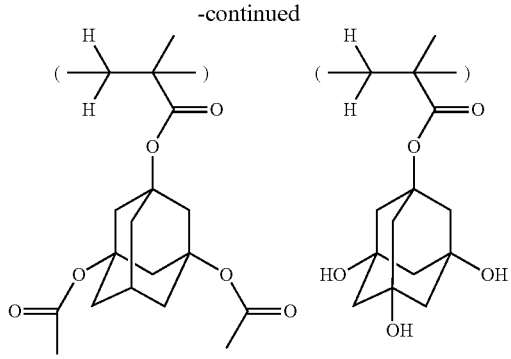
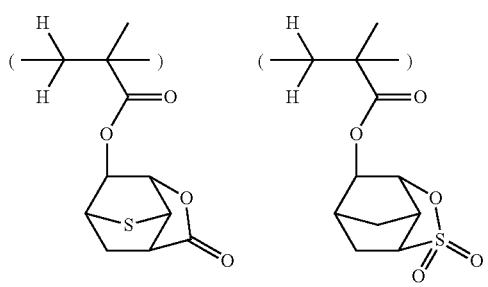
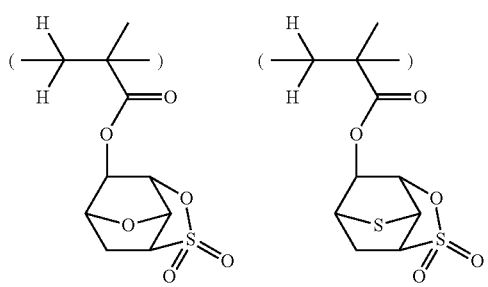
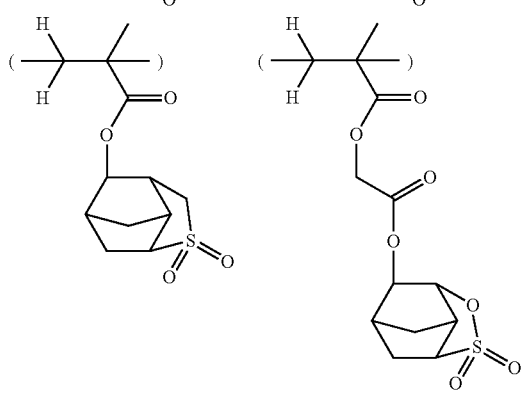
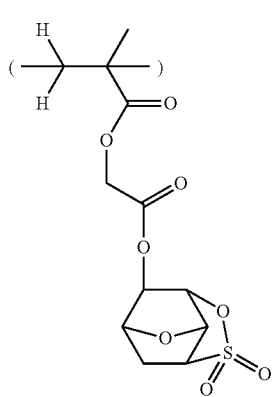
56
-continued
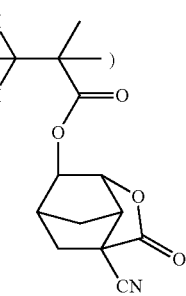
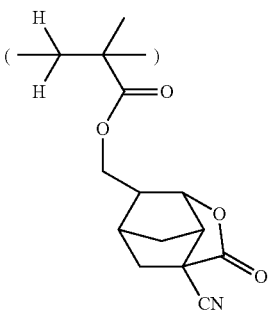
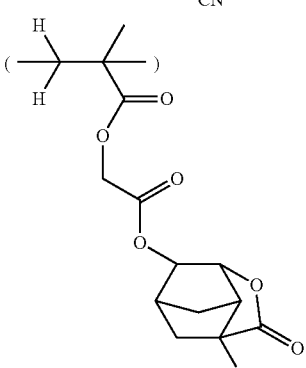
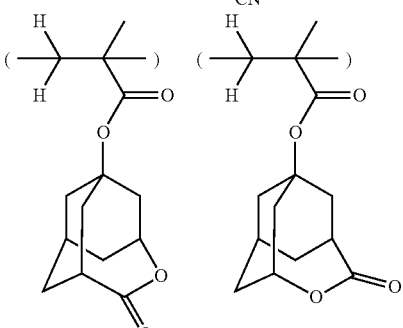
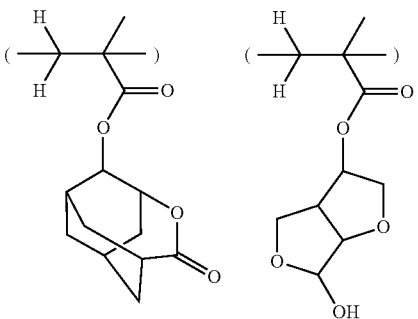

-continued
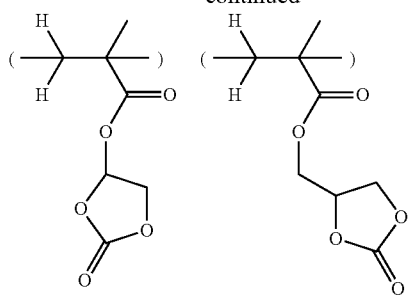
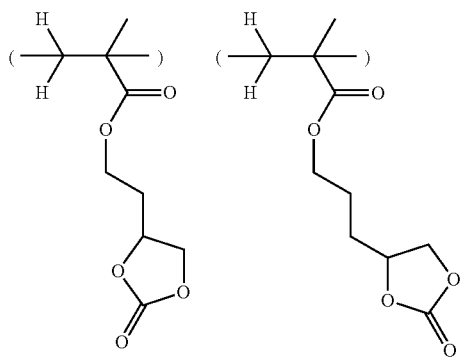
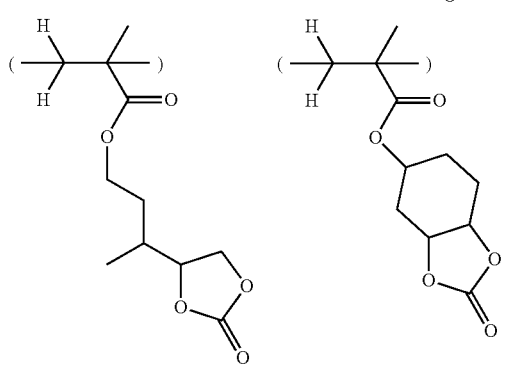
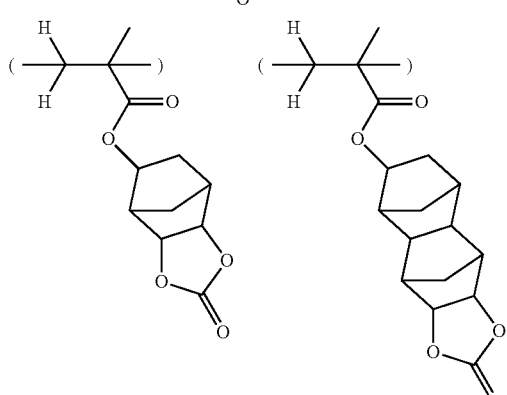
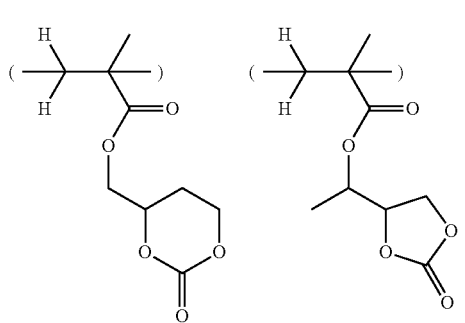
-continued
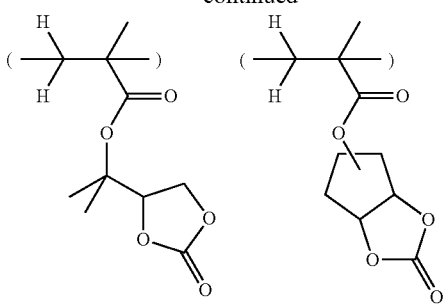
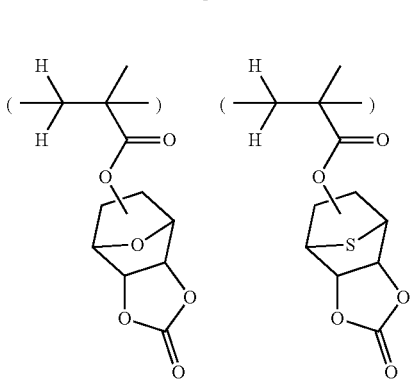
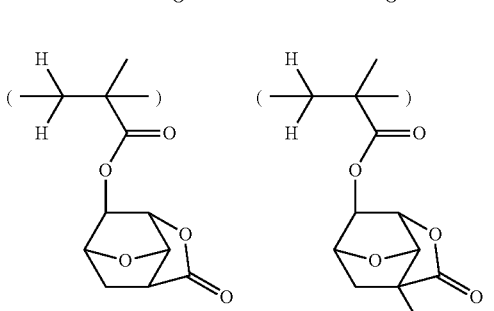
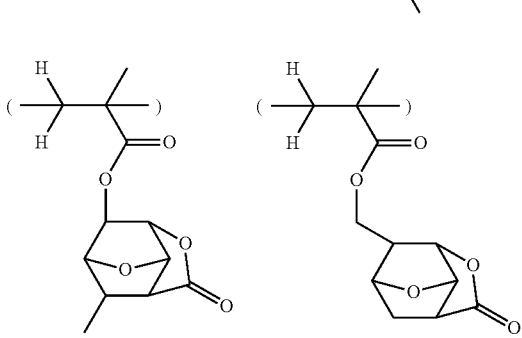
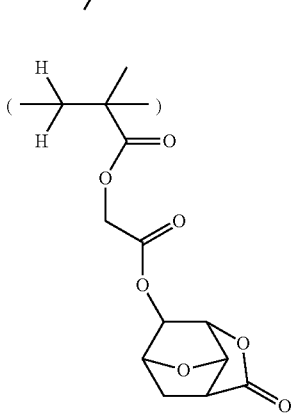

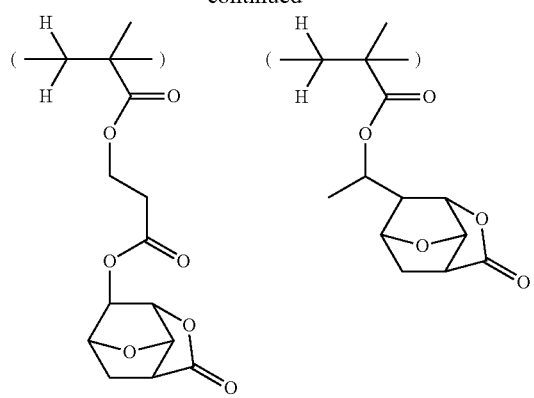
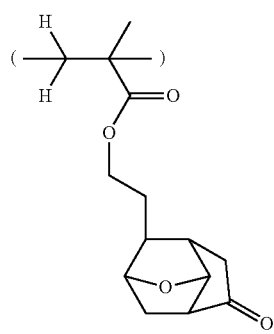
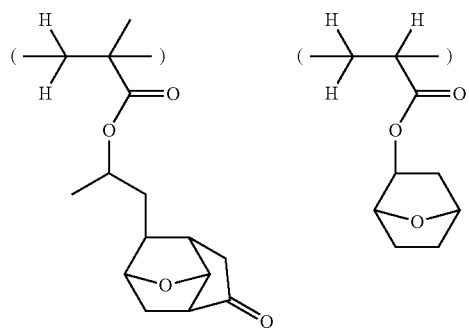
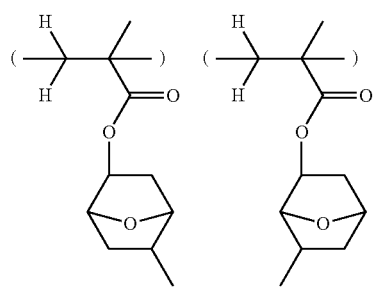
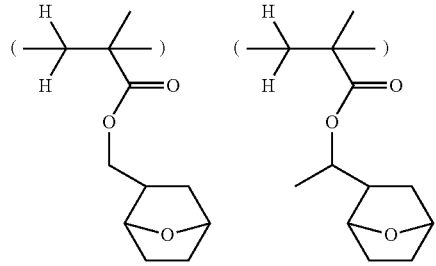
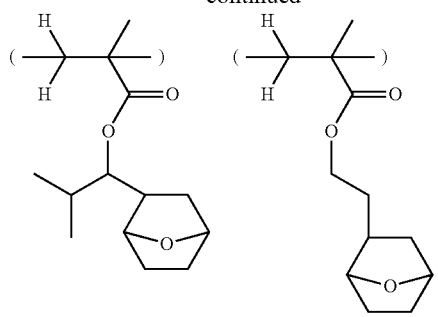
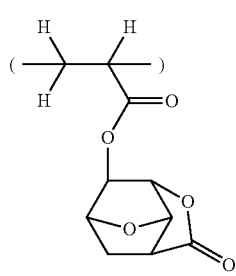
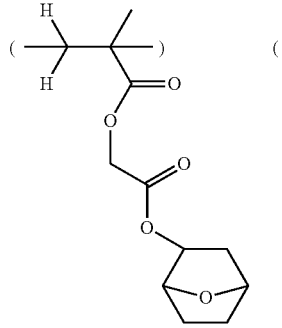
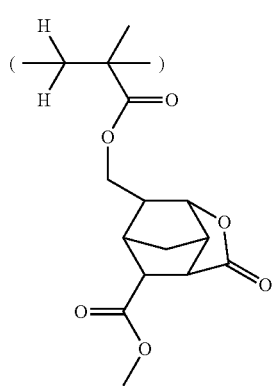

-continued
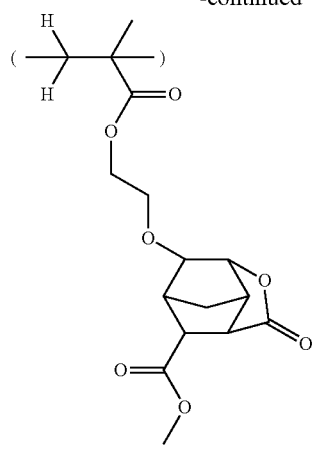
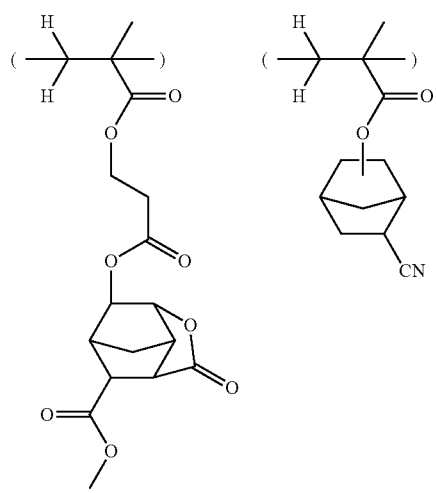
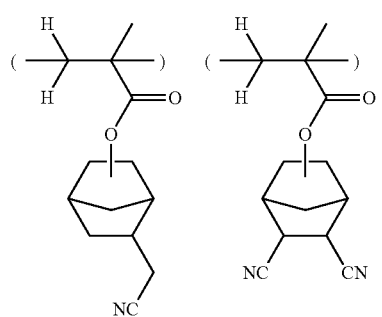
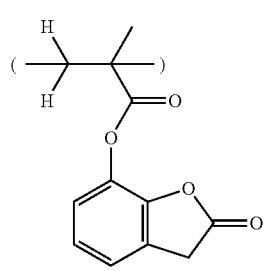
-continued
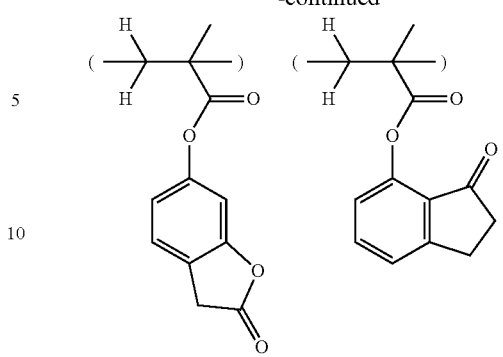
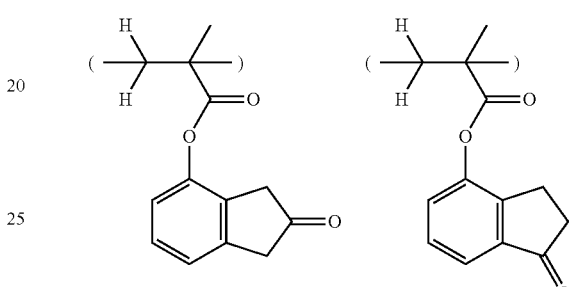
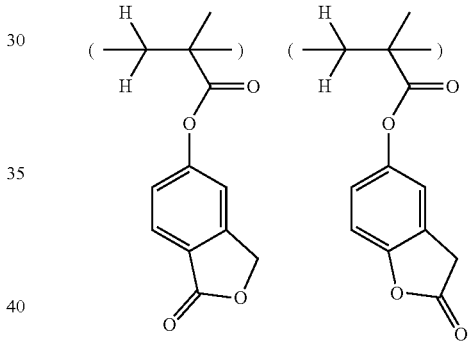
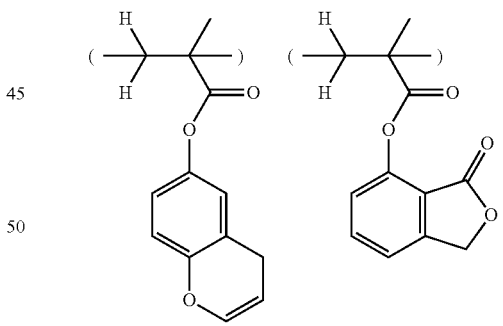
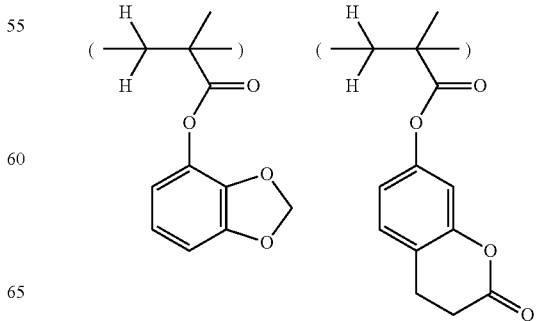

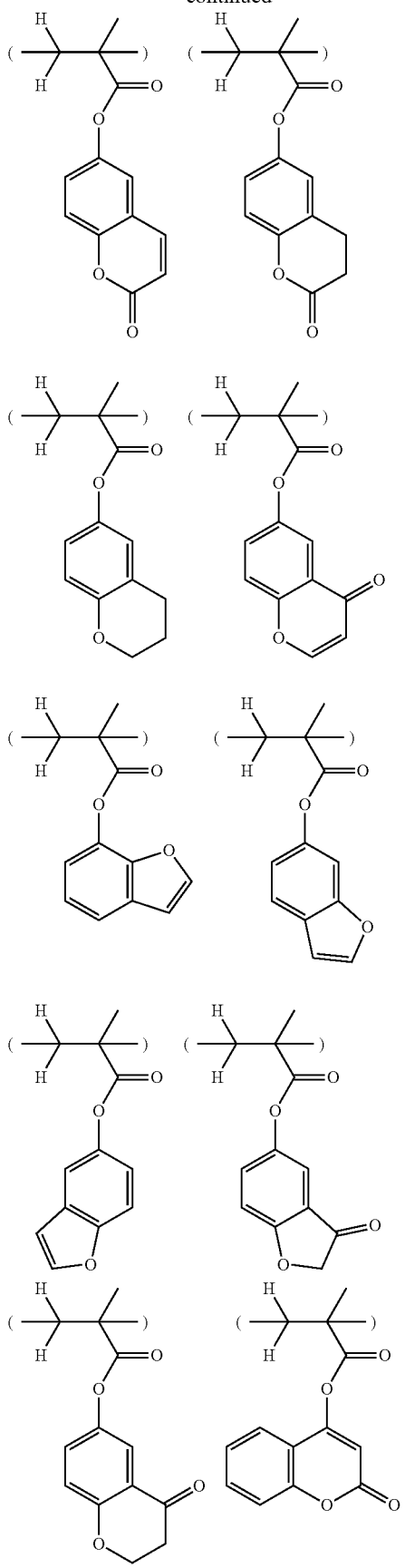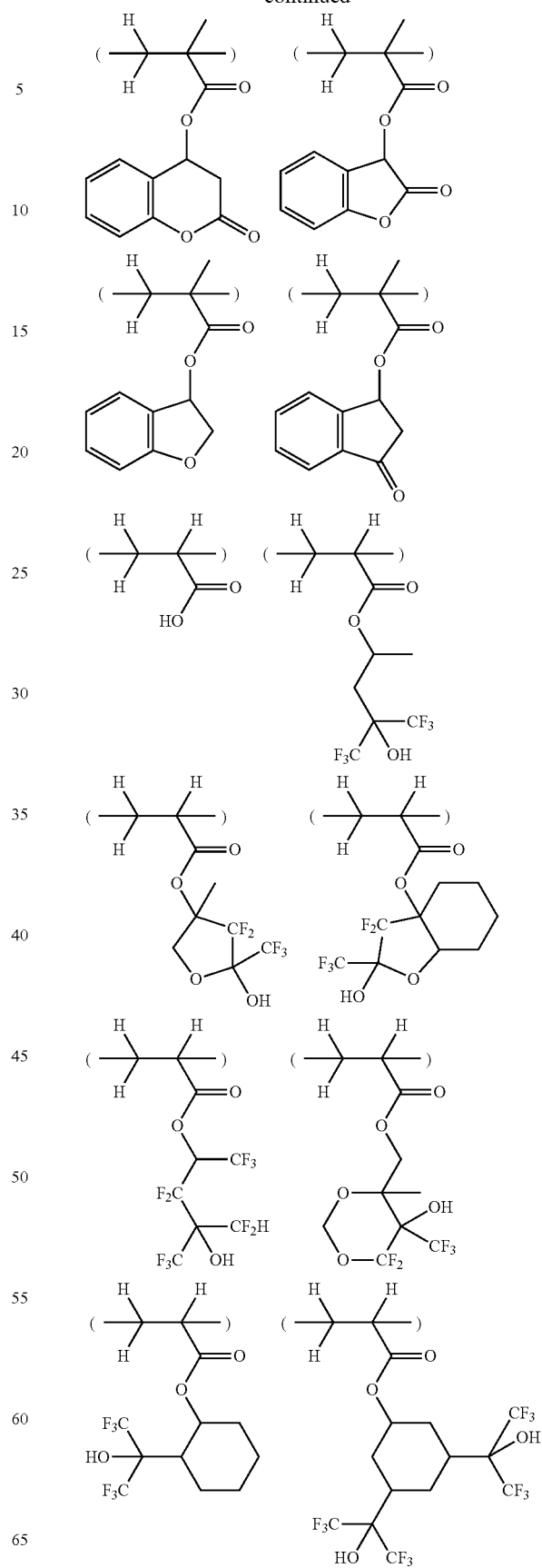

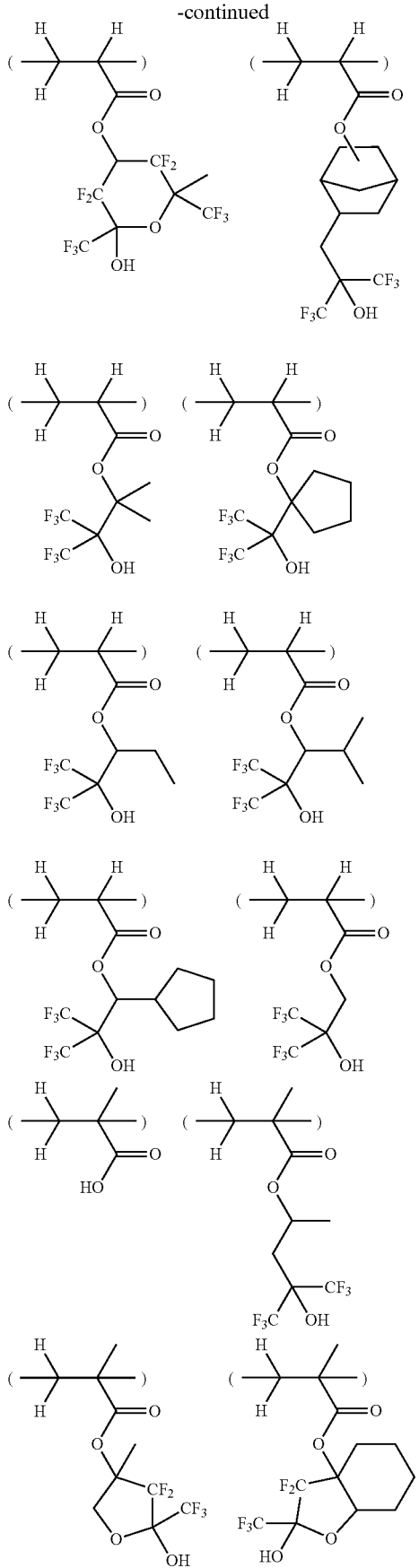
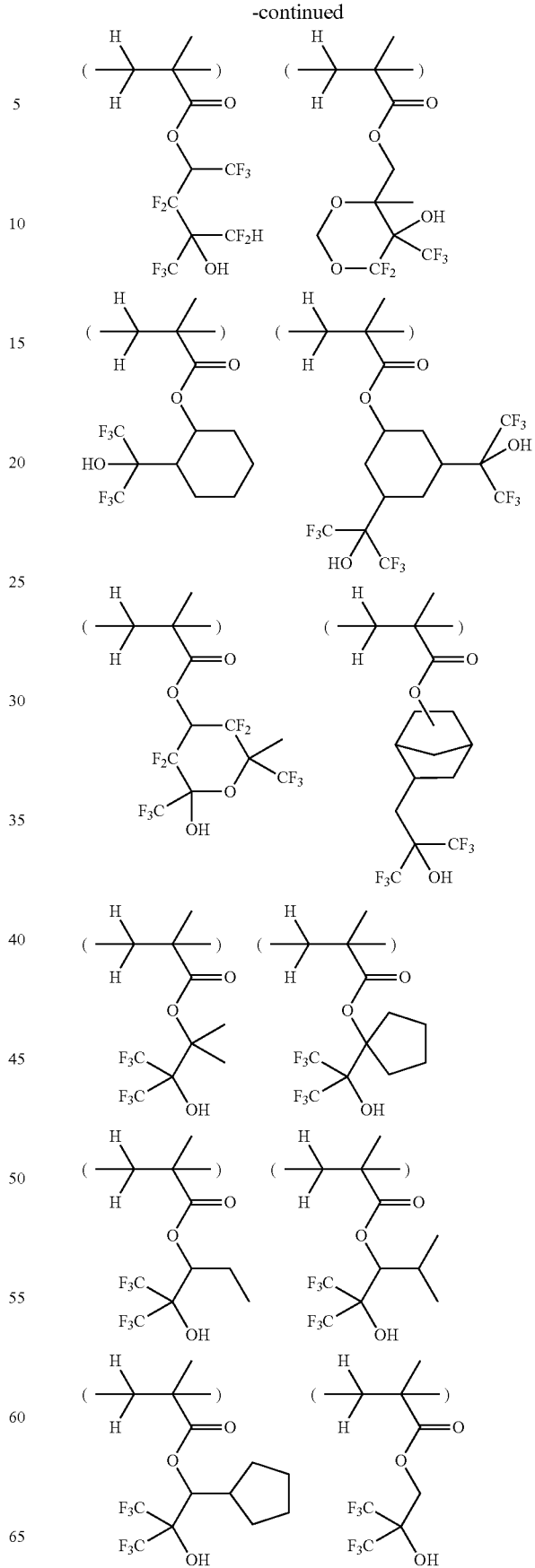

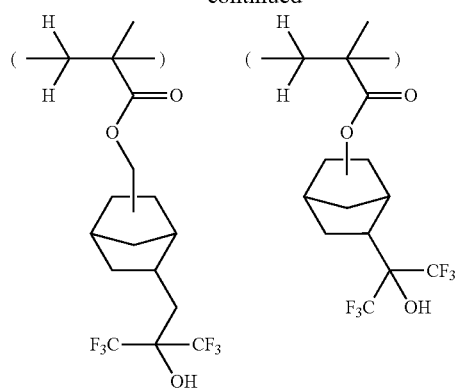
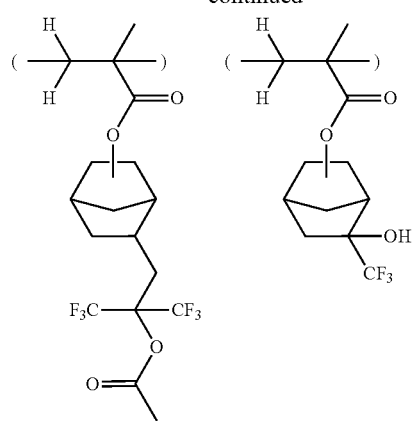
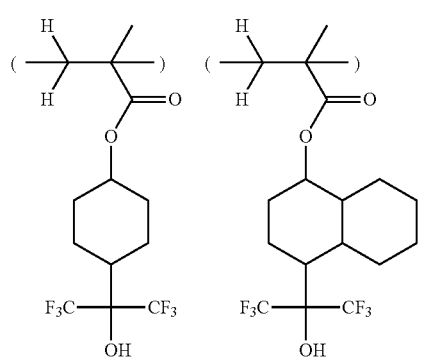
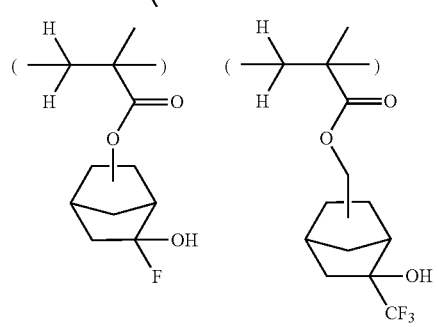
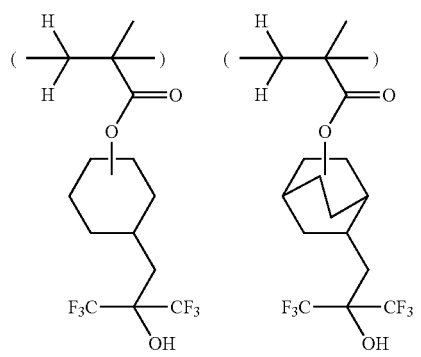
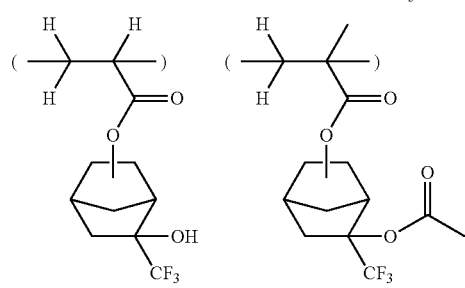
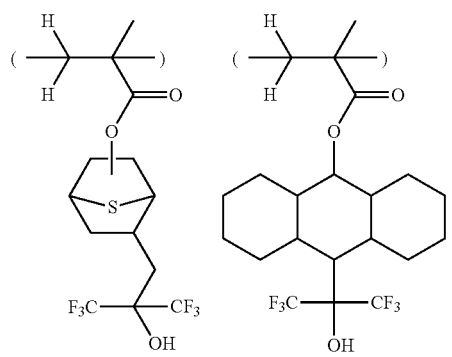
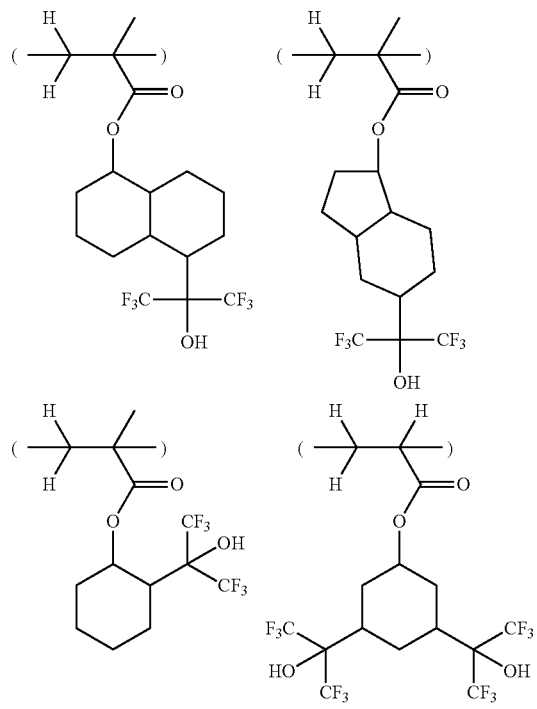

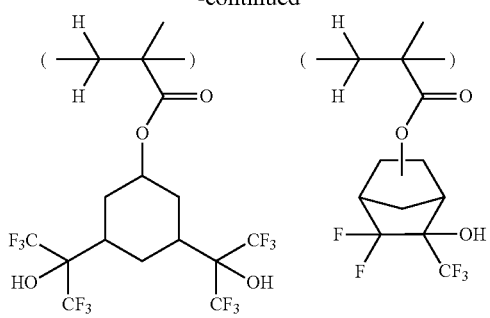
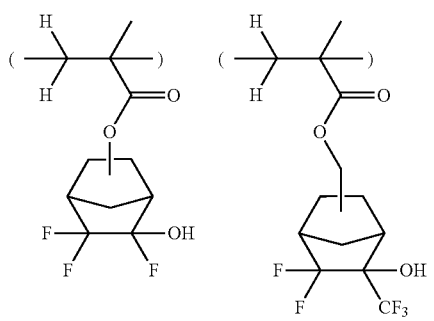
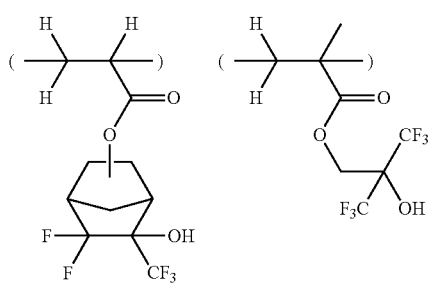
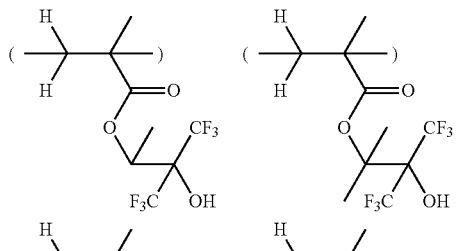
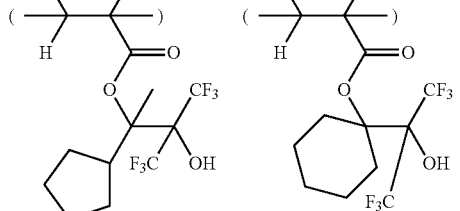
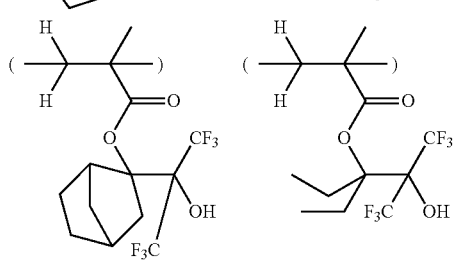
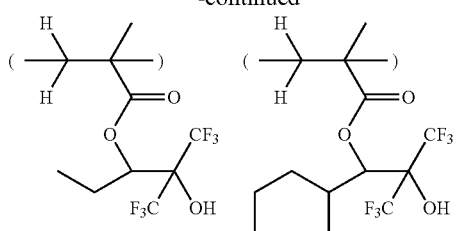
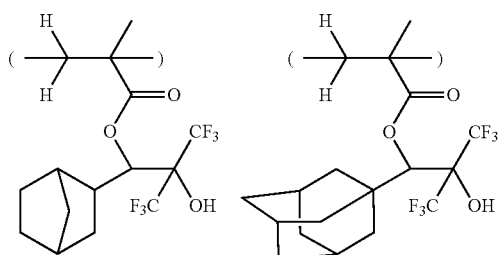
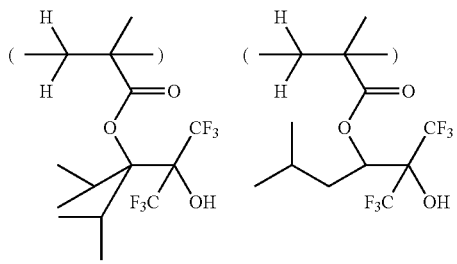
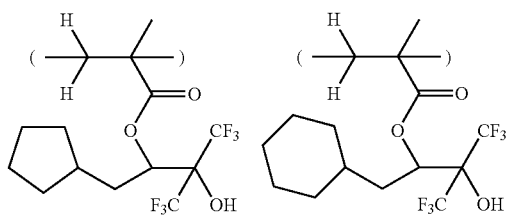
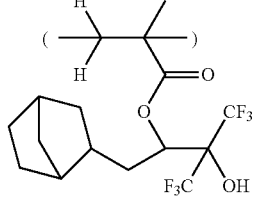
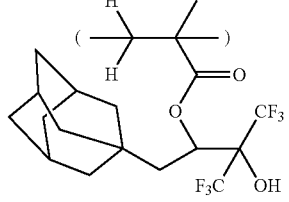
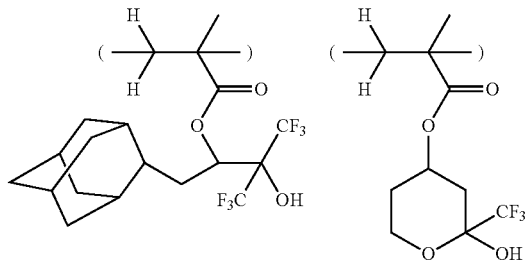

-continued
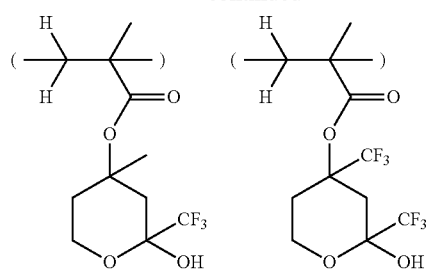
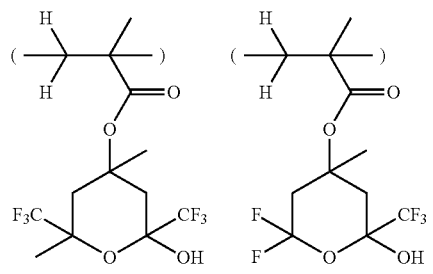
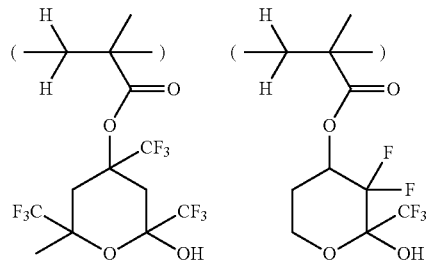
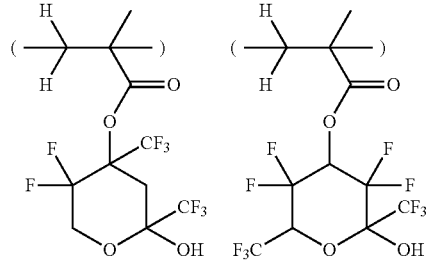
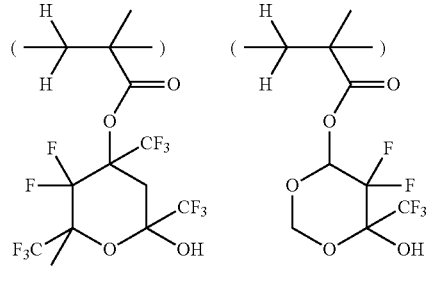
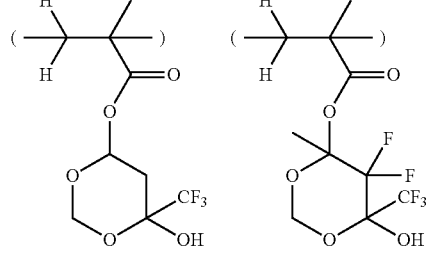
-continued
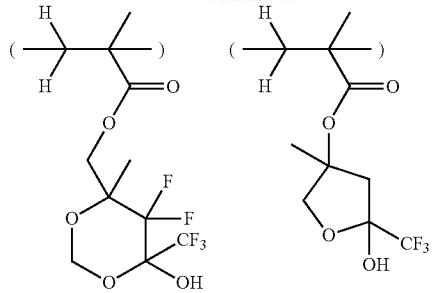
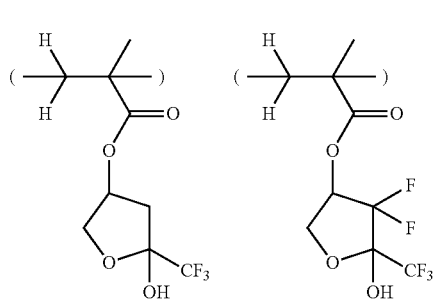
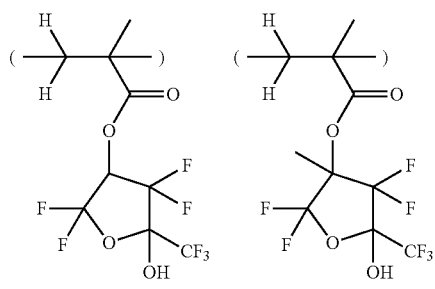
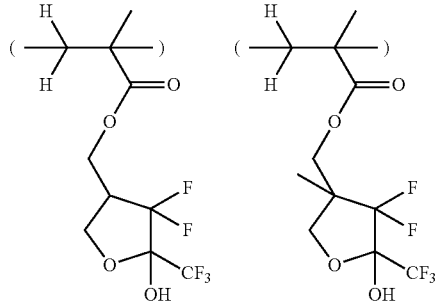
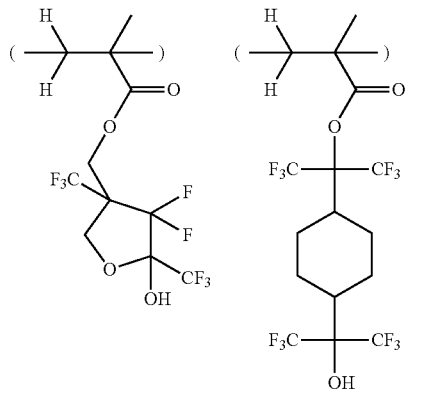

-continued

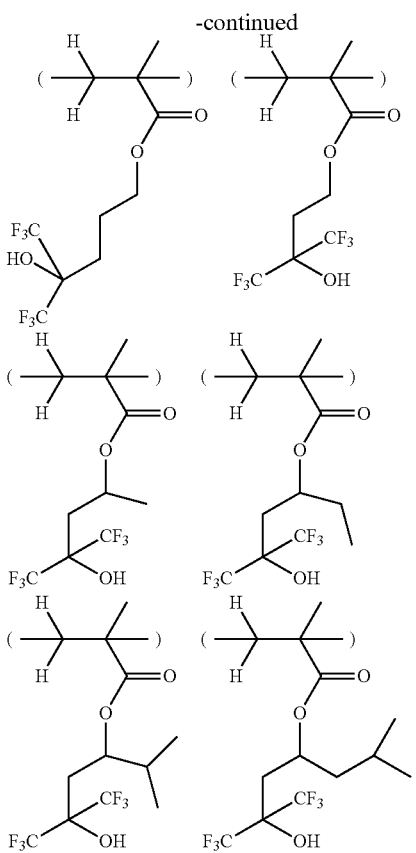

Of the recurring units having formula (5), if used, those units having a lactone ring as the polar group are most preferred.

On use, the recurring units having formula (5) are copolymerized with the recurring units having formula (2a), (3) and the optional recurring units having formulae (3) and (4), although they may be further copolymerized with other recurring units.

Namely, the polymer may further comprise recurring units derived from carbon-to-carbon double bond-bearing monomers other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[6.2.1.1$^{3,6}$.0$^{2,7}$] dodecene derivatives, unsaturated acid anhydrides such as itaconic anhydride, styrene, 4-hydroxystyrene, 4-hydroxystyrene derivatives whose hydroxyl group is protected, and other monomers. Also, hydrogenated products of ring-opening metathesis polymerization (ROMP) polymers as described in JP-A 2003-066612 may be used.

The polymer generally has a weight average molecular weight (Mw) of 1,000 to 500,000, and preferably 3,000 to 100,000, as measured by gel permeation chromatography (GPC) using polystyrene standards. Outside the range, there may result an extreme drop of etch resistance, and a drop of resolution due to difficulty to gain a dissolution rate difference before and after exposure.

The general method of synthesizing the polymer is, for example, by dissolving one or more unsaturated bond-bearing monomers in an organic solvent, adding a radical initiator, and effecting heat polymerization. Reference may be made to many documents including JP-A 2005-264103. JP-A 2010-077404 describes the synthesis of a polymer comprising copolymerized units having a triphenylsulfonium salt-containing compound whose anion is bound to the polymer backbone, which method is similar to the above-mentioned one.

However, if the inventive polymer is synthesized by the above method, elimination of acid labile groups on copolymerizing units of formula (4) can occur under certain temperature and reaction conditions. This is probably because the cation structure of the sulfonium salt is unstable and decomposed in part under such conditions. It is presumed that during polymerization reaction, copolymerizing units of formula (2a) or (2b) are partially decomposed to generate sulfonic acid, by which acid labile groups on copolymerizing units of formula (4) are eliminated, failing to produce the desired polymer.

The method for preparing the inventive polymer can avoid the above problem. According to the invention, the desired polymer is prepared by reacting a polymer comprising recurring units having the general formula (6a) or (6b) with a sulfonium salt having the general formula (7).

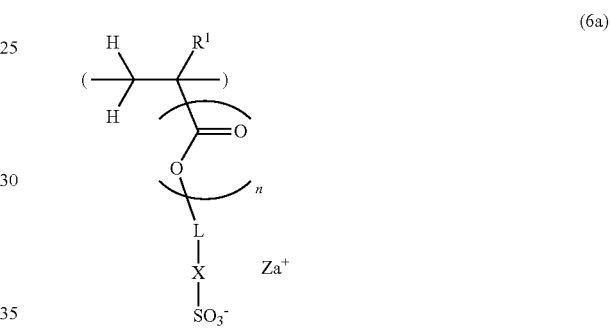

(6a)

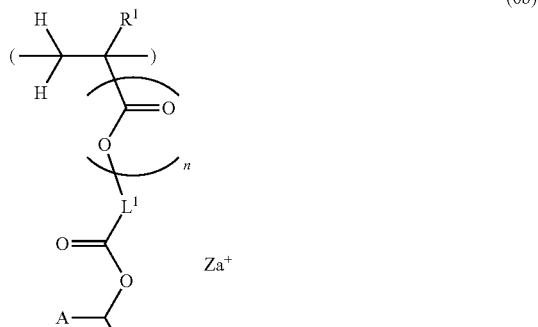

(6b)

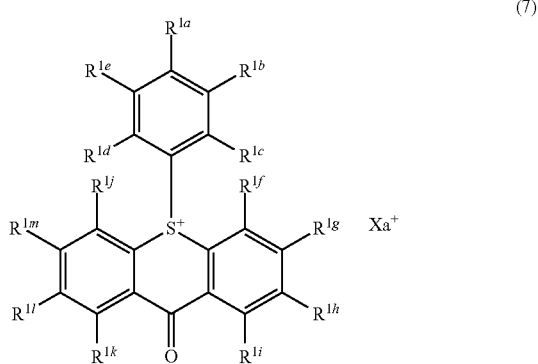

(7)

Herein $R^1$ is hydrogen, fluorine, methyl or trifluoromethyl. $R^{1a}$ to $R^{1m}$ are each independently hydrogen or a $C_1$-$C_{20}$ straight, branched or cyclic, monovalent hydrocarbon group which may be substituted with or separated by a heteroatom. L and $L^1$ each are a single bond or a $C_1$-$C_{20}$ straight, branched or cyclic, divalent hydrocarbon group which may be substituted with or separated by a heteroatom. X is a $C_1$-$C_5$ divalent alkylene group in which some or all hydrogen atoms may be substituted by fluorine atoms. A is hydrogen or trifluoromethyl, and n is 0 or 1. $Za^+$ is a lithium ion, sodium ion, potassium ion, or ammonium cation of the general formula (8):

wherein $R^3$ is each independently hydrogen, a substituted or unsubstituted, $C_1$-$C_{10}$ straight, branched or cyclic alkyl, alkenyl or oxoalkyl group, or substituted or unsubstituted $C_6$-$C_{18}$ aryl, aralkyl or aryloxoalkyl group, or any two or more of $R^3$ may bond together to form a ring with N. $Xa^-$ is an anion.

Since the cation structure is introduced into the sulfonium salt after the polymerization step that can induce decomposition, the inventive method is successful in producing the desired polymer without risks of decomposition of the sulfonium salt and elimination of acid labile groups.

In formulae (6a) and (6b), $R^1$, L, $L^1$, X, A, and n are as defined above. $Za^+$ is a lithium ion, sodium ion, potassium ion, or ammonium cation of the general formula (8). $Xa^-$ is an anion.

In formula (8), $R^3$ is each independently hydrogen, a substituted or unsubstituted, $C_1$-$C_{10}$ straight, branched or cyclic alkyl, alkenyl or oxoalkyl group, or substituted or unsubstituted $C_6$-$C_{18}$ aryl, aralkyl or aryloxoalkyl group, or any two or more of $R^3$ may bond together to form a ring with the nitrogen atom. Suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, 1-naphthyl, 2-naphthyl, thienyl, alkoxyphenyl groups such as 4-hydroxyphenyl, p-methoxyphenyl, m-methoxyphenyl, o-methoxyphenyl, p-ethoxyphenyl, p-tert-butoxyphenyl, and m-tert-butoxyphenyl, alkylphenyl groups such as 2-methylphenyl, 3-methylphenyl, 4-methylphenyl, ethylphenyl, 4-tert-butylphenyl, 4-butylphenyl, and 2,4-dimethylphenyl; alkylnaphthyl groups such as 1-(4-methyl)naphthyl and 2-(6-methyl)naphthyl; and alkoxynaphthyl groups such as 1-(4-methoxy)naphthyl and 2-(6-methoxy)naphthyl. Suitable aralkyl groups include benzyl, 1-phenylethyl and 2-phenylethyl. Suitable aryloxoalkyl groups are 2-aryl-2-oxoethyl groups including 2-phenyl-2-oxoethyl, 2-(1-naphthyl)-2-oxoethyl, and 2-(2-naphthyl)-2-oxoethyl. Also included are substituted forms of the foregoing groups in which one or more hydrogen atoms are substituted by a heteroatom or atoms such as oxygen, sulfur, nitrogen, and halogen. As a result of substitution, a hydroxyl, cyano, carbonyl, ether bond, ester bond, sulfonic acid ester bond, carbonate bond, lactone ring, sultone ring, carboxylic anhydride or haloalkyl group may form.

Where two or more of $R^3$ bond together to form a cyclic structure with the nitrogen atom, suitable structures include piperidine, morpholine, pyridine, quinoline, acridine, imidazole, and benzimidazole, in which the nitrogen atom may be protonated or alkylated.

Examples of the ammonium cation of formula (8) include ammonium, trimethylammonium, tetramethylammonium, triethylammonium, tributylammonium, tetrabutylammonium, trioctylammonium, anilinium, 2,6-dimethylanilinium, N,N-dimethylanilinium, benzyltrimethylammonium, bezyltriethylammonium, benzyltripropylammonium, N-benzyl-N,N-dimethylanilinium, and N-(p-methoxy)benzyl-N,N-dimethylanilinium. Inter alia, trimethlammonium, tetramethylammonium, triethylammonium, anilinium, and benzyltrimethylammonium are preferred.

In formula (7), $R^{1a}$ to $R^{1m}$ are as exemplified above. $Xa^-$ is an anion, which may be a conjugate base of a mineral acid or organic acid. Preferred are conjugate bases of methylsulfuric acid, methanesulfonic acid, paratoluenesulfonic acid, and trifluoromethanesulfonic acid, as well as $I^-$, $Br^-$, $Cl^-$, $BF_4^-$, and $ClO_4^-$.

For the synthesis of the polymer comprising recurring units having formula (6a) or (6b), the standard radical polymerization method may be applied as alluded to above. Also, the monomer corresponding to the recurring unit having formula (6a) or (6b) may be synthesized by referring to the synthesis method described in JP-A 2007-304490, for example. The sulfonium salt having formula (7) may be synthesized by referring to the synthesis method described in J. Org. Chem., 1978, 43, 3055-3058, for example.

Described below is the final step of the polymer preparation method. Once the polymer comprising recurring units having formula (6a) or (6b) is synthesized, it is mixed with the sulfonium salt having formula (7) in water and an organic solvent separable from water. From the mixture, the organic layer is taken out. The organic layer thus separated is washed with water, if desired. Finally, the desired polymer is recovered from the organic layer by such operation as concentration or crystallization. The organic solvent used herein is not particularly limited as long as it can be separated from water and the polymer can be dissolved therein. Inter alia, ketone solvents such as methyl ethyl ketone and methyl isobutyl ketone and halogenated solvents such as dichloromethane and chloroform are preferred.

Alternatively, the polymer comprising recurring units having formula (6a) or (6b) and the alkylsulfonium salt having formula (7) are dissolved in an organic solvent whereupon the desired polymer may be recovered by crystallization using water and organic solvents. Typically an alcohol is used as the good solvent and water is used as the poor solvent. The aforementioned exchange reactions are merely exemplary, and the method of preparing the inventive polymer is not limited thereto.

The method of preparing the inventive polymer is quite advantageous in that the desired polymer can be produced without any risk of decomposition, because a sulfonium cation is introduced under mild conditions without a need for heating, nucleophilic compound or radical initiator.

While the polymer comprises recurring units derived from monomers, the molar fractions of respective units preferably fall in the following range (mol %), but are not limited thereto, (I) 0.2 to 100 mol %, more preferably 0.5 to 50 mol %, and even more preferably 0.5 to 30 mol % of recurring units having formula (2a) or (2b), (II) 0 to 50 mol %, more preferably 5 to 45 mol %, and even more preferably 10 to 40 mol % of constituent units of at least one type having formula (3), (III) 0 to 50 mol %, more preferably 5 to 45 mol %, and even more preferably 10 to 40 mol % of constituent units of at least one type having formula (4),
(IV) 0 to 50 mol %, more preferably 5 to 45 mol %, and even more preferably 10 to 40 mol % of constituent units of at least one type having formula (5), and optionally,
(V) 0 to 99.8 mol %, more preferably 0 to 70 mol %, and even more preferably 0 to 50 mol % of constituent units of at least one type derived from another monomer(s).

The polymer is not limited to one type and a mixture of two or more polymers may be added. The use of plural polymers allows for easy adjustment of resist properties.

Resist Composition

A further embodiment of the invention is a resist composition comprising (A) a polymer comprising recurring units having formula (2a) or (2b) as essential component. The resist composition may further comprise (B) a photoacid generator capable of generating an acid upon exposure, (C) a quencher, and (D) an organic solvent. Optionally, the resist composition may further comprise (E) a surfactant which is insoluble or substantially insoluble in water and soluble in alkaline developer, and/or a surfactant which is insoluble or substantially insoluble in water and alkaline developer (hydrophobic resin), and (F) an organic acid derivative and/or fluorinated alcohol.

(B) Photoacid Generator

The PAG used herein may be any compound capable of generating an acid upon exposure to high-energy radiation including UV, DUV, EB, EUV, x-ray, excimer laser, γ-ray, and synchrotron radiation. Suitable PAGs include sulfonium salts, iodonium salts, sulfonyldiazomethane, N-sulfonyloxydicarboxyimide, O-arylsulfonyloxime, and O-alkylsulfonyloxime generators. The acid generators may be used alone or in admixture of two or more.

Sulfonium salts are salts of sulfonium cations with sulfonates, bis(substituted alkylsulfonyl)imides and tris(substituted alkylsulfonyl)methides. Suitable sulfonium cations include those cations having the general formula (9).

$$S^+(R^{33}R^{44}R^{55}) \quad (9)$$

Herein $R^{33}$, $R^{44}$ and $R^{55}$ are each independently a substituted or unsubstituted, straight, branched or cyclic $C_1$-$C_{10}$ alkyl, alkenyl or oxoalkyl group or a substituted or unsubstituted $C_6$-$C_{18}$ aryl, aralkyl or aryloxoalkyl group, or any two of $R^{33}$, $R^{44}$ and $R^{55}$ may bond together to form a ring with the sulfur atom in the formula.

Of the groups represented by $R^{33}$, $R^{44}$ and $R^{55}$, suitable alkyl groups include methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl and thienyl, hydroxyphenyl groups such as 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups are 2-aryl-2-oxoethyl groups including 2-phenyl-2-oxoethyl, 2-(1-naphthyl)-2-oxoethyl, and 2-(2-naphthyl)-2-oxoethyl. In these hydrocarbon groups, one or more hydrogen atoms may be substituted by fluorine or hydroxyl.

Alternatively, any two of $R^{33}$, $R^{44}$ and $R^{55}$ bond together to form a ring with the sulfur atom in the formula. Exemplary ring structures are given below.

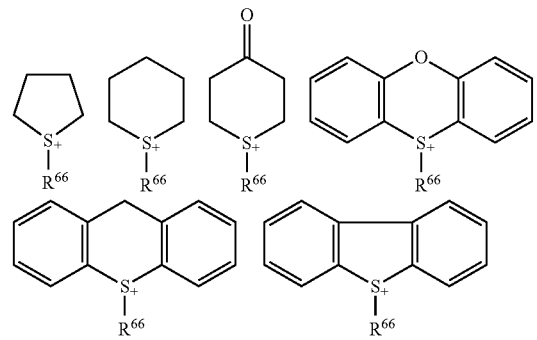

Herein $R^{66}$ is as defined and illustrated for $R^{33}$, $R^{44}$ and $R^{55}$.

As the anion of the sulfonium salt, exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoro-methanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Examples of the iodonium salt, N-sulfonyloxydicarboxyimide, O-arylsulfonyloxime, and O-alkylsulfonyloxime (or oximesulfonate) acid generators are described in JP-A 2009-269953 (U.S. Pat. No. 8,114,571).

Preferred examples of the other PAG include triphenylsulfonium nonafluorobutanesulfonate, triphenylsulfonium bis(trifluoromethylsulfonyl)imide, triphenylsulfonium perfluoro(1,3-propylenebissulfonyl)imide, triphenylsulfonium tris(trifluoromethanesulfonyl)methide, N-nonafluorobutanesulfonyloxy-1,8-naphthalenedicarboxyimide, 2-(2,2,3,3,4,4-hexafluoro-1-(nonafluorobutylsulfonyloxy-imino)butyl)fluorene, and 2-(2,2,3,3,4,4,5,5-octafluoro-1-(nonafluorobutylsulfonyloxy-imino)pentyl)fluorene.

The preferred structure of PAG includes compounds having the general formula (P1).

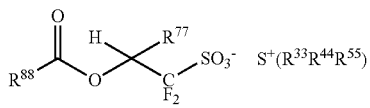

(P1)

Herein $R^{77}$ is hydrogen or trifluoromethyl, $R^{88}$ is a $C_1$-$C_{30}$ alkyl, alkenyl or aralkyl group which may contain a heteroatom, $R^{33}$, $R^{44}$ and $R^{55}$ are as defined above.

In formula (P1), $R^{88}$ is a $C_1$-$C_{30}$ alkyl, alkenyl or aralkyl group optionally containing a heteroatom. Suitable heteroatoms contained in $R^{88}$ include oxygen, nitrogen, sulfur and halogen atoms, with oxygen being preferred. The $C_1$-$C_{30}$ alkyl, alkenyl or aralkyl group of $R^{88}$ may be straight, branched or cyclic while it is preferred for achieving a high resolution sufficient to form a fine size pattern that these groups have 6 to 30 carbon atoms. It is undesirable that $R^{88}$ be aryl because the resulting resist pattern may have less smooth sidewalls. Exemplary groups of $R^{88}$ include, but are not limited to, methyl, ethyl, propyl, isopropyl, butyl, isobutyl, s-butyl, tert-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having formula (P1), reference may be made to JP-A 2007-145797, 2008-106045, 2009-007327, and 2009-258695, for example.

Illustrative examples of the preferred PAG are given below.

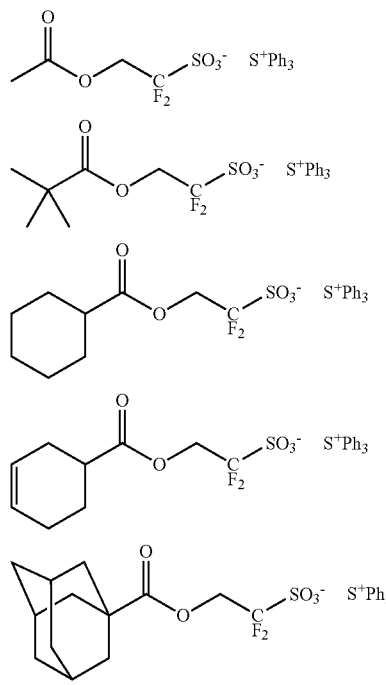

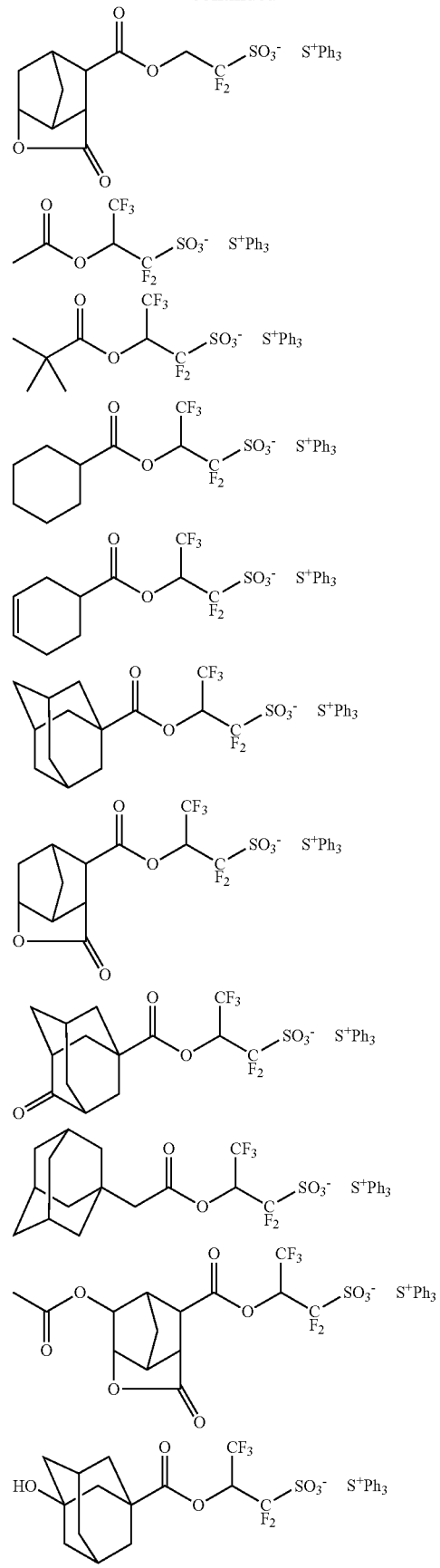

81
-continued
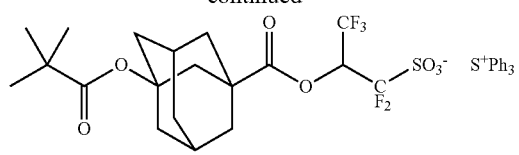
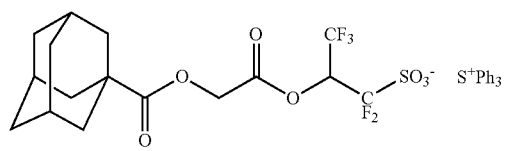
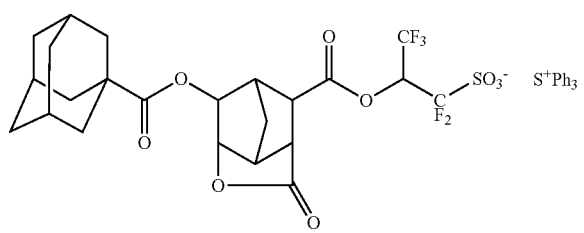
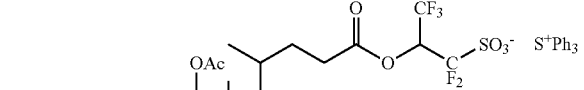
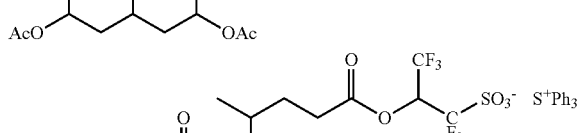
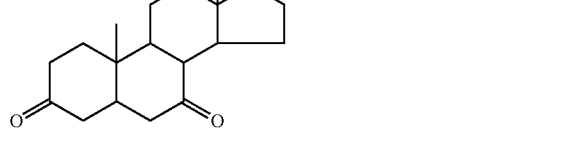
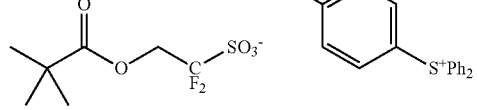
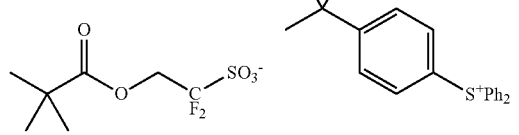
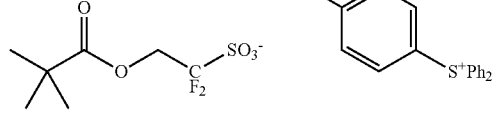
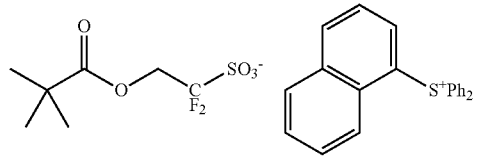
82
-continued
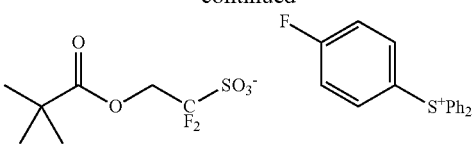
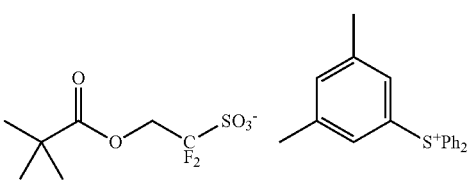
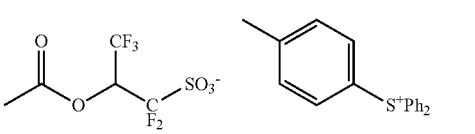
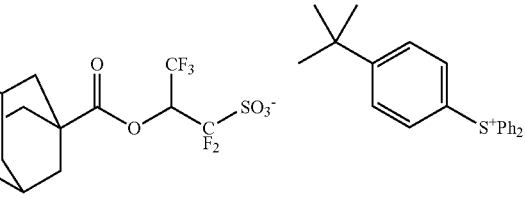
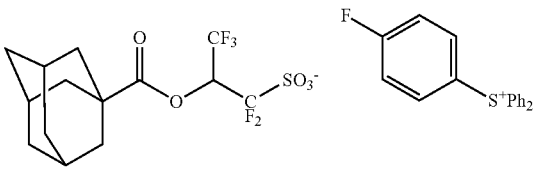
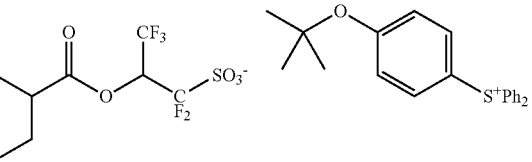
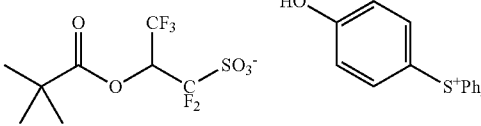
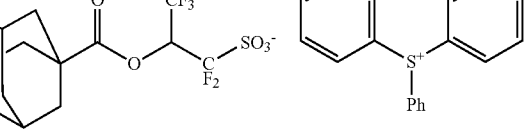
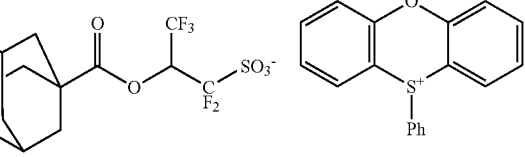
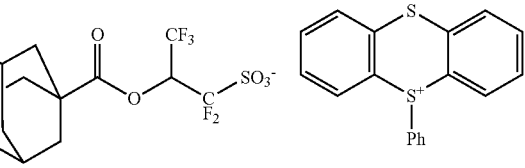

-continued

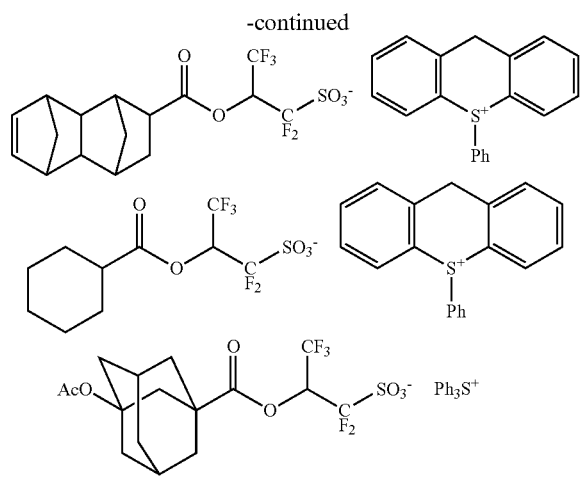

Herein Ac stands for acetyl and Ph stands for phenyl.

An appropriate amount of the PAG having formula (P1) added is 0 to 40 parts by weight, and if added, 0.1 to 40 parts, and more preferably 0.1 to 20 parts by weight per 100 parts by weight of the polymer as base resin. Too high a proportion of the PAG may give rise to problems such as degraded resolution and foreign particles after resist development or during resist film stripping. The PAG having formula (P1) may be used alone or in admixture of two or more or in admixture with another PAG. When the other PAG is added, its amount is arbitrary as long as the objects of the invention are not compromised. Typically the amount of the other PAG is 0 to 20 parts, preferably 0.1 to 10 parts by weight per 100 parts by weight of the polymer.

Notably, the resist composition comprises as base resin (A) a polymer comprising recurring units of sulfonium salt having formula (2a) or (2b), which functions as PAG. Therefore, it is unnecessary to add PAG (B) although it is acceptable to use one or more PAGs (B) in combination with base resin (A).

It is noted that an acid diffusion controlling function may be provided when two or more PAGs are used in admixture provided that one PAG is an onium salt capable of generating a weak acid. Specifically, in a system using a mixture of an onium salt capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the PAG capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

(C) Quencher

The quencher (C) may be a compound capable of suppressing the rate of diffusion when the acid generated by the PAG diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Of these, preferred are tertiary amines, amine oxides, benzimidazoles, and anilines having a polar functional group such as ether, carbonyl, ester or alcohol.

Preferred tertiary amines include 2-morpholinoethyl esters of straight, branched or cyclic $C_2$-$C_{20}$ aliphatic carboxylic acids and trialkylamines having a straight, branched or cyclic $C_2$-$C_{10}$ alkyl moiety. Also included are substituted forms of these amines in which some carbon-bonded hydrogen atoms are replaced by hydroxyl groups. These amines may have an ether or ester linkage. Examples include 2-morpholinoethyl 2-methoxyacetate, 2-morpholinoethyl 2-(2-methoxyethoxy) acetate, 2-morpholinoethyl 2-[2-(2-methoxyethoxy)ethoxy] acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, 2-morpholinoethyl adamantanecarboxylate, 4-[2-[(2-methoxyethoxy)methoxy]ethyl]morpholine, 4-[2-[2-(2-methoxyethoxy)ethoxy]ethyl]morpholine, 4-[2-[2-(2-butoxyethoxy)ethoxy]ethyl]morpholine, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, and tris(2-pivaloyloxyethyl)amine.

Preferred examples of the benzimidazoles include benzimidazole, 2-phenylbenzimidazole, 1-(2-acetoxyethoxy)benzimidazole, 1-[2-(methoxymethoxy)ethyl]benzimidazole, 1-[2-(methoxymethoxy)ethyl]-2-phenylbenzimidazole, and 1-(2-(2-(2-methoxyethoxy)ethoxy)ethyl)benzimidazole.

Preferred examples of the anilines include aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine.

Also included are primary and secondary amines which have been protected with tert-butoxycarbonyl (tBOC). Those compounds described in JP-A 2007-298569 and JP-A 2010-020204 are also useful.

The quenchers may be used alone or in admixture of two or more. The quencher is preferably used in an amount of 0.001 to 8 parts, more preferably 0.01 to 4 parts by weight per 100 parts by weight of the base resin. Less than 0.001 part of the quencher may achieve no addition effect whereas more than 8 parts may lead to too low a sensitivity.

(D) Organic Solvent

The organic solvent (D) used herein may be any organic solvent in which the polymer (or base resin), PAG, quencher, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in combinations of two or more. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 5,000 parts, more preferably 400 to 3,000 parts by weight per 100 parts by weight of the base resin.

(E) Surfactant

Component (E) is a surfactant which is insoluble or substantially insoluble in water and soluble in alkaline developer, and/or a surfactant which is insoluble or substantially insoluble in water and alkaline developer (hydrophobic resin). The surfactant (E) may be added to the resist composition. Reference should be made to those compounds defined as component (S) in JP-A 2010-215608 and JP-A 2011-016746.

While many examples of the surfactant which is insoluble or substantially insoluble in water and alkaline developer are described in these patent documents, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

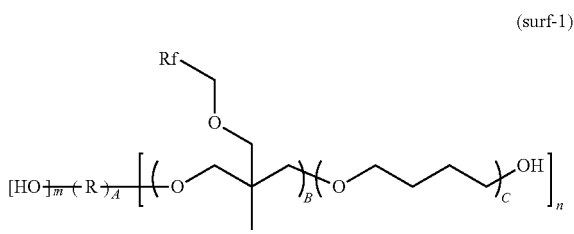

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

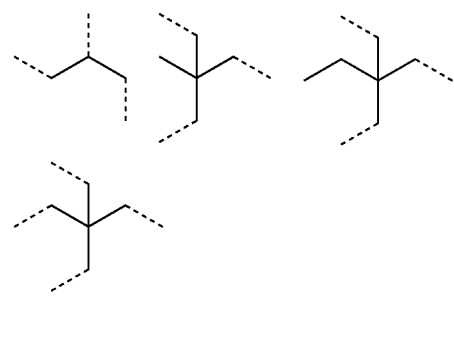

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage. Suitable polymeric surfactants are shown below.

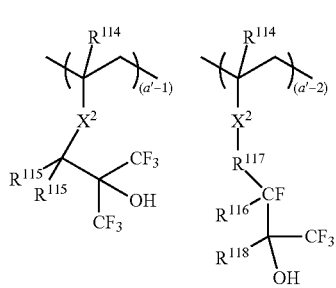

-continued

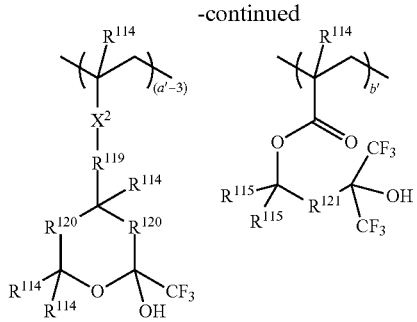

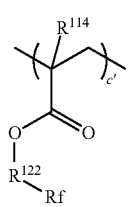

Examples of these units are shown below.

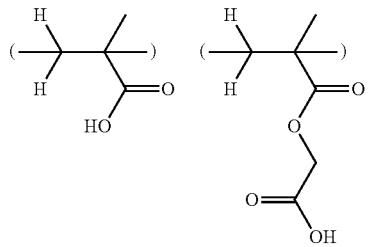

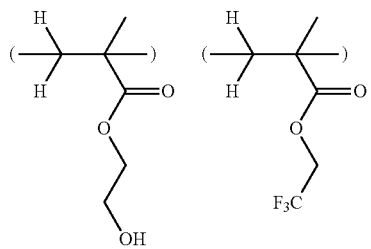

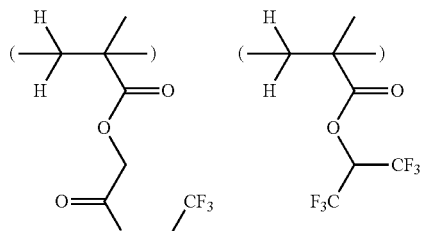

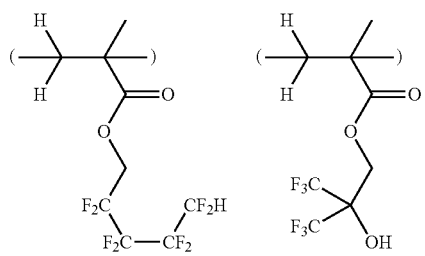

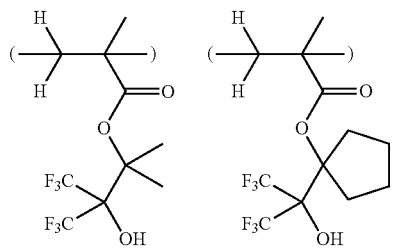

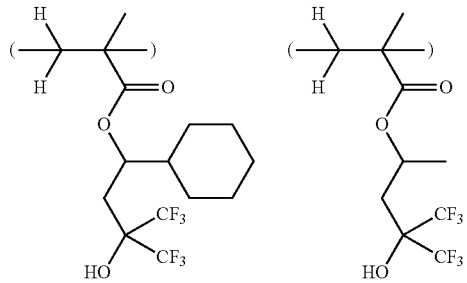

Herein $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or two $R^{115}$ in a common monomer may bond together to form a ring with the carbon atom to which they are attached, and in this event, they together represent a straight, branched or cyclic $C_2$-$C_{20}$ alkylene or fluoroalkylene group. $R^{116}$ is fluorine or hydrogen, or $R^{116}$ may bond with $R^{117}$ to form a non-aromatic ring of 3 to 10 carbon atoms in total with the carbon atom to which they are attached. $R^{117}$ is a straight, branched or cyclic $C_1$-$C_6$ alkylene group in which at least one hydrogen atom may be substituted by a fluorine atom. $R^{118}$ is a straight or branched $C_1$-$C_{10}$ alkyl group in which at least one hydrogen atom is substituted by a fluorine atom. Alternatively, $R^{117}$ and $R^{118}$ may bond together to form a non-aromatic ring with the carbon atoms to which they are attached. In this event, $R^{117}$, $R^{118}$ and the carbon atoms to which they are attached together represent a trivalent organic group of 2 to 12 carbon atoms in total. $R^{119}$ is a single bond or a $C_1$-$C_4$ alkylene. $R^{120}$ is each independently a single bond, —O—, or —$CR^{114}R^{114}$—. $R^{121}$ is a straight or branched $C_1$-$C_4$ alkylene group, or may bond with $R^{115}$ within a common monomer to form a $C_3$-$C_6$ non-aromatic ring with the carbon atom to which they are attached. $R^{122}$ is 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. $X^2$ is each independently —C(C=O)—O—, —O—, or —C(C=O)—$R^{123}$—C(C=O)—O—. $R^{123}$ is a straight, branched or cyclic $C_1$-$C_{10}$ alkylene group. The subscripts are in the range:
$0 \leq (a'-1) < 1$, $0 \leq (a'-2) < 1$, $0 \leq (a'-3) < 1$,
$0 < (a'-1)+(a'-2)+(a'-3) < 1$, $0 \leq b' < 1$, $0 \leq c' < 1$, and
$0 < (a'-1)+(a'-2)+(a'-3)+b'+c' \leq 1$.

89
-continued
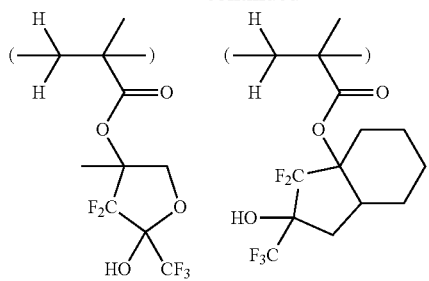
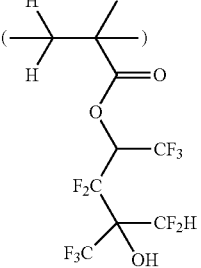
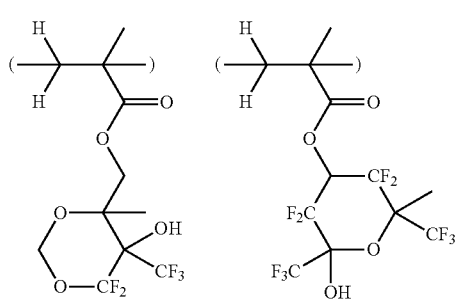
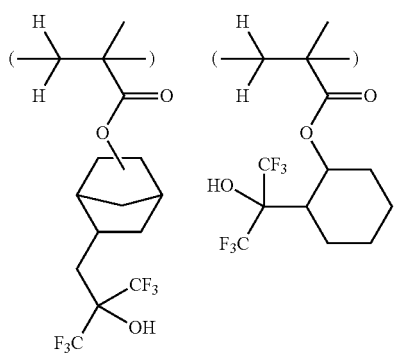
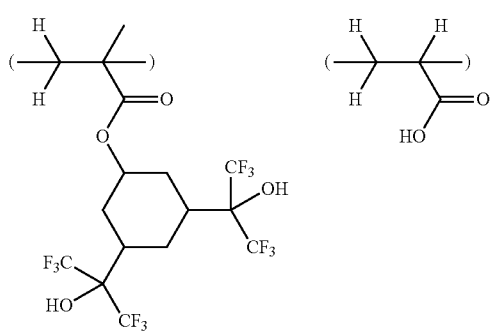
90
-continued
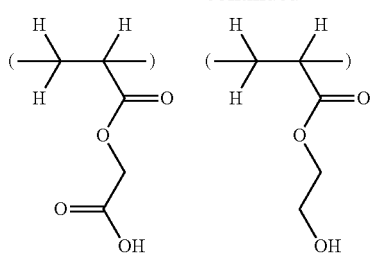
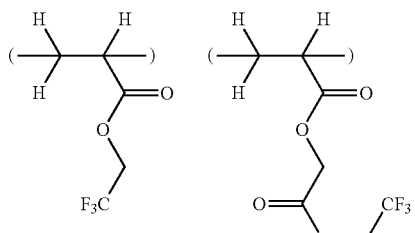
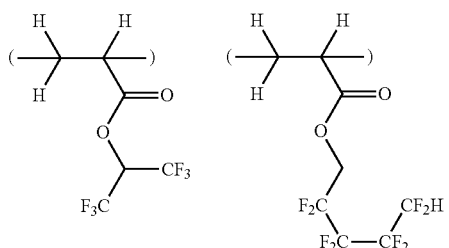
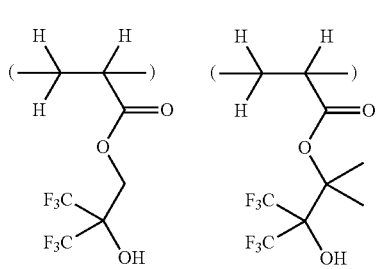
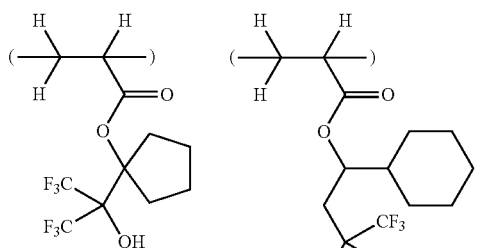
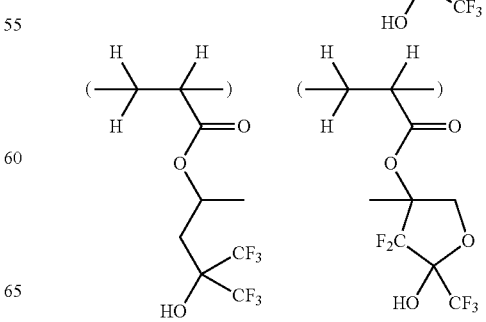

-continued

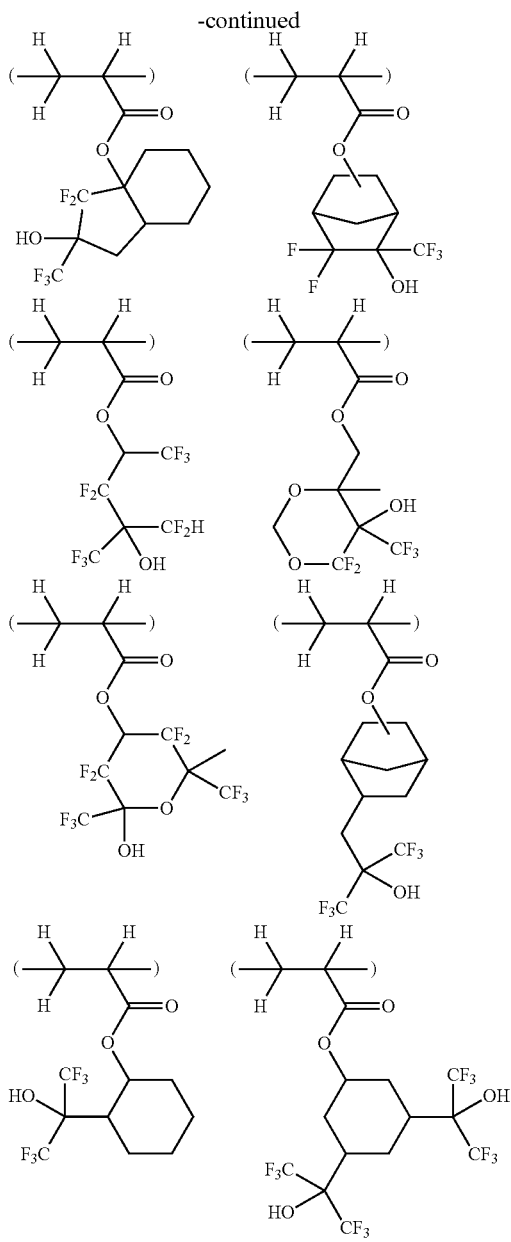

For the surfactant which is insoluble or substantially insoluble in water and soluble in alkaline developer, reference may be made to JP-A 2008-122932, 2010-134012, 2010-107695, 2009-276363, 2009-192784, 2009-191151, 2009-98638, 2011-250105, and 2011-42789.

There may also be added styrene and vinylnaphthalene copolymers as described in JP 4900603 and JP-A 2008-203452. These polymers tend to segregate at the resist film surface after spin coating and are thus effective for reducing outgassing components from within the resist film during the exposure step. They are thus advantageous in the EUV lithography where outgassing suppression is requisite.

The polymeric surfactant preferably has a Mw of 1,000 to 50,000, more preferably 2,000 to 20,000 as measured by GPC versus polystyrene standards. A surfactant with a Mw outside the range may be less effective for surface modification and cause development defects. The polymeric surfactant is preferably formulated in an amount of 0.001 to 20 parts, and more preferably 0.01 to 10 parts by weight per 100 parts by weight of the base resin. Reference should also be made to JP-A 2010-215608.

(F) Organic Acid Derivative and/or Fluorinated Alcohol

To the resist composition, a compound which is decomposed with an acid to generate another acid, that is, acid amplifier compound may be added. For these compounds, reference should be made to JP-A 2009-269953 and 2010-215608. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Optionally, an organic acid derivative or a compound having a Mw of up to 3,000 which changes its solubility in alkaline developer under the action of an acid, also referred to as dissolution inhibitor, may be added. Reference may be made to JP-A 2009-269953 and 2010-215608.

Patterning Process

A further embodiment of the invention is a pattern forming process using the resist composition defined above. A pattern may be formed from the resist composition using any well-known lithography process. The preferred process includes at least the steps of forming a resist film on a substrate, exposing it to high-energy radiation, and developing it in a developer.

First the resist composition is applied onto a substrate for integrated circuitry fabrication (e.g., Si, $SiO_2$, SiN, SiON, TiN, WSi, BPSG, SOG, organic antireflective film, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 10 minutes, preferably 80 to 140° C. for 1 to 5 minutes. The resulting resist film is generally 0.05 to 2.0 μm thick. Through a photomask having a desired pattern disposed over the substrate, the resist film is then exposed to high-energy radiation such as deep-UV, excimer laser or x-ray, or electron beam in an exposure dose preferably in the range of 1 to 200 $mJ/cm^2$, more preferably 10 to 100 $mJ/cm^2$. Alternatively, pattern formation may be performed by writing with an electron beam directly (not through a mask). Light exposure may be done by a conventional lithography process or in some cases, by an immersion lithography process of providing liquid impregnation, typically water, between the projection lens or mask and the resist film. In the case of immersion lithography, a protective film which is insoluble in water may be used. The resist film is then baked (PEB) on a hot plate at 60 to 150° C. for 1 to 5 minutes, and preferably at 80 to 140° C. for 1 to 3 minutes. Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate. Of the various types of high-energy radiation that may be used, the resist composition of the invention is best suited to fine pattern formation with, in particular, deep-UV or excimer laser having a wavelength of 250 to 190 nm, x-ray, or EB. The desired pattern may not be obtainable outside the upper and lower limits of the above range.

While the water-insoluble protective film which is used in the immersion lithography serves to prevent any components from being leached out of the resist film and to improve water slippage at the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution, typically an aqueous solution of 0.1 to 5 wt %, more typically 2 to 3 wt % of tetramethylammonium hydroxide (TMAH) is often used as the developer. The negative tone development technique wherein the unexposed region is developed and dissolved in an organic solvent is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples and Comparative Examples are given below by way of illustration and not by way of limitation. Mw is weight average molecular weight and Mw/Mn is dispersity. All parts are by weight (pbw).

Synthesis Example 1-1

Synthesis of 9-oxo-10-phenyl-9H-thioxanthenium trifluoromethanesulfonate (PAG-1)

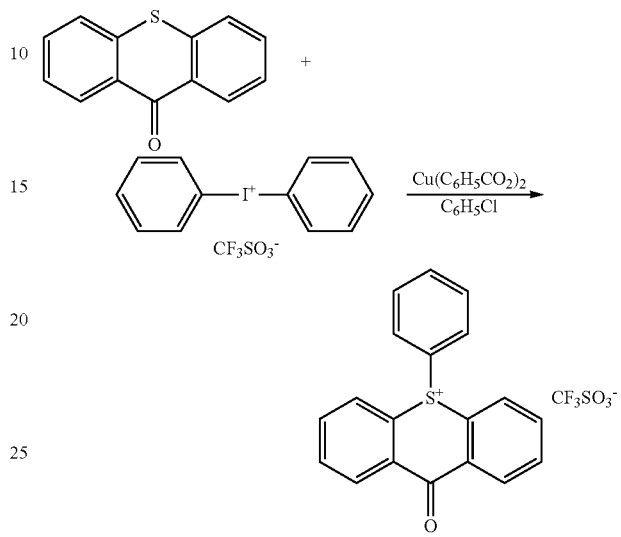

A mixture of 1.1 g (5 mmol) of thioxanthone, 2.2 g (5 mmol) of diphenyliodonium trifluoromethanesulfonate, 46 mg (0.15 mmol) of copper(II) benzoate, and 11 g of chlorobenzene was heated and stirred at 120° C. for 3 hours. At the end of stirring, the reaction solution was cooled to room temperature, and 20 g of diisopropyl ether was added for recrystallization. The resulting solid was dried in vacuum, obtaining 1.4 g (yield 65%) of the desired compound, 9-oxo-10-phenyl-9H-thioxanthenium trifluoromethanesulfonate.

Time-of-flight Mass Spectrometry (TOFMS; MALDI)
Positive $M^+$ 289 (corresponding to $(C_6H_5)(C_{13}H_8O)S^+$)
Negative $M^-$ 149 (corresponding to $CF_3SO_3^-$)

Synthesis Example 1-2

Synthesis of triethylammonium 1,1,3,3,3-pentafluoro-2-hydroxypropane-1-sulfonate

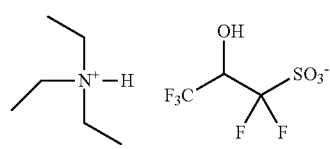

According to the method described in JP-A 2007-304490, triethylammonium 1,1,3,3,3-pentafluoro-2-(pivaloyloxy)- propane-1-sulfonate was synthesized. According to the method described in JP-A 2007-145804, the pivaloyl group was subjected to hydrolysis (solvolysis), obtaining triethylammonium 1,1,3,3,3-pentafluoro-2-hydroxypropane-1-sulfonate as while crystal.

Synthesis Example 1-3

Synthesis of triethylammonium 1,1,3,3,3-pentafluoro-2-methacryloyloxypropane-1-sulfonate

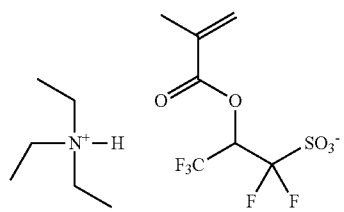

Under ice cooling, 28 g (0.18 mol) of methacrylic anhydride was added dropwise to a mixture of 79 g (0.16 mol) of triethylammonium 1,1,3,3,3-pentafluoro-2-hydroxypropane-1-sulfonate in Synthesis Example 1-2, 19 g (0.19 mol) of triethylamine, 0.10 g (0.8 mmol) of N,N'-dimethylaminopyridine, and 400 g of methylene chloride. Thereafter, the mixture was stirred overnight at room temperature. Dilute hydrochloric acid was added to the reaction mixture to quench the reaction, from which the organic layer was taken out and washed with water. After washing, the organic layer was concentrated, combined with methyl isobutyl ketone, and concentrated again. The residue was washed with diisopropyl ether, obtaining 45 g (yield 70%) of the desired compound, triethylammonium 1,1,3,3,3-pentafluoro-2-methacryloyloxypropane-1-sulfonate.

Synthesis Example 1-4

Synthesis of benzyltrimethylammonium 1,1,3,3,3-pentafluoro-2-hydroxypropane-1-sulfonate

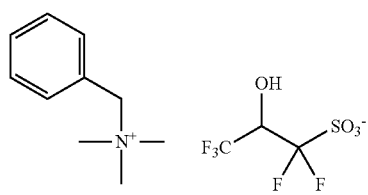

According to the method described in JP-A 2007-304490, benzyltrimethylammonium 1,1,3,3,3-pentafluoro-2-(pivaloyloxy)-propane-1-sulfonate was synthesized. According to the method described in JP-A 2007-145804, the pivaloyl group was subjected to hydrolysis (solvolysis), obtaining benzyltrimethylammonium 1,1,3,3,3-pentafluoro-2-hydroxypropane-1-sulfonate as while crystal.

Synthesis Example 1-5

Synthesis of benzyltrimethylammonium 1,1,3,3,3-pentafluoro-2-methacryloyloxypropane-1-sulfonate

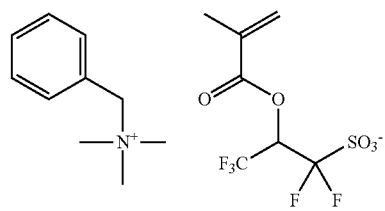

According to the method described in JP-A 2008-133448, benzyltrimethylammonium 1,1,3,3,3-pentafluoro-2-hydroxy-propane-1-sulfonate obtained in Synthesis Example 1-4 was converted to benzyltrimethylammonium 1,1,3,3,3-pentafluoro-2-methacryloyloxypropane-1-sulfonate.

Synthesis Example 1-6

Synthesis of benzyltrimethylammonium 1,1,3,3,3-pentafluoro-2-(3-methacryloyloxy-adamantane-1-carboxyloxy)propane-1-sulfonate

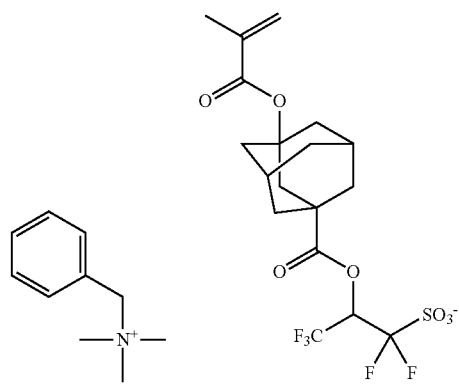

According to the method described in JP-A 2010-077404, benzyltrimethylammonium 1,1,3,3,3-pentafluoro-2-hydroxy-propane-1-sulfonate obtained in Synthesis Example 1-4 was converted to benzyltrimethylammonium 1,1,3,3,3-pentafluoro-2-(3-methacryloyloxy-adamantane-1-carboxyloxy)propane-1-sulfonate.

Synthesis Example 1-7

Synthesis of 9-oxo-10-phenyl-9H-thioxanthenium 2-methacryloyloxy-1,1,3,3,3-pentafluoropropane-1-sulfonate (PAG-2)

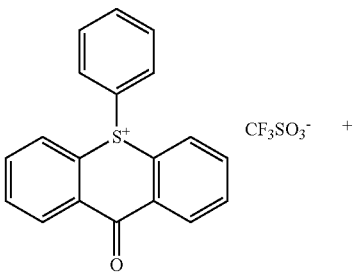

-continued

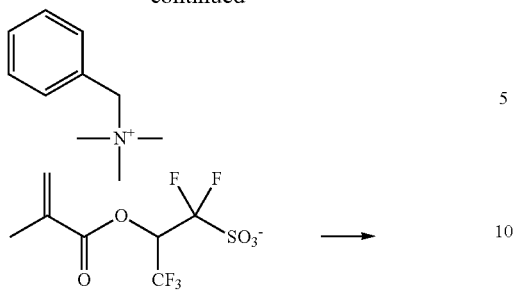

Synthesis Example 1-8

Synthesis of 9-oxo-10-phenyl-9H-thioxanthenium 1,1,3,3,3-pentafluoro-2-(3-methacryloyloxy-adamantane-1-carbonyloxy)-propane-1-sulfonate (PAG-3)

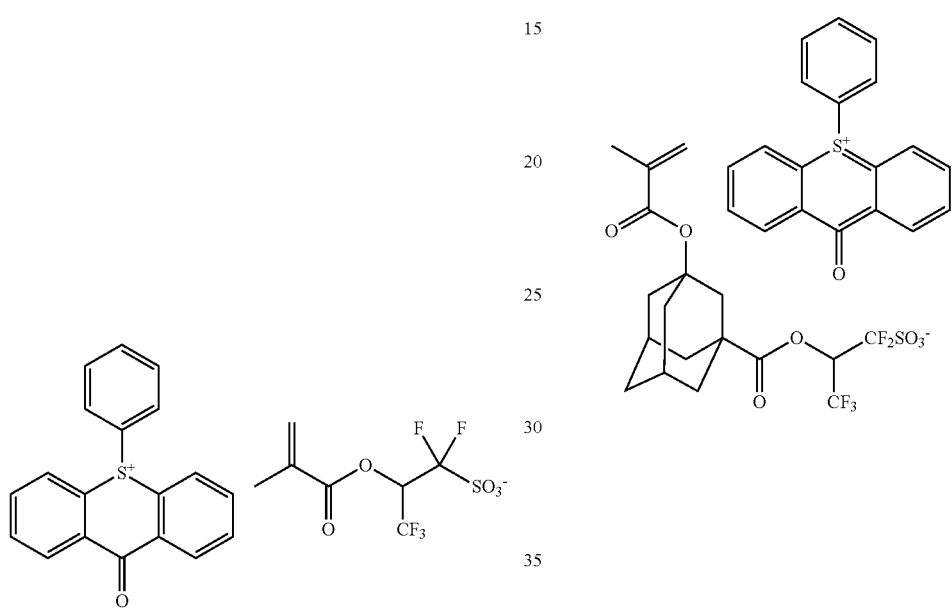

A mixture of 1.3 g (3 mmol) of 9-oxo-10-phenyl-9H-thioxanthenium trifluoromethanesulfonate obtained in Synthesis Example 1-1, 1.3 g (3 mmol) of benzyltrimethyl-ammonium 1,1,3,3,3-pentafluoro-2-methacryloyloxypropane-1-sulfonate obtained in Synthesis Example 1-5, 20 g of methyl isobutyl ketone, and 20 g of water was stirred at room temperature for 30 minutes. The organic layer was extracted out and washed with water. After washing, the organic layer was concentrated. Diisopropyl ether, 10 g, was added to the residue for recrystallization. Subsequent filtration and vacuum drying gave 1.4 g (yield 80%) of the target compound, 9-oxo-10-phenyl-9H-thioxanthenium 2-methacryloyloxy-1,1,3,3,3-pentafluoropropane-1-sulfonate.

Figure 2:
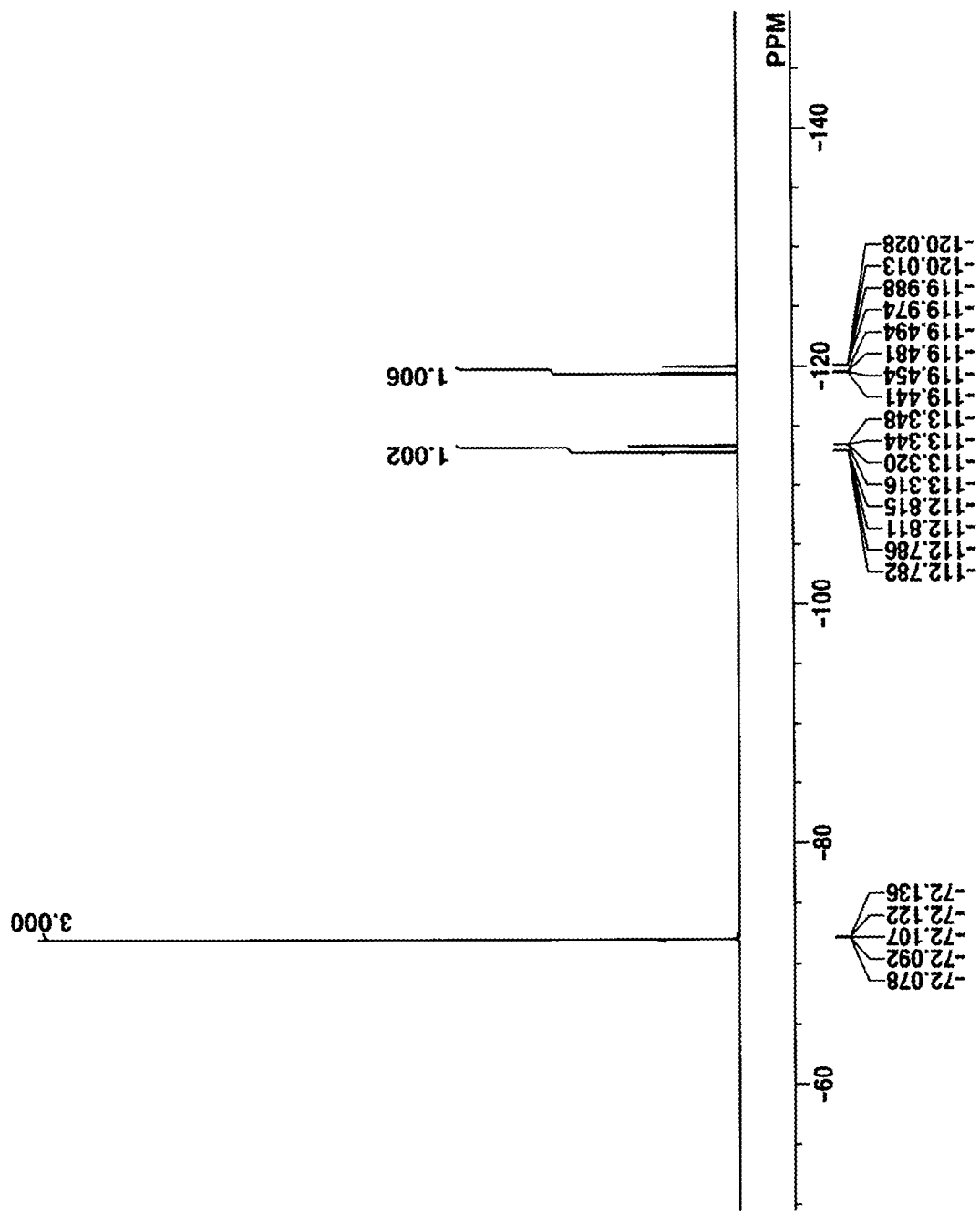
FIG. 2 is a diagram showing $^{19}$F-NMR spectroscopy of PAG-2 in Synthesis Example 1-7.

The target compound was analyzed by spectroscopy, with the results shown below. FIGS. 1 and 2 are nuclear magnetic resonance spectra ($^1$H-NMR and $^{19}$F-NMR/DMSO-$d_6$). In $^1$H-NMR, a trace amount of water was observed.

Infrared Absorption Spectrum (IR (D-ATR)):
  3089, 3068, 3025, 2966, 1732, 1668, 1586, 1570, 1450, 1441, 1379, 1316, 1301, 1280, 1255, 1175, 1144, 1116, 1070, 991, 961, 925, 903, 842, 808, 747, 729, 681, 639 cm$^{-1}$ TOFMS; MALDI
  Positive M$^+$289 (corresponding to (C$_6$H$_5$)(C$_{13}$H$_2$O)S$^+$)
  Negative M$^-$297 (corresponding to CF$_3$CH(OCO—C$_3$H$_5$)CF$_2$SO$_3^-$)

The same procedure as Synthesis Example 1-7 was repeated aside from using 9-oxo-10-phenyl-9H-thioxanthenium trifluoro-methanesulfonate obtained in Synthesis Example 1-1 and benzyltrimethylammonium 1,1,3,3,3-pentafluoro-2-(3-methacryl-oyloxy-adamantane-1-carbonyloxy)propane-1-sulfonate obtained in Synthesis Example 1-6. There was obtained 9-oxo-10-phenyl-9H-thioxanthenium 1,1,3,3,3-pentafluoro-2-(3-methacryloyloxy-adamantane-1-carbonyloxy)propane-1-sulfonate (PAG-3).

Figure 3:
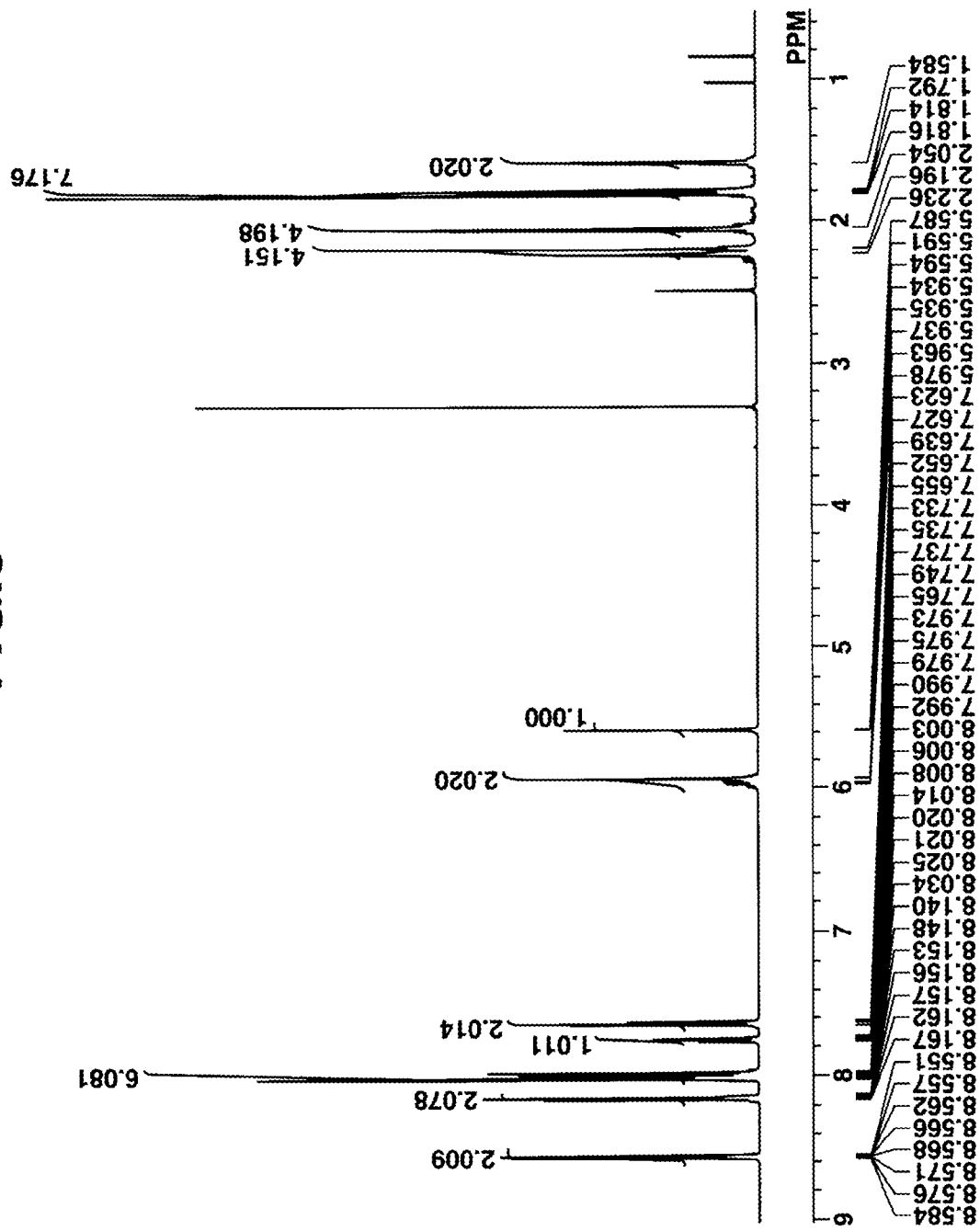
FIG. 3 is a diagram showing $^1$H-NMR spectroscopy of PAG-3 in Synthesis Example 1-8.
Figure 4:
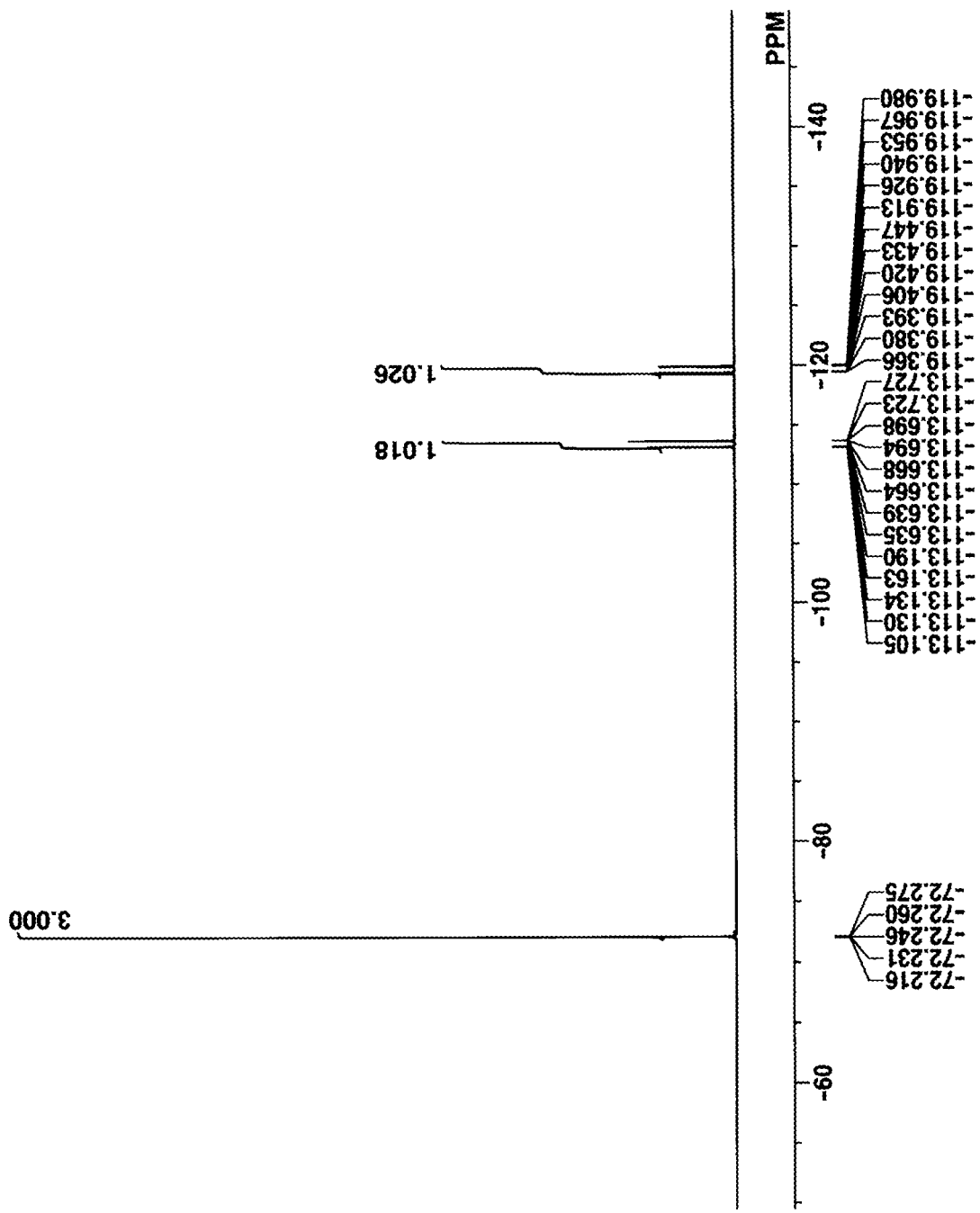
FIG. 4 is a diagram showing $^{19}$F-NMR spectroscopy of PAG-3 in Synthesis Example 1-8.

The target compound was analyzed by spectroscopy, with the results shown below. FIGS. 3 and 4 are NMR spectra ($^1$H-NMR and $^{19}$F-NMR/DMSO-$d_6$). In $^1$H-NMR, traces of residual solvents (methyl isobutyl ketone, diisopropyl ether and water) were observed.

IR (D-ATR):
  3081, 2970, 2927, 2857, 1750, 1704, 1676, 1634, 1587, 1572, 1480, 1448, 1433, 1376, 1318, 1302, 1272, 1262, 1249, 1232, 1214, 1184, 1159, 1116, 1086, 1050, 1008, 991, 939, 925, 898, 863, 839, 807, 776, 750, 731, 686, 667, 639, 576 cm$^{-1}$

TOFMS; MALDI
  Positive M$^+$289 (corresponding to (C$_6$H$_5$)(C$_{13}$H$_8$O)S$^+$)
  Negative M$^-$475 (corresponding to CF$_3$CH)(OCO—C$_{14}$H$_{19}$)CF$_2$SO$_3^-$)

As comparative photoacid generators, compounds PAG-4 to PAG-6 of the following structure were prepared. PAG-4 to PAG-6 could be synthesized with reference to JP-A 2007-145797 and 2008-133448, for example.

PAG-4

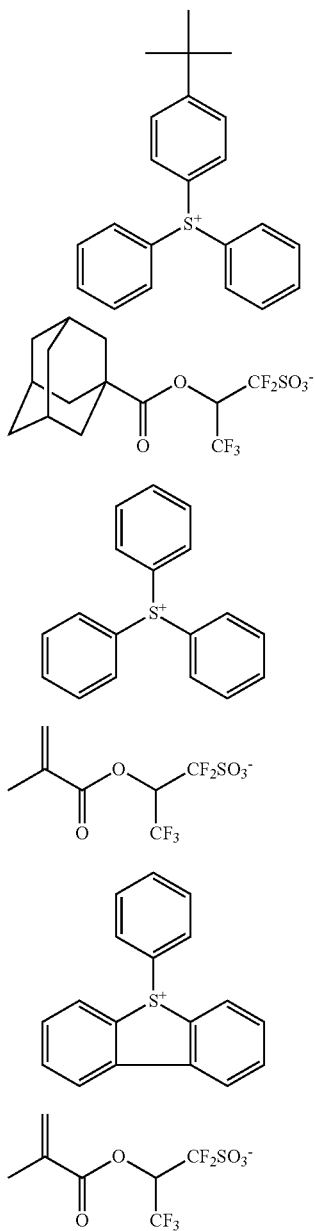

PAG-5

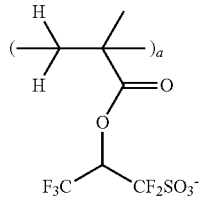

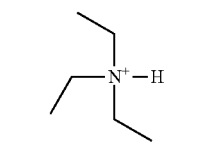

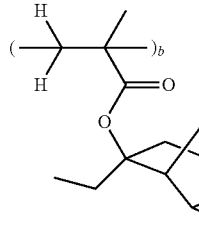

PAG-6

Synthesis Example 2-1

Synthesis of Polymer (P-0)

A nitrogen atmosphere flask was charged with 5.3 g of triethylammonium 1,1,3,3,3-pentafluoro-2-methacryloyloxy-propane-1-sulfonate, 4.9 g of 3-ethyl-3-exo-tetracyclo-[4.4.0.1$^{2,5}$.1$^{7,10}$]dodecanyl methacrylate, 2.1 g of 4-hydroxyphenyl methacrylate, 4.0 g of 4,8-dioxatricyclo[4.2.1.0$^{3,7}$]-nonan-5-on-2-yl methacrylate, 1.4 g of 2,2'-azobisisobutyronitrile, 17.5 g of methyl ethyl ketone, and 17.5 g of cyclohexanone to form a monomer solution. Another nitrogen atmosphere flask was charged with 5.8 g of methyl ethyl ketone and 5.8 g of cyclohexanone, which were heated at 80° C. with stirring. The monomer solution was added dropwise to the solvent mixture over 4 hours. After the completion of dropwise addition, the polymerization solution was stirred for 2 hours while keeping it at 80° C. The polymerization solution was cooled to room temperature, after which it was added dropwise to a mixture of 20.0 g of methyl ethyl ketone and 180 g of hexane. The copolymer precipitate was collected by filtration. The copolymer was washed twice with a mixture of 37.0 g of methyl ethyl ketone and 83.1 g of hexane. It was vacuum dried at 50° C. for 20 hours, obtaining a polymer of the following formula (P-0) in white powder solid form. The amount was 14.3 g and the yield was 88%.

P-0

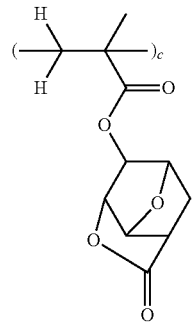

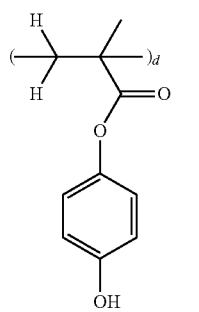

(a = 0.20, b = 0.30, c = 0.30, d = 0.20)

Synthesis Example 2-2

Synthesis of Polymer (P-1)

10 g of Polymer (P-0) prepared in Synthesis Example 2-1, 4.0 g of PAG-1 prepared in Synthesis Example 1-1, 50 g of methyl ethyl ketone, and 50 g of water were mixed and stirred at room temperature for 30 minutes. The organic layer was taken out from the mixture, 1.0 g of PAG-1 and 50 g of water were added to the organic layer, and the organic layer was taken out from the mixture. This reaction solution was washed with water 5 times, and thereafter concentrated. Methyl isobutyl ketone was added to the concentrate, followed by concentration again. Diisopropyl ether was added to the concentrate for recrystallization. The solid was collected, washed with diisopropyl ether, and vacuum dried at 50° C., obtaining 8.9 g of the target polymer (P-1).

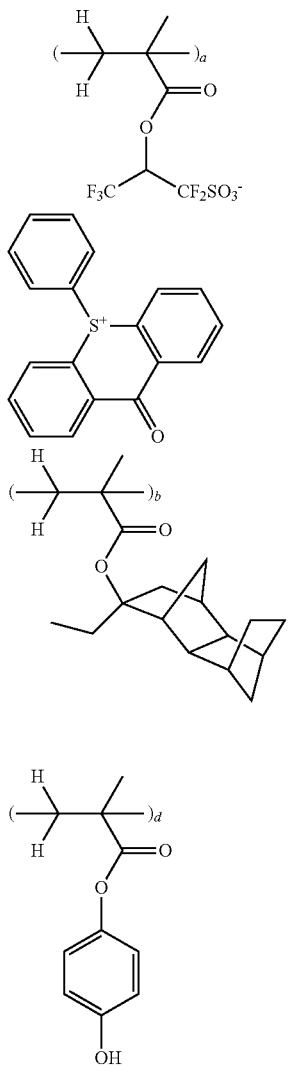

(a = 0.20, b = 0.30, c = 0.30, d = 0.20)

Synthesis Examples 2-3 to 2-14

Synthesis of Polymers (P-2) to (P-13)

A series of resins P-2 to P-13 as shown in Table 1 were prepared by the same procedure as Synthesis Examples 2-1 and 2-2 while changing the type and ratio of monomers. The units in Table 1 have the structure shown in Tables 2 and 3. The structure of the sulfonium salt unit is as shown above. In Table 1, the ratio of units is a molar ratio.

TABLE 1

| Resin | Unit 1 (ratio) | Unit 2 (ratio) | Unit 3 (ratio) | Unit 4 (ratio) |
|---|---|---|---|---|
| P-1 | PAG-2 (0.20) | A-1 (0.30) | B-1 (0.30) | B-2 (0.20) |
| P-2 | PAG-2 (0.30) | A-1 (0.30) | B-1 (0.20) | B-2 (0.20) |
| P-3 | PAG-3 (0.20) | A-1 (0.30) | B-1 (0.30) | B-2 (0.20) |
| P-4 | PAG-3 (0.30) | A-1 (0.30) | B-1 (0.20) | B-2 (0.20) |
| P-5 | PAG-3 (0.20) | A-1 (0.30) | B-3 (0.30) | B-2 (0.20) |

TABLE 1-continued

| Resin | Unit 1 (ratio) | Unit 2 (ratio) | Unit 3 (ratio) | Unit 4 (ratio) |
|---|---|---|---|---|
| P-6 | PAG-2 (0.20) | A-1 (0.30) | B-3 (0.30) | B-2 (0.20) |
| P-7 | PAG-3 (0.08) | A-2 (0.55) | B-4 (0.07) | B-5 (0.30) |
| P-8 | PAG-2 (0.08) | A-2 (0.55) | B-4 (0.07) | B-5 (0.30) |
| P-9 | PAG-6 (0.20) | A-1 (0.30) | B-1 (0.30) | B-2 (0.20) |
| P-10 | PAG-5 (0.20) | A-1 (0.30) | B-3 (0.30) | B-2 (0.20) |
| P-11 | PAG-5 (0.08) | A-2 (0.50) | B-4 (0.22) | B-5 (0.20) |
| P-12 | A-1 (0.30) | B-1 (0.40) | B-2 (0.30) | — |
| P-13 | A-2 (0.50) | B-4 (0.20) | B-5 (0.30) | — |

TABLE 2

TABLE 3

TABLE 3-continued

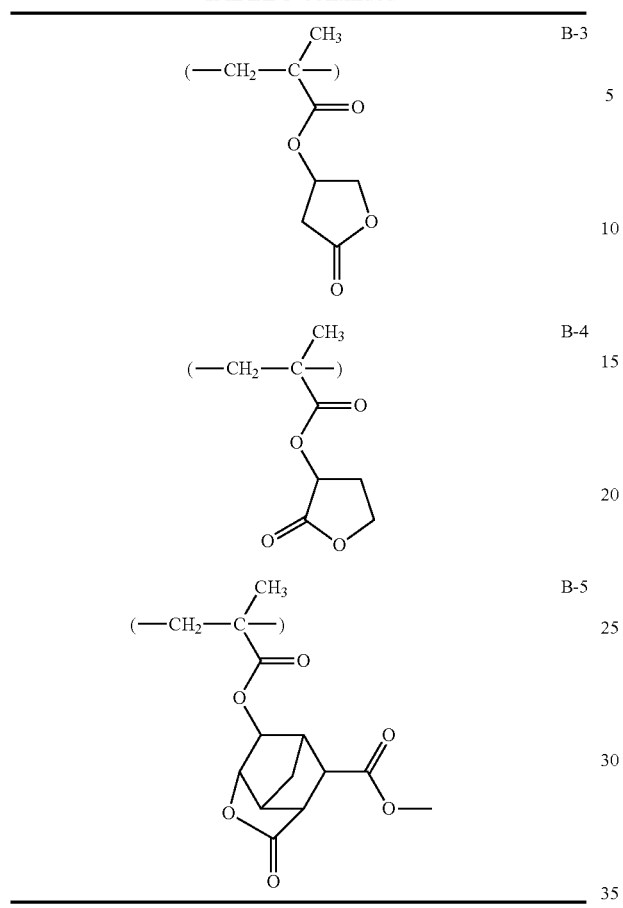

Comparative Synthesis Example 2-1

A nitrogen atmosphere flask was charged with 9.0 g of PAG-3, 4.9 g of 3-ethyl-3-exo-tetracyclo[4.4.0.1$^{2,5}$.1$^{7,10}$]-dodecanyl methacrylate, 2.1 g of 4-hydroxyphenyl methacrylate, 4.0 g of 4,8-dioxatricyclo[4.2.1.0$^{3,7}$]nonan-5-on-2-yl methacrylate, 1.4 g of 2,2'-azobisisobutyronitrile, 17.5 g of methyl ethyl ketone, and 17.5 g of cyclohexanone to form a monomer solution. Another nitrogen atmosphere flask was charged with 5.8 g of methyl ethyl ketone and 5.8 g of cyclohexanone, which were heated at 80° C. with stirring. The monomer solution was added dropwise to the solvent mixture over 4 hours. After the completion of dropwise addition, the polymerization solution was stirred for 2 hours while keeping it at 80° C. The polymerization solution was cooled to room temperature, after which it was added dropwise to a mixture of 20.0 g of methyl ethyl ketone and 180 g of hexane. The copolymer precipitate was collected by filtration. The copolymer was washed twice with a mixture of 37.0 g of methyl ethyl ketone and 83.1 g of hexane. It was vacuum dried at 50° C. for 20 hours, obtaining a white powder solid. On $^1$H-NMR analysis, this white solid was confirmed distinct from the desired polymer (P-3) because copolymerizing units of 3-ethyl-3-exo-tetracyclo[4.4.0.1$^{2,5}$.1$^{7,10}$]dodecanyl methacrylate became methacrylic acid units as a result of elimination of acid labile sites therefrom.

When synthesis was carried out by the same procedures as Synthesis Examples 2-1 and 2-2, the target polymer (P-3) could be synthesized without decomposition.

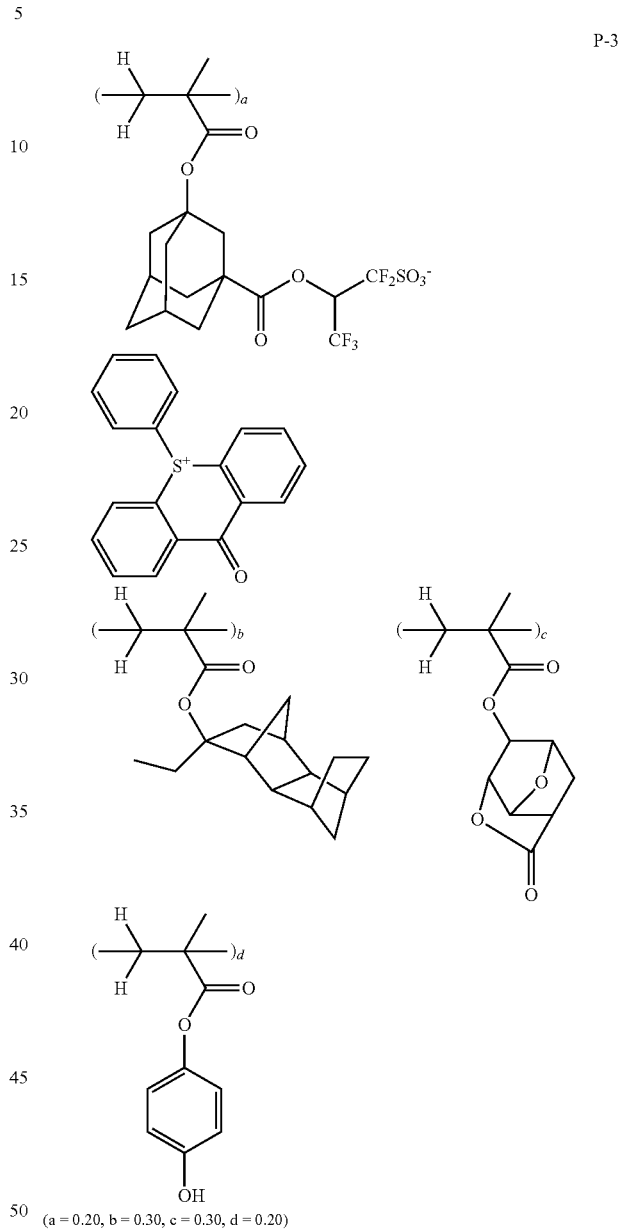

P-3

(a = 0.20, b = 0.30, c = 0.30, d = 0.20)

Examples 1-1 to 1-8 and Comparative Examples 1-1 to 1-6

Resist compositions in solution form were prepared by mixing and dissolving the polymer (in Synthesis Example), PAG, amine quencher, and alkali-soluble surfactant (F-1) in a solvent according to the formulation shown in Table 4 and filtering through a Teflon® filter having a pore size of 0.2 μm. In all runs, the solvent contained 0.01 wt % of surfactant (F-2).

TABLE 4

|  | Resist | Resin (pbw) | PAG (pbw) | Quencher (pbw) | Surfactant (pbw) | Solvent 1 (pbw) | Solvent 2 (pbw) |
|---|---|---|---|---|---|---|---|
| Example | | | | | | | |
| 1-1 | R-1 | P-1 (80) | — | Q-1 (1.4) | F-1 (3.0) | PGMEA (576) | CyHO (1,728) |
| 1-2 | R-2 | P-2 (80) | — | Q-1 (1.4) | F-1 (3.0) | PGMEA (576) | CyHO (1,728) |
| 1-3 | R-3 | P-3 (80) | — | Q-1 (1.4) | F-1 (3.0) | PGMEA (576) | CyHO (1,728) |
| 1-4 | R-4 | P-4 (80) | — | Q-1 (1.4) | F-1 (3.0) | PGMEA (576) | CyHO (1,728) |
| 1-5 | R-5 | P-5 (80) | — | Q-1 (1.4) | F-1 (3.0) | PGMEA (576) | CyHO (1,728) |
| 1-6 | R-6 | P-6 (80) | — | Q-1 (1.4) | F-1 (3.0) | PGMEA (576) | CyHO (1,728) |
| 1-7 | R-7 | P-7 (80) | — | Q-2 (1.4) | F-1 (3.0) | PGMEA (576) | CyHO (1,728) |
| 1-8 | R-8 | P-8 (80) | — | Q-2 (1.4) | F-1 (3.0) | PGMEA (576) | CyHO (1,728) |
| Comparative Example | | | | | | | |
| 1-1 | R-9 | P-9 (80) | — | Q-1 (1.4) | F-1 (3.0) | PGMEA (576) | CyHO (1,728) |
| 1-2 | R-10 | P-10 (80) | — | Q-1 (1.4) | F-1 (3.0) | PGMEA (576) | CyHO (1,728) |
| 1-3 | R-11 | P-11 (80) | — | Q-2 (1.4) | F-1 (3.0) | PGMEA (576) | CyHO (1,728) |
| 1-4 | R-12 | P-12 (80) | PAG-1 (5.1) | Q-1 (1.4) | F-1 (3.0) | PGMEA (576) | CyHO (1,728) |
| 1-5 | R-13 | P-12 (80) | PAG-4 (8.3) | Q-1 (1.4) | F-1 (3.0) | PGMEA (576) | CyHO (1,728) |
| 1-6 | R-14 | P-13 (80) | PAG-4 (8.3) | Q-2 (1.4) | F-1 (3.0) | PGMEA (576) | CyHO (1,728) |

The photoacid generators PAG-1 and PAG-4 are as shown above. The solvent, amine quencher, alkali-soluble surfactant (F-1) and surfactant (F-2) used herein are identified below.

Organic Solvent
  PGMEA: propylene glycol monomethyl ether acetate
  CyHO: cyclohexanone
Quencher
  Q-1: N-(2-(2-(2-methoxyethoxy)ethoxy)ethoxy)ethyl-morpholine
  Q-2: 2,6-diisopropylaniline
Surfactant
  F-1: poly(3,3,3-trifluoro-2-hydroxy-1,1-dimethyl-2-trifluoromethylpropyl methacrylate/1,1,1-trifluoro-2-hydroxy-6-methyl-2-trifluoromethylhept-4-yl methacrylate) (described in JP 4900603)

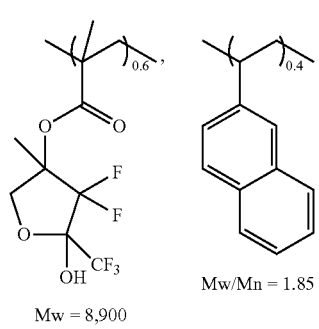

Mw = 8,900   Mw/Mn = 1.85

F-2: 3-methyl-3-(2,2,2-trifluoroethoxymethyl)oxetane/-tetrahydrofuran/2,2-dimethyl-1,3-propane diol copolymer (Omnova Solutions, Inc.)

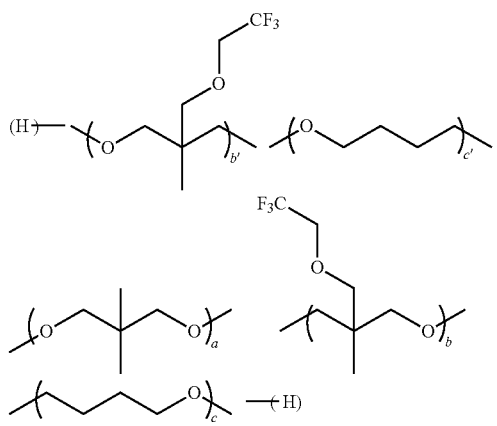

Polymer 1 a: (b + b'): (c + c') = 1:4-7:0.01-1 (molar ratio) Mw = 1,500

EUV Exposure Test

Examples 2-1 to 2-8 and Comparative Examples 2-1 to 2-5

A silicon substrate of 8-inch diameter was coated with a silicon-containing SOG film of 35 nm thick (SHB-A940, Shin-Etsu Chemical Co., Ltd.). The positive resist composition in Table 4 was coated on the SOG film and prebaked on a hot plate at 105° C. for 60 seconds to form a resist film of 50 nm thick. The wafer was exposed using an EUV microstepper (NA 0.3, quadrupole illumination). As a simulation of OOB light irradiation, the wafer was exposed over the entire surface in a dose of 1 mJ/cm$^2$ by means of an ArF excimer laser scanner and then over the entire surface in a dose of 1 mJ/cm$^2$ by means of a KrF excimer laser scanner. This was followed by PEB on a hot plate at 95° C. for 60 seconds and puddle development in a 2.38 wt % TMAH aqueous solution for 30 seconds, yielding a positive pattern. The results are shown in Table 5.

TABLE 5

|  | Resist | Sensitivity (mJ/cm$^2$) | Pattern profile |
|---|---|---|---|
| Example | 2-1 R-1 | 9.4 | rectangular |
|  | 2-2 R-2 | 9.1 | rectangular |
|  | 2-3 R-3 | 9.5 | rectangular |
|  | 2-4 R-4 | 9.2 | rectangular |
|  | 2-5 R-5 | 9.6 | rectangular |
|  | 2-6 R-6 | 9.6 | rectangular |
|  | 2-7 R-7 | 9.8 | rectangular |
|  | 2-8 R-8 | 9.8 | rectangular |
| Comparative | 2-1 R-9 | 9.9 | tapered, film thickness loss |
| Example | 2-2 R-10 | 10.1 | tapered, film thickness loss |
|  | 2-3 R-11 | 10.1 | tapered, film thickness loss |
|  | 2-4 R-13 | 10.1 | tapered |
|  | 2-5 R-14 | 10.3 | tapered |

As is evident from Table 5, the resist compositions comprising sulfonium salt-containing polymers within the scope of the invention show a high sensitivity on EUV lithography. The rectangular profile of pattern suggests a low sensitivity to ArF and KrF exposures, that is, improved resistance to OOB. In contrast, the resist compositions free of the inventive sulfonium salt-containing polymer (Comparative Examples 2-1 to 2-5) are less resistant to OOB and sensitive to ArF and KrF exposures and as a result, form patterns of tapered profile. Since there is a strong possibility that an actual EUV scanner used in practice is not equipped with an OOB-cutoff filter because of laser power shortage, the experiment of pseudo-OOB irradiation by ArF and KrF lasers is a simulation of EUV scanner exposure.

EB Writing Test

Examples 3-1 to 3-6 and Comparative Examples 3-1 to 3-4

Using a coater/developer system Clean Track Mark 5 (Tokyo Electron Ltd.), the resist composition in Table 4 was spin coated onto a silicon substrate (diameter 6 inches=150 mm, vapor primed with hexamethyldisilazane (HMDS)) and prebaked on a hot plate at 110° C. for 60 seconds to form a resist film of 100 nm thick. Using a system HL-800D (Hitachi Ltd.) at a HV voltage of 50 keV, the resist film was exposed imagewise to EB in a vacuum chamber.

Using Clean Track Mark 5, immediately after the imagewise exposure, the resist film was baked (PEB) on a hot plate at 95° C. for 60 seconds and puddle developed in a 2.38 wt % TMAH aqueous solution for 30 seconds to form a positive pattern.

Sensitivity is the exposure dose that provides a 1:1 resolution of a 100-nm line-and-space pattern. Resolution is a minimum size at the exposure dose. The 100-nm L/S pattern was measured for LWR under SEM.

Table 6 shows the sensitivity, resolution and LWR of resist compositions on EB lithography.

TABLE 6

|  |  | Resist | Sensitivity (μC/cm$^2$) | Resolution (nm) | LWR (nm) |
|---|---|---|---|---|---|
| Example | 3-1 | R-1 | 25.0 | 75 | 5.7 |
|  | 3-2 | R-2 | 21.8 | 75 | 5.5 |
|  | 3-3 | R-3 | 24.8 | 75 | 5.4 |
|  | 3-4 | R-4 | 22.0 | 75 | 5.1 |
|  | 3-5 | R-5 | 25.2 | 75 | 5.6 |
|  | 3-6 | R-6 | 25.1 | 75 | 5.8 |
| Comparative | 3-1 | R-9 | 25.8 | 80 | 6.2 |
| Example | 3-2 | R-10 | 26.4 | 80 | 6.9 |
|  | 3-3 | R-12 | 26.8 | 85 | 7.5 |
|  | 3-4 | R-13 | 27.0 | 85 | 7.8 |

As is evident from Table 6, the resist composition comprising a sulfonium salt-containing polymer within the scope of the invention shows a high resolution and a low LWR on EB lithography.

Japanese Patent Application No. 2012-269446 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A sulfonium salt having the general formula (1b):

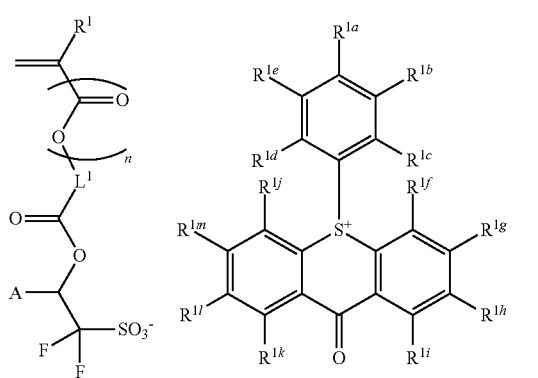

(1b)

wherein $R^1$ is hydrogen, fluorine, methyl or trifluoromethyl, $R^{1a}$ to $R^{1m}$ are each independently hydrogen, fluorine, or a $C_1$-$C_{20}$ straight or branched, monovalent hydrocarbon group which may be substituted with or separated by a heteroatom, $L^1$ is a single bond or a $C_1$-$C_{20}$ straight, branched or cyclic, divalent hydrocarbon group which may be substituted with or separated by a heteroatom, A is trifluoromethyl, and n is 0 or 1, with the proviso that n is 0 when $L^1$ is a single bond.

2. The sulfonium salt of claim 1 wherein $R^{1a}$ to $R^{1m}$ are each independently hydrogen, methyl, methoxy, tert-butyl and tert-butoxy.

3. The sulfonium salt of claim 1 wherein $R^{1a}$ is hydrogen, methyl, methoxy, tert-butyl or tert-butoxy, and $R^{1b}$ to $R^{1m}$ are hydrogen.

4. A polymer comprising recurring units having the general formula (2b):

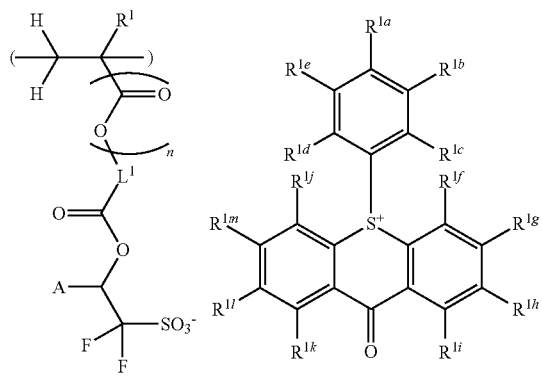

(2b)

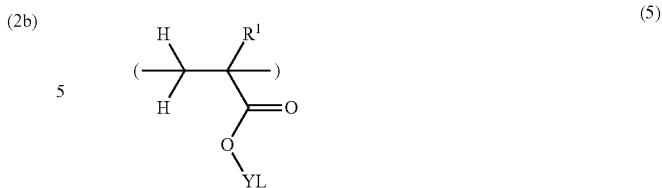

(5)

wherein $R^1$ is hydrogen, fluorine, methyl or trifluoromethyl, $R^{1a}$ to $R^{1m}$ are each independently hydrogen, fluorine, or a $C_1$-$C_{20}$ straight or branched, monovalent hydrocarbon group which may be substituted with or separated by a heteroatom, $L^1$ is a single bond or a $C_1$-$C_{20}$ straight, branched or cyclic, divalent hydrocarbon group which may be substituted with or separated by a heteroatom, A is trifluoromethyl, and n is 0 or 1, with the proviso that n is 0 when $L^1$ is a single bond.

5. The polymer of claim 4, further comprising recurring units having the general formula (3) and/or (4):

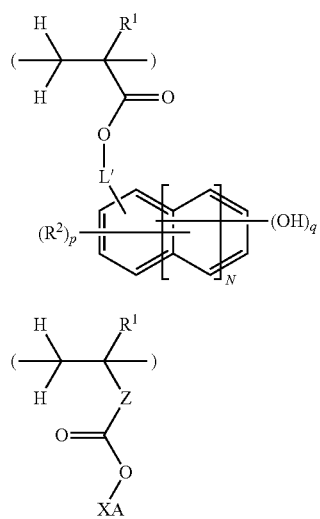

wherein $R^1$ is hydrogen, fluorine, methyl or trifluoromethyl, $R^2$ is halogen or a $C_1$-$C_{10}$ alkyl group, L' is a single bond or a $C_1$-$C_{10}$ divalent organic group which may be substituted with oxygen, p is an integer of 0 to 3, q is 1 or 2, N is an integer of 0 to 2, Z is a single bond, phenylene, naphthylene or (backbone)-C(=O)—O—Z'—, Z' is a $C_1$-$C_{10}$ straight, branched or cyclic alkylene group which may have a hydroxyl radical, ether bond, ester bond or lactone ring, or phenylene or naphthylene group, and XA is an acid labile group.

6. The polymer of claim 5, further comprising recurring units having the general formula (5):

wherein $R^1$ is hydrogen, fluorine, methyl or trifluoromethyl, and YL is hydrogen or a polar group having at least one structure selected from the group consisting of hydroxyl, cyano, carbonyl, carboxyl, ether bond, ester bond, sulfonic acid ester bond, carbonate bond, lactone ring, sultone ring and carboxylic anhydride.

7. A resist composition comprising the polymer of claim 4 as a base resin.

8. A resist composition comprising the polymer of claim 4 and a polymer free of recurring units having formula (2b) as a base resin.

9. The resist composition of claim 7, further comprising a basic compound and an organic solvent.

10. The resist composition of claim 7, further comprising a non-polymeric acid generator.

11. The resist composition of claim 7, further comprising a surfactant which is insoluble in water and soluble in alkaline developer.

12. A pattern forming process comprising the steps of applying the resist composition of claim 7 onto a substrate to form a coating, baking, exposing the coating to high-energy radiation, and developing the exposed coating in a developer.

13. The process of claim 12 wherein the exposure step is carried out by immersion lithography using a liquid having a refractive index of at least 1.0 between the resist coating and a projection lens.

14. The process of claim 13, further comprising the step of coating a protective film on the resist coating prior to the exposure step, wherein immersion lithography is carried out while the liquid is held between the protective film and the projection lens.

15. The process of claim 12 wherein the high-energy radiation is electron beam or soft X-ray having a wavelength of 3 to 15 nm.

16. A method for preparing the polymer of claim 4, comprising the step of reacting a polymer comprising recurring units having the general formula (6b) with a sulfonium salt having the general formula (7),

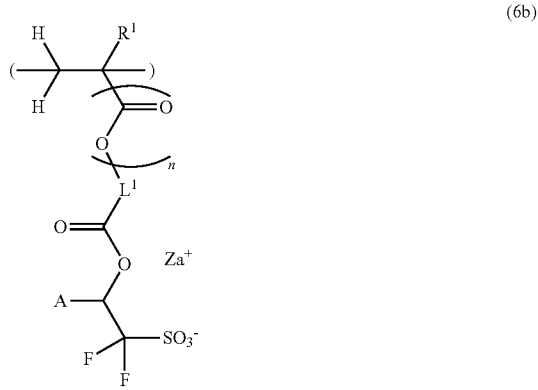

(6b)

-continued (7)

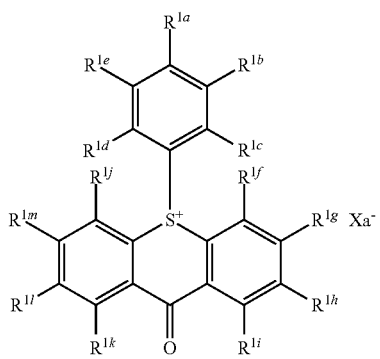

wherein R$^1$ is hydrogen, fluorine, methyl or trifluoromethyl, R$^{1a}$ to R$^{1m}$ are each independently hydrogen, fluorine, or a C$_1$-C$_{20}$ straight or branched, monovalent hydrocarbon group which may be substituted with or separated by a heteroatom, L$^1$ is a single bond or a C$_1$-C$_{20}$ straight, branched or cyclic, divalent hydrocarbon group which may be substituted with or separated by a heteroatom, A is trifluoromethyl, n is 0 or 1, Za$^+$ is a lithium ion, sodium ion, potassium ion, or ammonium cation of the general formula (8):

$$(R^3)_4N^+ \qquad (8)$$

wherein R$^3$ is each independently hydrogen, a substituted or unsubstituted, C$_1$-C$_{10}$ straight, branched or cyclic alkyl, alkenyl or oxoalkyl group, or substituted or unsubstituted C$_6$-C$_{18}$ aryl, aralkyl or aryloxoalkyl group, or any two or more of R$^3$ may bond together to form a ring with N, and Xa$^-$ is an anion.

17. The polymer of claim 4 wherein R$^{1a}$ to R$^{1m}$ are each independently hydrogen, methyl, methoxy, tert-butyl or tert-butoxy.

18. The polymer of claim 4 wherein R$^{1a}$ is hydrogen, methyl, methoxy, tert-butyl or tert-butoxy, and R$^{1b}$ to R$^{1m}$ are hydrogen.

* * * * *